(12) United States Patent  (10) Patent No.: US 8,975,785 B2
Goto  (45) Date of Patent: Mar. 10, 2015

(54) LOAD CONTROL DEVICE

(75) Inventor: Kiyoshi Goto, Amagasaki (JP)

(73) Assignee: Panasonic Corporation, Osaka (JP)

( * ) Notice: Subject to any disclaimer, the term of this patent is extended or adjusted under 35 U.S.C. 154(b) by 576 days.

(21) Appl. No.: 13/392,248

(22) PCT Filed: Aug. 23, 2010

(86) PCT No.: PCT/IB2010/002058
§ 371 (c)(1),
(2), (4) Date: Feb. 24, 2012

(87) PCT Pub. No.: WO2011/024048
PCT Pub. Date: Mar. 3, 2011

(65) Prior Publication Data
US 2012/0153930 A1 Jun. 21, 2012

(30) Foreign Application Priority Data

Aug. 26, 2009 (JP) ................................. 2009-195205
Aug. 26, 2009 (JP) ................................. 2009-195389
Aug. 26, 2009 (JP) ................................. 2009-195399
Aug. 26, 2009 (JP) ................................. 2009-195412

(51) Int. Cl.
*H02J 3/00* (2006.01)
*H02M 1/08* (2006.01)
*H02M 1/36* (2007.01)
*H03K 17/725* (2006.01)

(52) U.S. Cl.
CPC .... *H02M 1/08* (2013.01); *H02M 1/36* (2013.01); *H03K 17/725* (2013.01)
USPC .......................................................... 307/86

(58) Field of Classification Search
USPC .......................................................... 307/86
See application file for complete search history.

(56) References Cited

U.S. PATENT DOCUMENTS

| 8,129,976 B2 * | 3/2012 | Blakeley ........................ 323/312 |
| 8,427,061 B2 * | 4/2013 | Biery et al. .................... 315/149 |
| 2008/0024074 A1 * | 1/2008 | Mosebrook et al. ........... 315/291 |

FOREIGN PATENT DOCUMENTS

| JP | 200692859 | 4/2006 |
| JP | 2007174409 | 7/2007 |
| JP | 2007174410 | 7/2007 |
| JP | 2010146527 | 7/2010 |

OTHER PUBLICATIONS

The International Search Report for PCT/IB2010/002058 dated Dec. 14, 2010.

* cited by examiner

*Primary Examiner* — Rexford Barnie
*Assistant Examiner* — Dru Parries
(74) *Attorney, Agent, or Firm* — Bacon & Thomas, PLLC

(57) ABSTRACT

A load control device includes: a main switching unit which has a main switch element connected in series to an AC power source and a load and controls the supply of power to the load; a manipulation switch that outputs a start-up signal for starting at least the load; a control unit which controls the opening and closing of the main switching unit; a first power source unit supplying a stable voltage to the control unit; and a second and a third power source unit each supplying power to the first power source unit. The load control device is characterized in that upon receiving the start-up signal, the control unit outputs an initial drive signal, for closing the main switch element, to the main switching unit before a power source supplying power to the first power source unit is switched from the second to the third power source unit.

49 Claims, 38 Drawing Sheets

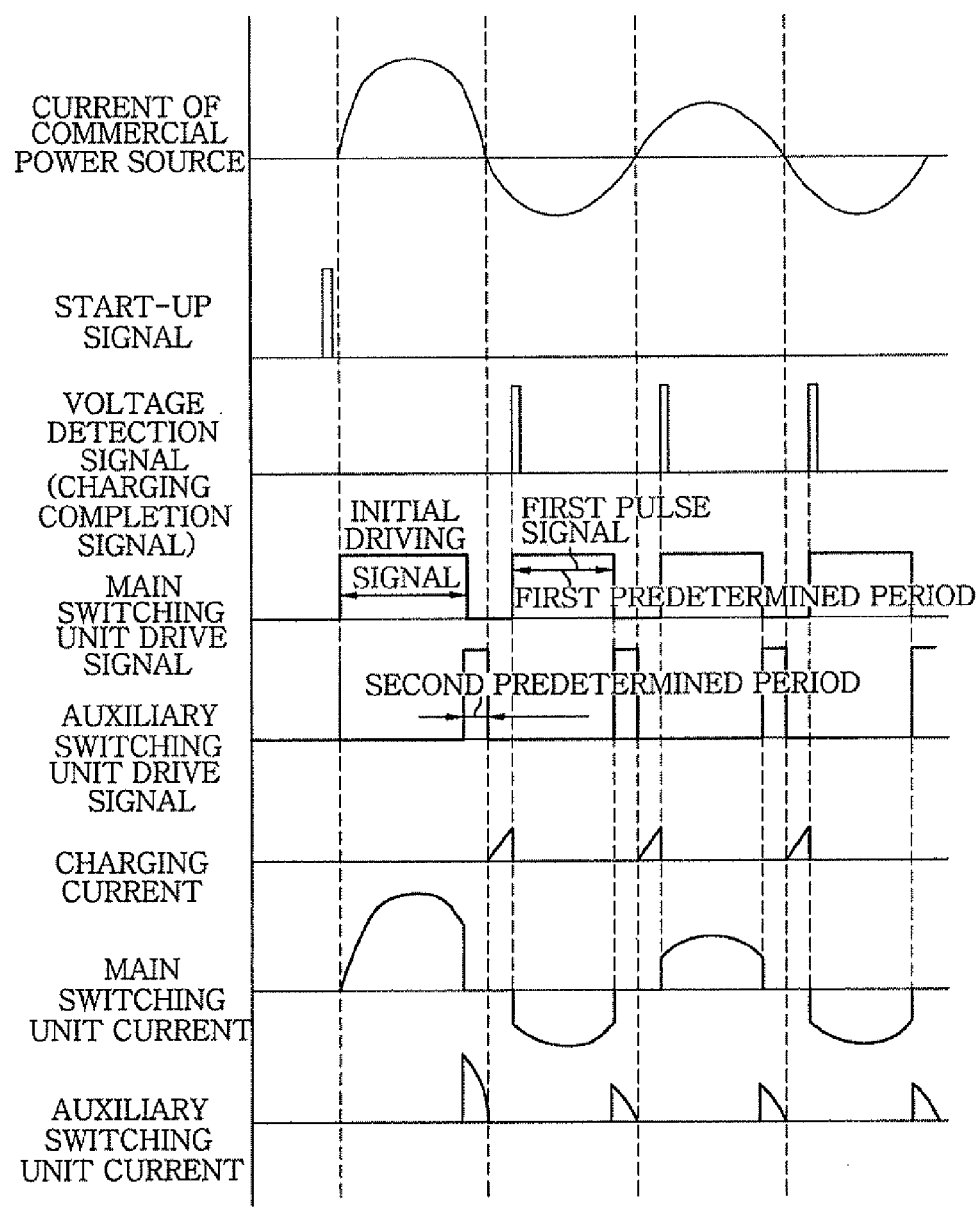

LOAD CONTROL DEVICE

FIELD OF THE INVENTION

The present invention relates to a two-wire load control device connected in series between a commercial AC power source and a load such as an illumination apparatus and motor.

BACKGROUND OF THE INVENTION

Conventionally, a load control device using a non-contact switch element such as a triac or thyristor has been practically used (see, e.g., Patent document 1). In terms of reduction of wires, the load control device generally has a two-wire connection which is connected in series between a commercial AC power source and a load. In the load control device connected in series between the commercial AC power source and the load, how to ensure power for its circuit becomes an issue.

As shown in FIG. 43, a load control device 50 of a first conventional example connected in series between a commercial AC power source 2 and a load 3 includes a main switching unit 51, a rectifying unit 52, a control unit 53, a first power supply unit 54 which supplies a stable power to the control unit 53, a second power supply unit 55 which supplies power to the first power supply unit 54 when no power is supplied to the load 3, and a third power supply unit 56 which supplies power to the first power supply unit 54 when power is supplied to the load 3. The load control device 50 further includes an auxiliary switching unit 57 which allows a micro-current from the load current to flow therethrough and supplies to a gate of the main switch element a sufficient amount of the current to put a main switch element 51a of the main switching unit 51 in a conducting state, and the like. The main switch element 51a of the main switching unit 51 includes a triac.

In an OFF state of the load control device 50 in which no power is supplied to the load 3, a voltage applied from the commercial AC power source 2 to the load control device 50 is supplied to the second power supply unit 55 via the rectifying unit 52. The second power supply unit 55 is a constant voltage circuit including a resistor and a Zener diode 55a. In an OFF state of the load 3, a ripple current that is full-wave rectified by the rectifying unit 52 is inputted to the second power supply unit 55 and when a voltage applied thereto is higher than a Zener voltage of the Zener diode 55a, the Zener voltage is inputted to the first power supply unit 54. If the voltage is lower than the Zener voltage, a buffer capacitor 54a connected between input terminals of the first power supply unit 54 serves as a power source for the first power supply unit 54. The buffer capacitor 54a is repeatedly charged and discharged. Further, in this case, the current flowing through the load 3 is a micro-current small enough not to cause a malfunction in the load 3. It is configured such that the current consumption of the control unit 53 is small and the impedance of the second power supply unit 55 is set to be maintained high.

On the other hand, in an ON state of the load control device 50 in which power is supplied to the load 3, the third power supply unit 56 is turned on by a control signal transmitted from the control unit 53, and the impedance of the load control device 50 is reduced to thereby increase an amount of the current flowing in the load 3. At the same time, the current flowing in the third power supply unit 56 also flows in the first power supply unit 54, thereby starting to charge the buffer capacitor 54a. If the charging voltage of the buffer capacitor 54a is higher than a predetermined threshold, a Zener diode 56a included in the third power supply unit 56 breaks down and the current begins to flow. The current flows into the gate of the auxiliary switching unit 57 and the auxiliary switching unit 57 turns into a conducting state (closed state).

As a result, the current flowing into the third power supply unit 56 from the rectifying unit 52 is commutated to the auxiliary switching unit 57. Further, the current flows into the gate of the main switch element 51a of the main switching unit 51 as well and the main switching unit 51 turns into a conducting state (closed state). Therefore, almost all power is supplied to the load 3.

Hereinafter, a case where when the load 3 is in an ON state, power is supplied to the first power supply unit 54 not from the second power supply unit 55, but only from the third power supply unit 56 will be described. When a manipulation switch (SW) 4 for starting the load 3 is turned on, the control unit 53 outputs a control signal to thereby put a switch element 56c of the third power supply unit 56 in a conducting state. In this case, since an input voltage of the first power supply unit 54 serving as an output voltage of the second power supply unit 55 is higher than an output voltage of the third power supply unit 56, the current flowing in the third power supply unit 56 sequentially passes through the Zener diode 56a, a thyristor 57a of the auxiliary switching unit 57, and a triac 51a of the main switching unit 51. When the triac 51a is in an ON state, the rectified voltage of the rectifying unit 52 becomes almost zero. Accordingly, the second power supply unit 55 is turned into a non-conducting state, and there is no current to flow therein. Also, the third power supply unit 56 is operated in the same way. In the mean time, since power is supplied to the first power supply unit 54 from the buffer capacitor 54a, the input voltage of the first power supply unit 54, i.e., the terminal voltage of the buffer capacitor 54a is reduced gradually. Further, when the input voltage of the first power supply unit 54 becomes lower than the output voltage of the third power supply unit 56, the third power supply unit 56 starts the supply of power to the first power supply unit 54. In this case, since the Zener voltage of the Zener diode 55a of the second power supply unit 55 is higher than the Zener voltage of the Zener diode 56a of the third power supply unit 56, the second power supply unit 55 remains to be still in a non-conducting state. Further, the buffer capacitor 54a is charged such that the terminal voltage thereof becomes the output voltage of the third power supply unit 56. If the rectified voltage of the rectifying unit 52 is higher than the Zener voltage of the Zener diode 55a of the second power supply unit 55, the input voltage of the first power supply unit 54 becomes the output voltage of the second power supply unit 55, but at that moment, the current flowing in the third power supply unit 56 is commutated to the Zener diode 56a, the thyristor 57a, and the triac 51a of the main switching unit 51. By repeating these operations, when the load 3 is in an ON state, power is supplied to the first power supply unit 54, not from the second power supply unit 55, but only from the third power supply unit 56.

Once the main switching unit 51 turns into a conducting state (closed state), the current continuously flows therethrough. However, when AC current reaches a zero-cross point, the main switch element 51a is subjected to a self-arc-extinction and the main switching unit 51 turns into a non-conducting state (open state). When the main switching unit 51 turns into a non-conducting state (open state), the current again flows into the first power supply unit 54 from the rectifying unit 52 through the third power supply unit 56, and an operation for ensuring the power for the circuit of the load control device 50 is performed. That is, a self power reserve for the circuit of the load control device 50, a conducting operation of the auxiliary switching unit 57 and a conducting operation of the main switching unit 51 are repeated every half cycle of AC current.

A load control device 60 of a second conventional example, which is connected in series between the alternating current (AC) power source 2 and the load 3, is shown in FIG. 44. The load control device 60 includes a main switching unit 61, a rectifying unit 62, a control unit 63, a first power supply unit 64 which supplies a stable power to the control unit 63, a second power supply unit 65 which supplies power to the first power supply unit 64 when no power is supplied to the load 3, and a third power supply unit 66 which supplies power to the first power supply unit 64 when power is supplied to the load 3. The load control device 60 further includes a zero-cross detection unit 67 which detects a zero-cross point of the load current. A MOSFET is used as a switch element 61a of the main switching unit 61, and an incandescent lamp serves as a load to be controlled.

In a case where power is supplied to the load 3, the switch element 61a of the main switching unit 61 is put in a conducting state only for a time period determined based on a dimming level inputted externally. Specifically, the switch element 61a is put in a conducting state (closed state) at a timing when the zero-cross detection unit 67 detects the zero-cross point of the voltage, and the switch element 61a is put in a non-conducting state (open state) after the time period has elapsed. While the main switching unit 61 is in a non-conducting state (open state), the power for the circuit of the load control device 60 is ensured as in the first conventional example. When the main switching unit 61 is put in a non-conducting state (open state), the zero-cross detection unit 67 detects the zero-cross point again, and the switch element 61a is put in a conducting state (closed state). The operation is repeated every half cycle of alternating current.

However, in the first conventional example, it is known that a high current (referred to as inrush current) temporarily flows when power is inputted to the load 3 such as an illumination apparatus and motor. In the power input, as described above, since the current flows in the third power supply unit 56 earlier than conduction of the triac 51a of the main switching unit 51, a high current due to the inrush current may flow in the third power supply unit 56 or the auxiliary switching unit 57, thereby causing breakage in an element forming the third power supply unit 56 or the auxiliary switching unit 57. Further, since the high current repeatedly flows in the third power supply unit 56 or the auxiliary switching unit 57, the element forming the third power supply unit 56 or the auxiliary switching unit 57 may be degraded gradually, and the lifetime of the load control device 50 may be reduced.

As in the load control device 50 of the first conventional example, in a case where the main switch element 51a of the main switching unit 51 is a triac or thyristor, in order to reduce the noise generated when power is supplied to the load 3, and to prevent a malfunction due to the noise transmitted from the power source 2 when no power is supplied to the load 3, it is necessary to provide a filter. However, it is difficult to achieve miniaturization of the load control device due to the size of a coil 58 forming the filter or heating of the coil.

In order to reduce the noise due to the load control device without using a filter, for example, in a load control device (third conventional example) disclosed in Patent document 2, a second switch unit having an on resistance larger than that of the switch element (first switch unit) of the main switching unit is provided in addition to the switch element of the main switching unit such that after the second switch unit is turned on, the first switch unit is turned on. However, in the third conventional example, the number of switch elements becomes large. Accordingly, a circuit configuration becomes complicated, and it is also complicated to control the timing of switch-on.

Further, as in the load control device 60 of the second conventional example, in a case where the switch element 61a of the main switching unit 61 has a transistor structure, the load is limited to a load such as an incandescent lamp in which the load current and the load voltage have the same phase (power factor of 1). Further, the current is made to flow from the zero-cross point, and the current is blocked at a phase angle in accordance with dimming, thereby performing reverse phase control. In this case, it is necessary to block the electrical conduction current, causing an increase in the noise. To reduce the noise, blocking of the current is slowly performed by controlling the transistor. However, there is a problem in which heat generated from the switch element increases due to switching loss generated in blocking.

As in the load control device 50 of the first conventional example, in a case where the switch element 51a of the main switching unit 51 has a thyristor structure, dimming control of the illumination apparatus can be performed by delaying the conduction of the switch element 51a using a variable resistor. Meanwhile, the triac or transistor used as the switch element of the main switching unit is formed of Si, and generally, the current flows in a vertical direction of the element. In case of the triac, since there is a PN junction in an electrical conduction path, loss occurs during the electrical conduction to overcome the barrier. Further, in case of the transistor, since it is necessary to connect two elements in a reverse direction and a low carrier concentration layer being a withstand voltage maintaining layer has a high resistance, loss occurs during the electrical conduction. By such loss, the heat generated from the switch element is large, and a large heat sink is necessary. Accordingly, it makes it difficult to achieve miniaturization and high capacity of the load control device.

Generally, the load control device is housed in a metal box or the like provided on the wall. However, in the conventional load control device, because there is a limitation on miniaturization, the load control device cannot be used in combination with another sensor, switch or the like in a box that is generally used nowadays. Accordingly, in order to install the load control device in combination with another sensor, switch or the like in a box with a typical size, there is a demand for further miniaturization of the load control device.

Further, in the conventional load control device, for example, in a case where the load is a low capacity load such as a miniature bulb of the illumination apparatus, since the main switching unit with large power consumption is in a conducting state, the power consumed in the load control device increases and more time is required to charge a buffer capacitor 59. Accordingly, a time point when the charging voltage of the buffer capacitor 59 is higher than a predetermined threshold may exceed the half cycle of the AC power source, and it is impossible to accurately control an on/off timing of the main switching unit. Thus, it may cause a variation in the operation of the load.

Patent document 1: Japanese Patent Application Publication No. 2007-174409

Patent document 2: Japanese Patent Application Publication No. 2006-92859

SUMMARY OF THE INVENTION

In view of the above, the present invention provides a load control device capable of preventing breakage or degradation of an element due to an inrush current generated when power is supplied to a load.

The present invention also provides a load control device for performing load control capable of reducing the number of switch elements, suppressing heat generation in switch elements to promote miniaturization, accurately controlling switching timing, reducing power consumption, preventing a fluctuation, and enhancing lighting control and the like.

In accordance with a first aspect of the present invention, there is provided a two-wire load control device configured to be connected in series between an alternating current (AC) power source and a load, including: a main switching unit, which has a main switch element to be connected in series to the AC power source and the load and controls a supply of power to the load; a manipulation switch, which is manipulated by a user and outputs a start-up signal for starting at least the load; a control unit, which is connected to the manipulation switch and controls opening/closing of the main switching unit based on a signal transmitted from the manipulation switch; a first power supply unit electrically powered from both terminals of the main switching unit through a rectifying unit, for supplying a stable voltage to the control unit; a second power supply unit electrically powered from said both terminals of the main switching unit through the rectifying unit, for supplying power to the first power supply unit when no power is supplied to the load; and a third power supply unit for electrically powering the first power supply unit when power is supplied to the load in a closed state of the main switching unit.

Upon receiving the start-up signal from the manipulation switch, the control unit outputs an initial drive signal for putting the main switch element in a conducting state to the main switching unit before a power source for electrically powering the first power supply unit is switched from the second power supply unit to the third power supply unit.

With such configuration, when the load is started, power is supplied to the load by putting the main switch element of the main switching unit in a conducting state, earlier than ensuring an inner power supply of the load control device by putting the third power supply unit in a conducting state. Accordingly, since a high current (inrush current) generated in start-up of the load flows into the main switch element of the main switching unit, instead of making it flow in the third power supply unit, elements forming the third power supply unit and the like are protected from high current and prevented from being broken. Further, since the main switching unit is designed and manufactured to withstand a high voltage and high current, it is possible to prevent any immediate breakage due to the inrush current and a malfunction of the load control device.

In accordance with a second aspect of the present invention, there is provided a two-wire load control device configured to be connected in series between an AC power source and a load, including: a main switching unit, which includes a switch element having a transistor structure and controls a supply of power to the load; an auxiliary switching unit, which includes a switch element having a thyristor structure and controls the supply of power to the load when the main switching unit is in a non-conducting state; a control unit, which controls opening/closing of the main switching unit and the auxiliary switching unit; a first power supply unit electrically powered from both terminals of the main switching unit through a rectifying unit, for supplying a stable voltage to the control unit; a second power supply unit electrically powered from both terminals of the main switching unit through the rectifying unit, for electrically powering the first power supply unit when no power is supplied to the load; a third power supply unit for electrically powering the first power supply unit when power is supplied to the load in a closed state of one of the main switching unit and the auxiliary switching unit; a voltage detection unit, which detects a voltage inputted to the third power supply unit; and a zero-cross detection unit, which detects a zero-cross point of a load current.

Further, when the power is supplied to the load, the control unit causes a rise of a main switching unit drive signal for putting the main switching unit in a conducting state when the voltage detection unit detects that the voltage inputted to the third power supply unit reaches a predetermined threshold within a predetermined standby time limit after the zero-cross detection unit detects the zero-cross point of the load current, and causes a fall of the main switching unit drive signal after a predetermined period, that is shorter than a half cycle of the load current, after the zero-cross detection unit detects the zero-cross point of the load current.

Further, when the power is supplied to the load, the control unit causes a rise of the main switching unit drive signal after the standby time limit is elapsed when the voltage detection unit fails to detect that the voltage inputted to the third power supply unit reaches a predetermined threshold within the standby time limit, and causes a fall of the main switching unit drive signal after a predetermined period, that is shorter than the half cycle of the load current, after the zero-cross detection unit detects the zero-cross point of the load current.

With such configuration, when the voltage detection unit detects that the voltage inputted to the third power supply unit reaches a predetermined threshold, since the control unit puts the main switching unit in a conducting state (closed state), power is supplied from the main switching unit to the load for most of the half cycle of the alternating current power source. Further, since there is a limitation on the standby time of the start of conduction of the main switching unit, for example, if it is overly delayed for the voltage inputted to the third power supply unit in a low load to reach a predetermined threshold, the main switching unit is put in a conducting state after the standby time limit is elapsed. Accordingly, it is possible to stably perform the switching operation in the main switching unit every half cycle, and prevent the lighting fluctuation from occurring in a low load such as miniature bulb lighting. Further, since the main switch element having a transistor structure used in the main switching unit is in an active state in a low load, the main switch element has a resistance. However, in the low load, since the current flowing in the main switch element becomes small, there is no excessive heating.

In accordance with a third aspect of the present invention, there is provided a two-wire load control device configured to be connected in series between an AC power source and a load, including: a main switching unit, which includes a switch element having a transistor structure and controls a supply of power to the load; an auxiliary switching unit which includes a switch element having a thyristor structure and controls the supply of power to the load when the main switching unit is in a non-conducting state; a control unit, which controls opening/closing of the main switching unit and the auxiliary switching unit; a first power supply unit electrically powered from both terminals of the main switching unit through a rectifying unit, for supplying a stable voltage to the control unit; a second power supply unit electrically powered from said both terminals of the main switching unit through the rectifying unit, for electrically powering the first power supply unit when no power is supplied to the load; a third power supply unit for electrically powering first power supply unit when the power is supplied to the load in a closed state of one of the main switching unit and the auxiliary switching unit; a voltage detection unit, which detects a voltage inputted to the third power supply unit; and a current detection unit, which detects a current flowing into the auxiliary switching unit.

Further, when the power is supplied to the load, the auxiliary switching unit is put in a conducting state when the voltage detection unit detects that the voltage inputted to the third power supply unit reaches a predetermined threshold, and the control unit puts the main switching unit in a conducting state and simultaneously puts the auxiliary switching unit in a non-conducting state when the current detection unit detects that the current flowing into the auxiliary switching unit reaches a predetermined threshold.

With such configuration, if the voltage inputted to the third power supply unit reaches a predetermined threshold, the control unit first puts the auxiliary switching unit in a conducting state (closed state). Then, if the current flowing in the auxiliary switching unit reaches a predetermined threshold, the control unit puts the main switching unit in a conducting state. Accordingly, power can be supplied from the main switching unit to the load for most of the half cycle of the alternating current power source. Meanwhile, in a low load, since the current flowing in the auxiliary switching unit does not reach a predetermined threshold, the main switching unit with large power consumption is not put in a conducting state and the electrical conduction is performed by the auxiliary switching unit. Thus, in case of applying, e.g., an illumination apparatus as the load, it is possible to reduce the power consumed in the load control device when a miniature bulb serving as a low load is turned on.

In accordance with a fourth aspect of the present invention, there is provided a two-wire load control device configured to be connected in series between an AC power source and a load, including: a main switching unit, which includes a switch element having a transistor structure and controls a supply of power to the load; an auxiliary switching unit, which includes a switch element having a thyristor structure and controls the supply of power to the load when the main switching unit is in a non-conducting state; a control unit, which controls opening/closing of the main switching unit and the auxiliary switching unit; a first power supply unit electrically powered from both terminals of the main switching unit through a rectifying unit, for supplying a stable voltage to the control unit; a second power supply unit electrically powered from said both terminals of the main switching unit through the rectifying unit, for electrically powering the first power supply unit when no power is supplied to the load; a third power supply unit for electrically powering the first power supply unit when the power is supplied to the load in a closed state of one of the main switching unit and or the auxiliary switching unit; a voltage detection unit, which detects a voltage inputted to the third power supply unit; and a manipulation unit, which is manipulated by a user to adjust a current flowing in the load.

Further, the control unit sets a main switching unit conducting time which is counted in order to put the main switching unit in a conducting state at every half cycle of the AC power source in response to a manipulation inputted to the manipulation unit, and the control unit puts the main switching unit in a conducting state only while a first predetermined period, which is counted from when the voltage detection unit detects that the voltage inputted to the third power supply unit reaches a predetermined threshold, overlaps with the main switching unit conducting time.

With such configuration, when the voltage detection unit detects that the voltage inputted to the third power supply unit reaches a predetermined threshold, since the control unit puts the main switching unit in a conducting state (closed state), power is supplied from the main switching unit to the load for most of the half cycle of the alternating current power source. Further, since the conduction of the main switching unit is intermittently controlled by the manipulation inputted to the manipulation unit, it is possible to reduce the power consumption by performing a desired operation on the load using the two-wire load control device. For example, in a case where the load is an illumination apparatus, the user may manipulate the manipulation unit such that dimming is performed at a desired brightness level. Further, since the switch element of the main switching unit 11 has a transistor structure, it is possible to achieve miniaturization of the load control device generating less heat.

BRIEF DESCRIPTION OF THE DRAWINGS

The objects and features of the present invention will become apparent from the following description of embodiments, given in conjunction with the accompanying drawings, in which:

FIG. 4 is a time chart showing waveforms of currents and control signals in respective parts in an operation of the load control device in accordance with the second embodiment;

DETAILED DESCRIPTION OF THE EMBODIMENTS

Figure 1:
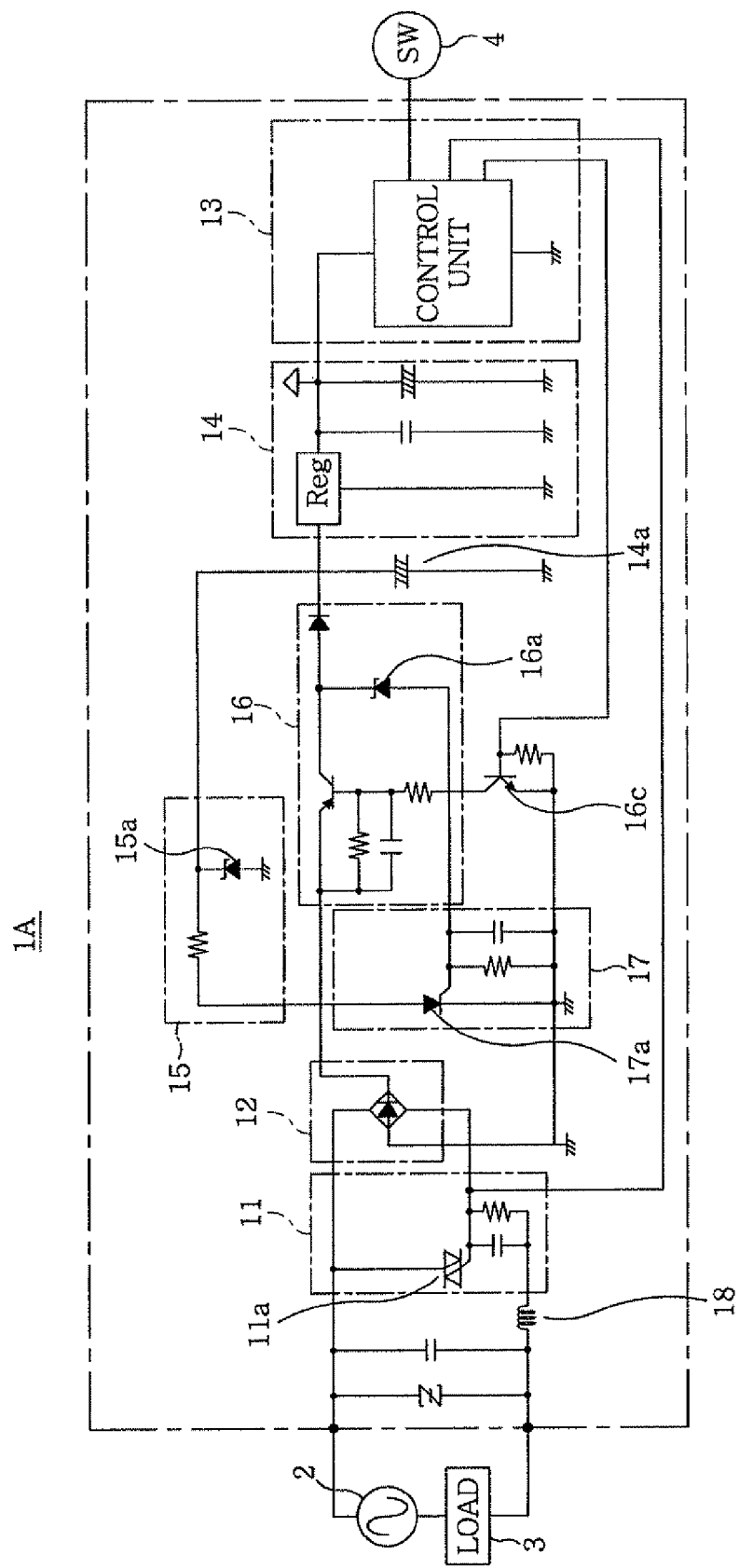
FIG. 1 is a circuit diagram showing a configuration of a load control device in accordance with a first embodiment of the present invention.

Hereinafter, embodiments of the present invention will be described with reference to the accompanying drawings which form a part hereof. Throughout the specification and drawings, like reference numerals will be given to like parts having substantially the same function and configuration, and redundant description thereof will be omitted.

(First Embodiment)

Figure 2:
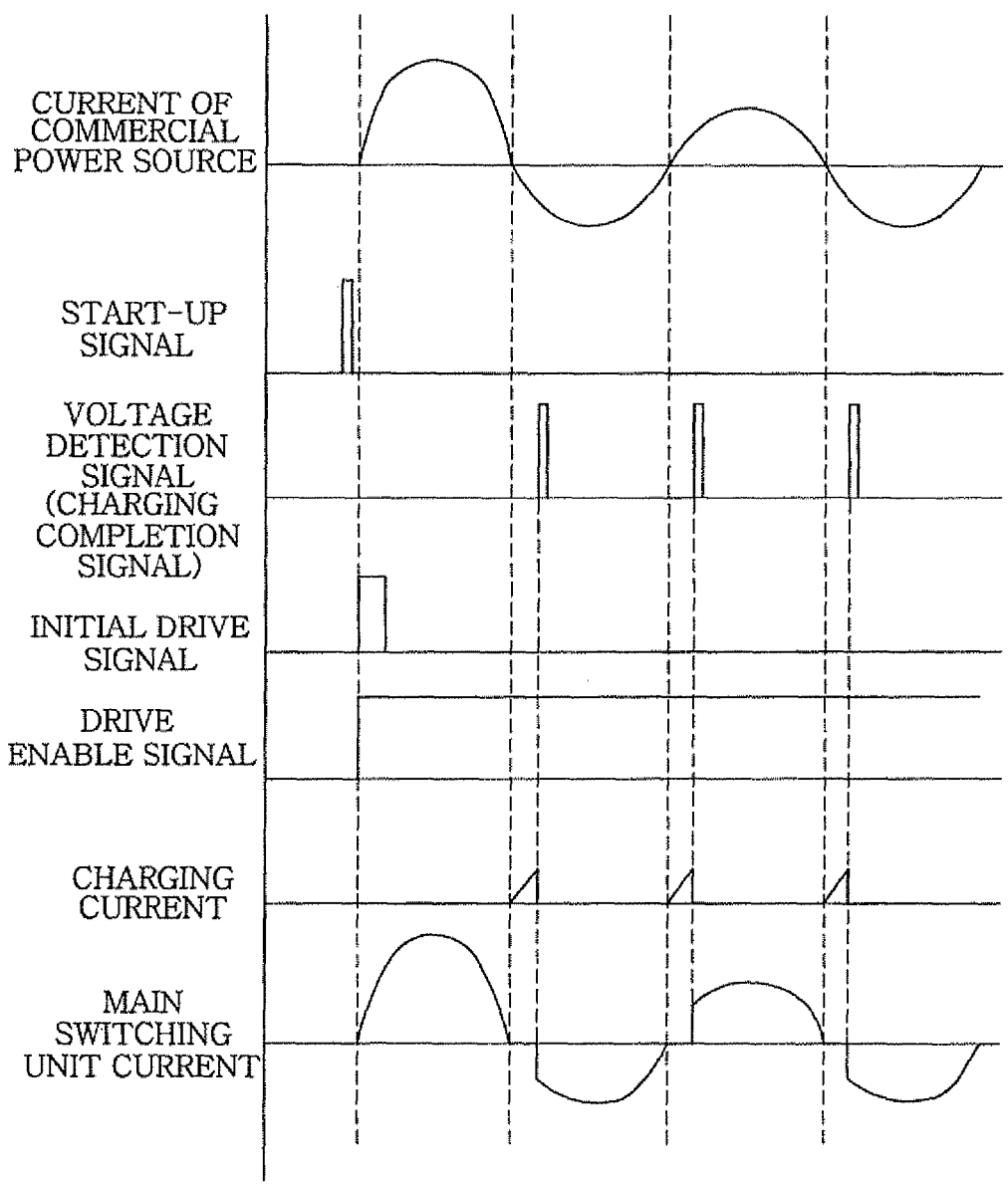
FIG. 2 is a time chart showing waveforms of currents and control signals in respective parts in an operation of the load control device in accordance with the first embodiment.

A load control device in accordance with a first embodiment of the present invention will be described with reference to FIGS. 1 and 2. FIG. 1 is a circuit diagram showing a configuration of a load control device 1A in accordance with the first embodiment of the present invention. FIG. 2 is a time chart showing waveforms of currents and control signals in respective parts thereof. A case where a triac is used as a main switch element of a main switching unit as in a conventional case will be described in the first embodiment. Further, a load 3 may be an apparatus using a motor such as a ventilator or an illumination apparatus, but it is not limited thereto.

As shown in FIG. 1, the load control device 1A connected in series between a commercial AC power source 2 and a load 3 includes a main switching unit 11 to control the supply of power to the load 3, a rectifying unit 12, and a control unit 13 controlling the entire load control device 1A. The load control device 1A further includes a first power supply unit 14 which supplies a stable power to the control unit 13, a second power supply unit 15 which supplies power to the first power supply unit 14 when no power is supplied to the load 3, and a third power supply unit 16 which supplies power to the first power supply unit 14 when power is supplied to the load 3. Also, the load control device 1A includes an auxiliary switching unit 17 which supplies to a gate of the main switch element a sufficient amount of a current to put a main switch element 11a of the main switching unit 11 in a conducting state, and the like.

The main switching unit 11 includes a triac configured as the main switch element 11a (hereinafter, referred to as "triac 11a" if necessary). Further, the control unit 13 is configured to directly output a drive signal (pulse signal) to the main switch element 11a of the main switching unit 11 without passing through the third power supply unit 16. More specifically, when a manipulation switch (SW) 4 for starting the load 3 is turned on, the control unit 13 outputs a drive signal to be directly inputted to the gate of the triac 11a. Accordingly, since an inrush current generated immediately after start-up of the load 3 flows into the triac 11a of the main switching unit 11, elements such as the third power supply unit 16 and the auxiliary switching unit 17 are protected from high current.

Next, an operation of the load control device 1A in accordance with the first embodiment of the present invention will be described with reference to FIG. 2. In an OFF state of the load control device 1A in which no power is supplied to the load 3, a voltage applied from the commercial AC power source 2 to the load control device 1A is supplied to the second power supply unit 15 via the rectifying unit 12. In an OFF state of the load 3, a ripple current that is full-wave rectified by the rectifying unit 12 is inputted to the second power supply unit 15. Only when a voltage applied thereto is higher than a Zener voltage of a Zener diode 15a, the Zener voltage is inputted to the first power supply unit 14. If the voltage that is full-wave rectified by the rectifying unit 12 is lower than the Zener voltage, a buffer capacitor 14a connected between input terminals of the first power supply unit 14 serves as a power source to supply power to the first power supply unit 14. The buffer capacitor 14a repeats charging and discharging. Further, in this case, the current flowing into the load 3 is a micro-current small enough not to cause a malfunction of the load 3. It is set such that the consumption current of the control unit 13 is small and the impedance of the second power supply unit 15 is set to be maintained high. Further, the above description is not illustrated in FIG. 2 since it is substantially the same as the conventional case.

Meanwhile, when the manipulation switch (SW) 4 is turned on to start to drive the load 3 and a start-up signal is outputted from the manipulation switch 4, the control unit 13 directly outputs an initial drive signal having one pulse to the main switching unit 11. Accordingly, the triac 11a of the main switching unit 11 is put in a conducting state and power is supplied to the load 3. As well known, although an inrush current generated when the power is inputted to the load 3 such as illumination apparatus and motor is much larger than a load current flowing into the load 3 in a normal state, the main switching unit 11 is designed and manufactured to withstand the high current. Accordingly, even though the inrush current flows in the triac 11a or the like, an element such as triac 11a is prevented from being broken.

Further, when a start-up signal is outputted from the manipulation switch 4, the control unit 13 outputs a first main switching unit drive signal, and simultaneously outputs a drive enable signal for putting a switch element 16c of the third power supply unit 16 in a conducting state. The drive enable signal is continuously outputted until the manipulation switch 4 is turned off.

The triac 11a is a self-hold element, which maintains, once a pulse signal is inputted to the gate, a conducting state until the input voltage becomes 0 V (zero-cross point). Since the triac 11a is in a conducting state, the rectified voltage of the rectifying unit 12 becomes almost zero. Meanwhile, the second power supply unit 15 and the third power supply unit 16 are put in a non-conducting state, and there flows no current therein. Accordingly, power is supplied to the first power supply unit 14 from the buffer capacitor 14a and the terminal voltage of the buffer capacitor 14a is reduced gradually.

When the voltage of the commercial AC power source becomes 0 V, the triac 11a is subjected to the self-arc-extinction and the rectified voltage of the rectifying unit 12 increases. Further, when the input voltage of the first power supply unit 14, i.e., the terminal voltage of the buffer capacitor 14a, becomes lower than the output voltage of the third power supply unit 16, the third power supply unit 16 starts the supply of power to the first power supply unit 14, and at the same time, starts charging the buffer capacitor 14a. When charging of the buffer capacitor 14a is completed and the terminal voltage thereof becomes substantially equal to the output voltage of the third power supply unit 16, the current flowing in the third power supply unit 16 is commutated to a Zener diode 16a, a thyristor 17a of the auxiliary switching unit 17, and the triac 11a of the main switching unit 11, and the triac 11a is put in a conducting state. Accordingly, power of a normal state is supplied to the load 3 from the main switching unit 11. Then, a self power reserve for the circuit of the load control device 1A, a conducting operation of the auxiliary switching unit 17 and a conducting operation of the main switching unit 11 are repeated every half cycle of AC current.

Further, as shown in FIG. 2, a timing of outputting the initial drive signal may not coincide with the zero-cross point of the commercial AC power source. In order to make them coincide, a zero-cross detection circuit may be provided such that the initial driving signal is outputted when the zero-cross detection circuit detects a zero-cross point. The same can be applied to the following embodiments.

(Second Embodiment)

Figure 3:
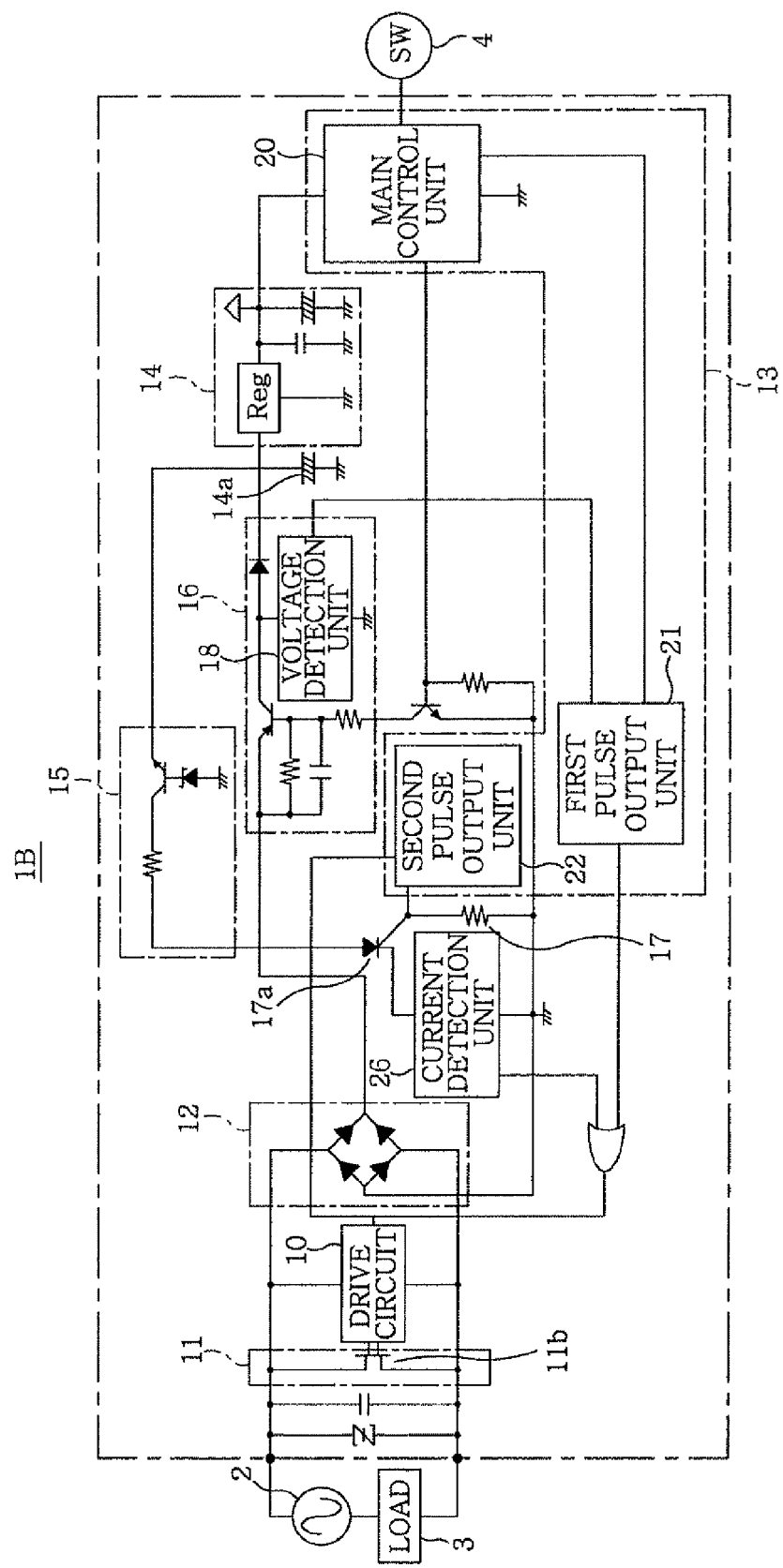
FIG. 3 is a circuit diagram showing a configuration of a load control device in accordance with a second embodiment of the present invention.
Figure 5A:
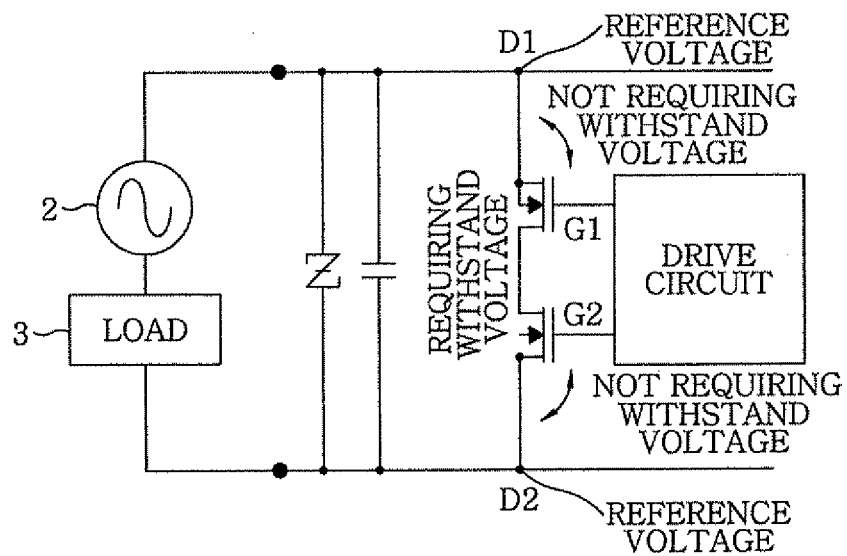
FIG. 5A is a circuit diagram of a main switch element of the second embodiment having a lateral dual gate transistor structure in which a withstand voltage maintaining region is provided at one location.
Figure 5B:
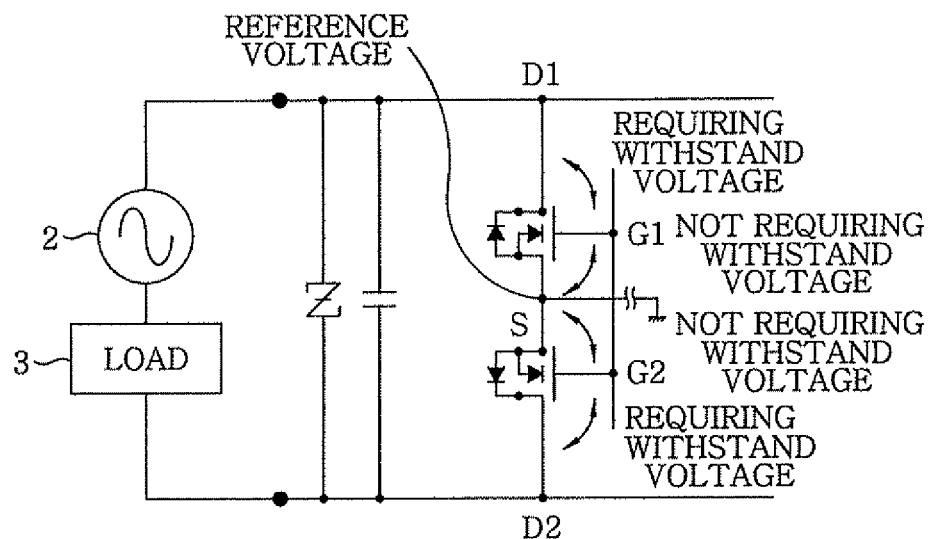
FIG. 5B is a circuit diagram when two MOSFET type transistors are connected in a reverse direction in a comparison example.
Figure 6:
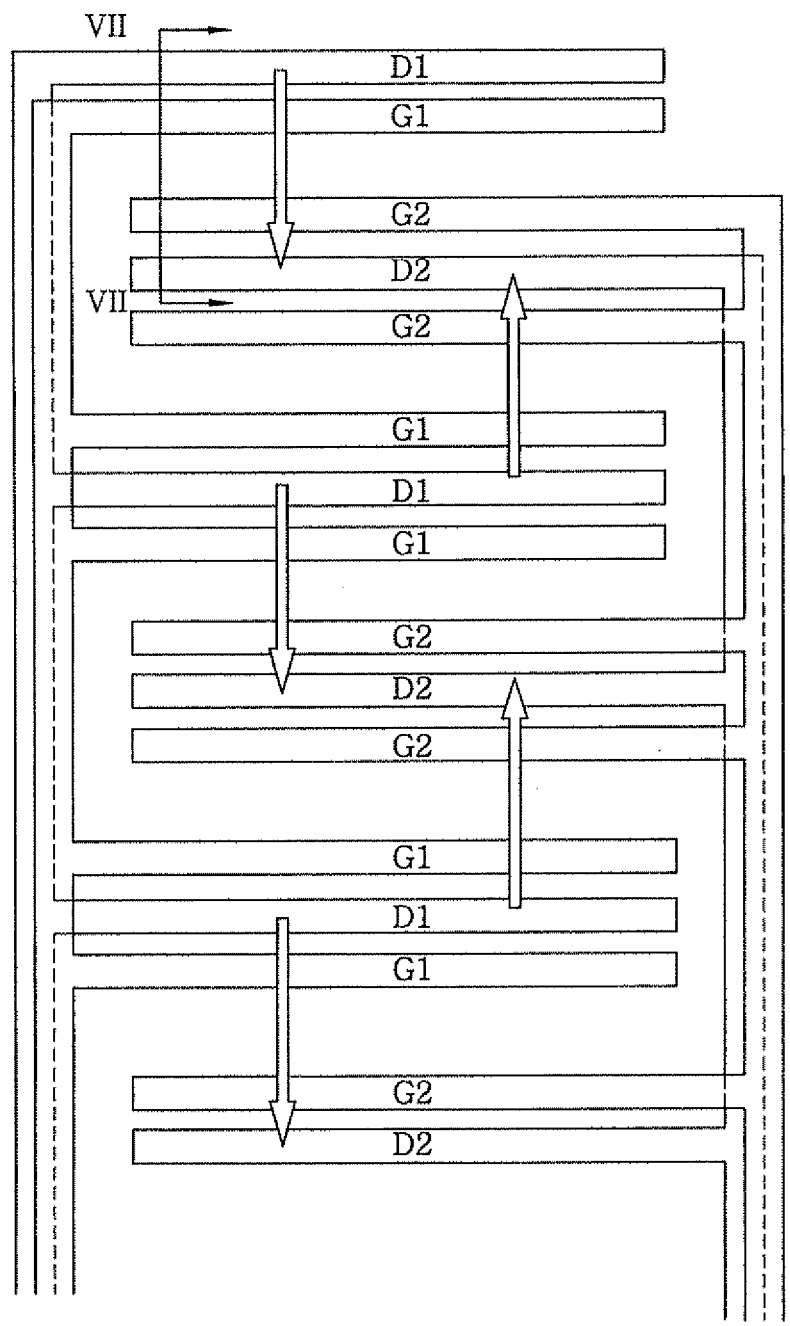
FIG. 6 is a plan view of the main switch element having a dual gate transistor structure.
Figure 7:
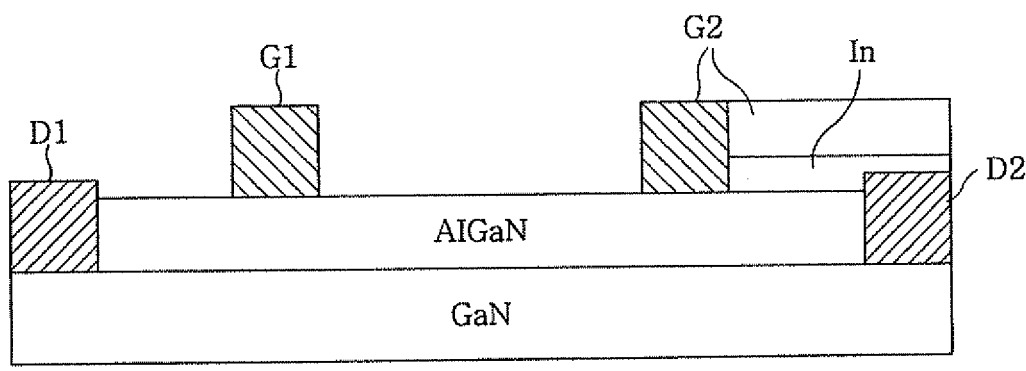
FIG. 7 is a longitudinal cross-sectional view of the main switch element having a dual gate transistor structure.

Next, a load control device in accordance with a second embodiment of the present invention will be described with reference to FIGS. 3 to 7. A main switch element used in a load control device 1B in accordance with the second embodiment of the present invention is different from the conventional triac in that it has a lateral dual gate transistor structure having one withstand voltage maintaining region is provided at one location. FIG. 3 is a circuit diagram showing a configuration of the load control device 1B in accordance with the second embodiment of the present invention. FIG. 4 is a time chart showing waveforms of currents and control signals in respective parts thereof. FIG. 5A is a circuit diagram of a main switch element having a lateral dual gate transistor structure in which a withstand voltage maintaining region is provided at one location, which is used as a main switch element 11b of a main switching unit 11 in the second embodiment. FIG. 5B is a circuit diagram when two MOSFET type transistors are connected in a reverse direction in a comparison example. FIG. 6 is a plan view of a main switch element having a lateral dual gate transistor structure. FIG. 7 is a longitudinal cross-sectional view taken along line VII-VII of FIG. 6.

In the configuration of FIG. 5B, source electrodes S of two transistors are connected to each other and also grounded (the lowest potential portion). A withstand voltage is not required between the source electrode S and the gate electrodes G1 and G2, and a withstand voltage is required to be maintained between the gate electrodes G1 and G2 and the drain electrodes D1 and D2. Accordingly, the withstand voltage maintaining region (e.g., having a width of a withstand voltage maintaining distance) needs to be provided at two locations. Since the two transistors are operated by a gate signal provided using the source electrode as a reference, they can be driven by inputting the same drive signal to the gate electrodes G1 and G2 of the respective transistors.

In contrast, as shown in FIGS. 6 and 7, a main switch element having a lateral dual gate transistor structure is a bidirectional element that can reduce its loss by providing a withstand voltage maintaining region at one location. That is, each of the drain electrodes D1 and D2 is formed on a GaN layer, and each of the gate electrodes G1 and G2 is formed on an AlGaN layer. In a state where a voltage is not applied to the gate electrodes G1 and G2, there occurs a void of electrons in a two-dimensional electron gas layer generated at a hetero interface between AlGaN and GaN below the gate electrodes G1 and G2 and there flows no current therein. Meanwhile, when a voltage is applied to the gate electrodes G1 and G2, a current flows at the hetero interface between AlGaN and GaN from the drain electrode D1 to the drain electrode D2 (or vice versa). A withstand voltage is required to be maintained between the gate electrodes G1 and G2, so that it is required to provide a predetermined distance. However, a withstand voltage is not required between the drain electrode D1 and the gate electrode G1 and between the drain electrode D2 and the gate electrode G2. Accordingly, the drain and gate electrodes D1 and G1 may overlap with each other and the drain and gate electrodes D2 and G2 may overlap with each other through an insulating layer In. Further, the element having such configuration needs to be controlled by using the voltages of the drain electrodes D1 and D2 as references, and it is necessary to input a drive signal into each of gate electrodes G1 and G2 (thus, it is referred to as a dual gate transistor structure).

The load control device 1B shown in FIG. 3 includes the main switch element 11b of the main switching unit 11 having a dual gate transistor structure (schematically shown in the drawing). Accordingly, only while a control signal is inputted to each of the gate electrodes G1 and G2, the main switch element 11b of the main switching unit 11 is in a conducting state. Accordingly, it is necessary to generate a first pulse signal for driving the main switch element 11b. In the configuration example shown in FIG. 3, a third power supply unit 16 includes a voltage detection unit 18 which detects a voltage inputted to the third power supply unit 16. Also, a control unit 13 includes a first pulse output unit (main switching unit drive signal output unit) 21 which outputs a first pulse signal in response to a detection signal from the voltage detection unit 18, and a second pulse output unit 22 which outputs a second pulse signal for putting a thyristor 17a of an auxiliary switching unit 17 in a conducting state for a predetermined period after the main switching unit 11 is put in a non-conducting state. Further, differently from the first embodiment, the auxiliary switching unit 17 carries out the supply of power to the load 3 when the load current is low.

Next, an operation of the load control device 1B in accordance with the second embodiment of the present invention will be described with reference to FIG. 4. When the manipulation switch (SW) 4 is turned on to start to drive the load 3 and a start-up signal is outputted from the manipulation switch 4, an initial drive signal having a predetermined pulse width is outputted from a main control part 20 of the control unit 13 to the main switching unit 11 directly or through the first pulse output unit 21. Accordingly, the main switch element 11b of the main switching unit 11 is put in a conducting state and power is supplied to the load 3. As well known, although an inrush current generated when power is inputted to the load 3 such as illumination apparatus and motor is much larger than a load current flowing into the load 3 in a normal state, the main switch element 11b is designed and manufactured to withstand the high current. Accordingly, even though the inrush current flows in the main switch element 11b, an element such as the main switch element 11b is prevented from being broken. Further, since the drive enable signal is substantially the same as that of the first embodiment, and a description thereof will be omitted.

The main switch element 11b of the second embodiment is put in a conducting state only while a specific voltage is applied to the gate electrodes G1 and G2 in a different way from the triac. Accordingly, the pulse width of the initial drive signal is larger than ¼ cycle and smaller than ½ cycle of the commercial AC power source, and is set to be longer than the first pulse signal. If the initial drive signal is absent (drops), the main switching unit 11 is put in a non-conducting state (open state). Accordingly, the second pulse output unit 22 outputs a second pulse signal to put the auxiliary switching unit 17 in a conducting state (closed state) only for a second predetermined period (e.g., several hundred μ seconds). Consequently, the main switching unit 11 is put in a non-conducting state and the load current is commutated to the auxiliary switching unit 17, and power is supplied to the load 3 from the thyristor 17a of the auxiliary switching unit 17. Since the thyristor 17a is a self-arc-extinction type switch element, the thyristor 17a is automatically put in a non-conducting state when a voltage value of the load current becomes 0 V (zero-cross point).

If both the main switching unit 11 and the auxiliary switching unit 17 are put in a non-conducting state, the rectified voltage of a rectifying unit 12 begins to increase, and the current flows in the third power supply unit 16 to start charging a buffer capacitor 14a. As described above, the voltage detection unit (charging monitoring unit) 18 is provided in the third power supply unit 16 to detect an input voltage of the third power supply unit 16 or a terminal voltage of the buffer capacitor 14a (i.e., full charging of the buffer capacitor 14a). If the voltage detection unit 18 detects that the input voltage of the third power supply unit 16 or the terminal voltage of the buffer capacitor 14a reaches a predetermined threshold, the voltage detection unit 18 outputs a specific detection signal. When the first pulse output unit 21 of the control unit 13 receives the detection signal from the voltage detection unit 18, in order to put the main switching unit 11 in a conducting state (closed state) for a first predetermined period, the first pulse output unit 21 outputs a first pulse signal (main switching unit drive signal) to a drive circuit 10 for putting the main switching unit 11 in a conducting state.

Further, in FIG. 3, the first pulse output unit (main switching unit drive signal output unit) 21 is configured by hardware with a dedicated IC and the like and is provided as a part of the control unit 13 to directly output the first pulse signal in response to the detection signal from the voltage detection unit 18. However, it is not limited thereto. For example, it may be configured such that the output of the voltage detection unit 18 is inputted to the main control part 20 including a CPU and the like and the first pulse signal is outputted by software.

If the first pulse signal is absent (drops), the main switching unit 11 is put in a non-conducting state (open state). Accordingly, the second pulse output unit 22 outputs a second pulse signal to put the auxiliary switching unit 17 in a conducting state (closed state) only for a second predetermined period (e.g., several hundred μ seconds). The thyristor 17a of the auxiliary switching unit 17 is put in a conducting state such that power is supplied to the load 3 until the thyristor 17a is subjected to the self-arc-extinction. Then, a self power reserve for the circuit of the load control device 1B, a conducting operation of the auxiliary switching unit 17 and a conducting operation of the main switching unit 11 are repeated every half cycle of alternating current.

Since these operations are performed with respect to the load current, although the main switching unit 11 includes the main switch element 11b having a transistor structure, it is possible to achieve a two-wire load control device which is applicable to any one of a fluorescent lamp, incandescent lamp and the like without being limited to those having a power factor of 1. Further, since the main switching unit 11 includes the main switch element 11b having a lateral dual gate transistor structure, a withstand voltage maintaining region in the transistor is limited to one location. Accordingly, it is possible to reduce the amount of heat generated by the main switch element when power is supplied to the load, thereby achieving both miniaturization and high capacity of the load control device.

Further, although FIG. 3 illustrates the example of providing a current detection unit 26 for detecting the current flowing into the auxiliary switching unit 17, this is to protect the auxiliary switching unit 17 from being broken by performing an operation of switching a load current path from the auxiliary switching unit 17 to the main switching unit 11 when the frequency is deviated or overload is connected. Accordingly, the current detection unit 26 is not positively necessary and may be provided if necessary.

Figure 8:
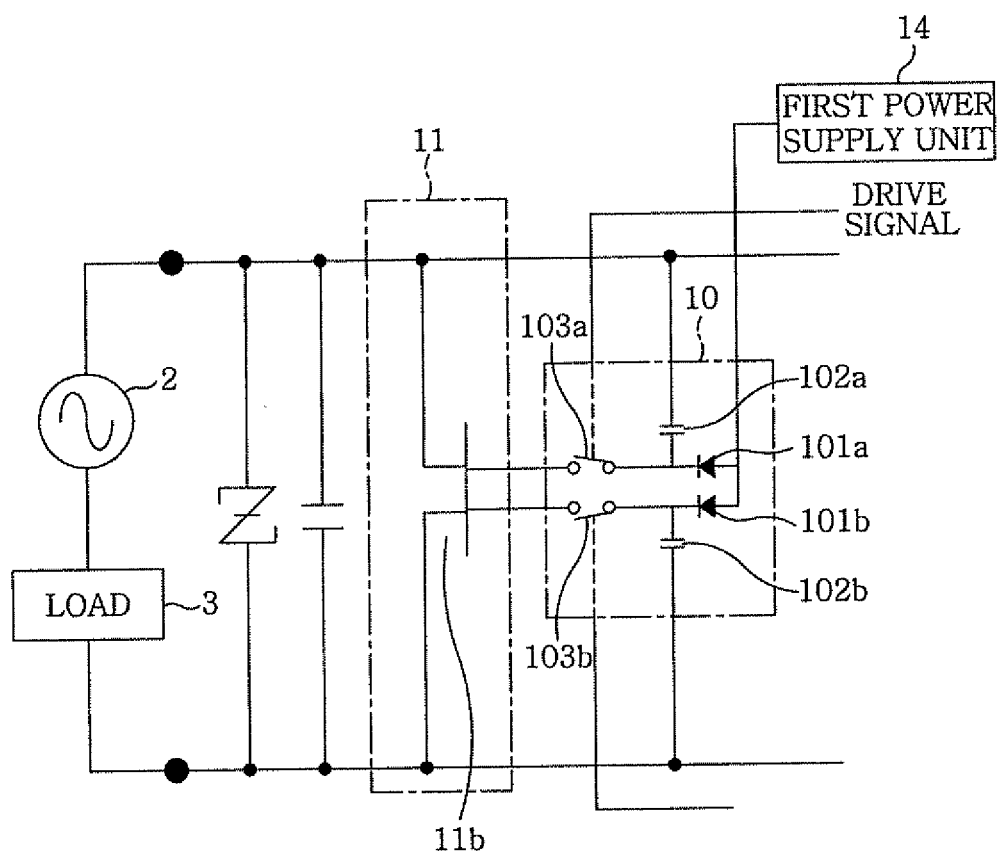
FIG. 8 is a circuit diagram showing a configuration example of the drive circuit shown in FIG. 3.

FIG. 8 is a circuit diagram showing a configuration example of the drive circuit 10. The drive circuit 10 for driving the main switching unit 11 includes diodes 101a and 101b having two diodes corresponding to the dual gates of the main switch element 11b and connected to a first power supply unit 14 of the load control device 1B, capacitors 102a and 102b having one ends connected to respective power lines and the other ends connected to the diodes 101a and 101b, and drive switch elements 103a and 103b connected between gate terminals of the main switch element 11b of the main switching unit 11 and connection points between the diodes 101a and 101b and the capacitors 102a and 102b. The drive switch elements 103a and 103b are turned on/off based on a signal transmitted from the control unit 13. Further, each of the drive switch elements 103a and 103b has a configuration in which a switch portion is isolated from a control portion. The configuration of each of the drive switch elements 103a and 103b is not particularly limited thereto. As will be described later, various types of elements, e.g., an optically coupled semiconductor switch element such as photocoupler and photorelay may be used.

With such configuration, the first power supply unit 14 of the load control device 1B is connected to the other ends of the capacitors 102a and 102b having respective one ends connected to the power lines via the diodes 101a and 101b. Accordingly, a simple power source using the potential of the power lines as a reference is configured by the capacitors 102a and 102b. The capacitor connected to the side having a low voltage is charged by the current flowing into the power line having a low voltage from the power line having a high voltage via an inner power supply of the load control device 1B to thereby charge the capacitors 102a and 102b. In this case, since the capacitor connected to the side having a high voltage is not charged, charging of the capacitor is repeated every one cycle of the power frequency. The capacitor on the opposite side is charged at a timing reverse to that in the above relationship between the potentials of power lines.

In a case where the main switch element 11b having a lateral dual gate transistor structure is switched from an OFF state to an ON state, a voltage provided using connection point connected to the power line (see FIG. 5A) needs to be applied to the gate of the main switch element 11b. In this case, when the drive switch element 103a or 103b connected to the gate electrode of the main switch element 11b of the main switching unit 11 is put in a conducting state based on a signal transmitted from the control unit 13, since a voltage, which is charged in each of the capacitors by using the power line as a reference is applied to the gate terminal of the main switch element 11b, the main switch element 11b is put in a conducting state (closed state). Once the main switch element 11b is put in a conducting state, since a voltage between terminals of the main switch element 11b becomes very small, the conducting state can be maintained by a voltage applied from the power source of the load control device 1B via the diodes 101a and 101b and the drive switch elements 103a and 103b.

Since the drive circuit 10 is non-isolated from the first power supply unit 14 in this embodiment, it is possible to supply a driving power with high efficiency. The capacitors 102a and 102b may have a small size or a small capacity since it is preferable to temporarily fix the potential of the gate electrode when the main switch element 11b is switched from an OFF state to an ON state. Further, power is supplied to the drive circuit 10 from a power supply unit having a relatively stable input or output, such as the first power supply unit 14.

Figure 9:
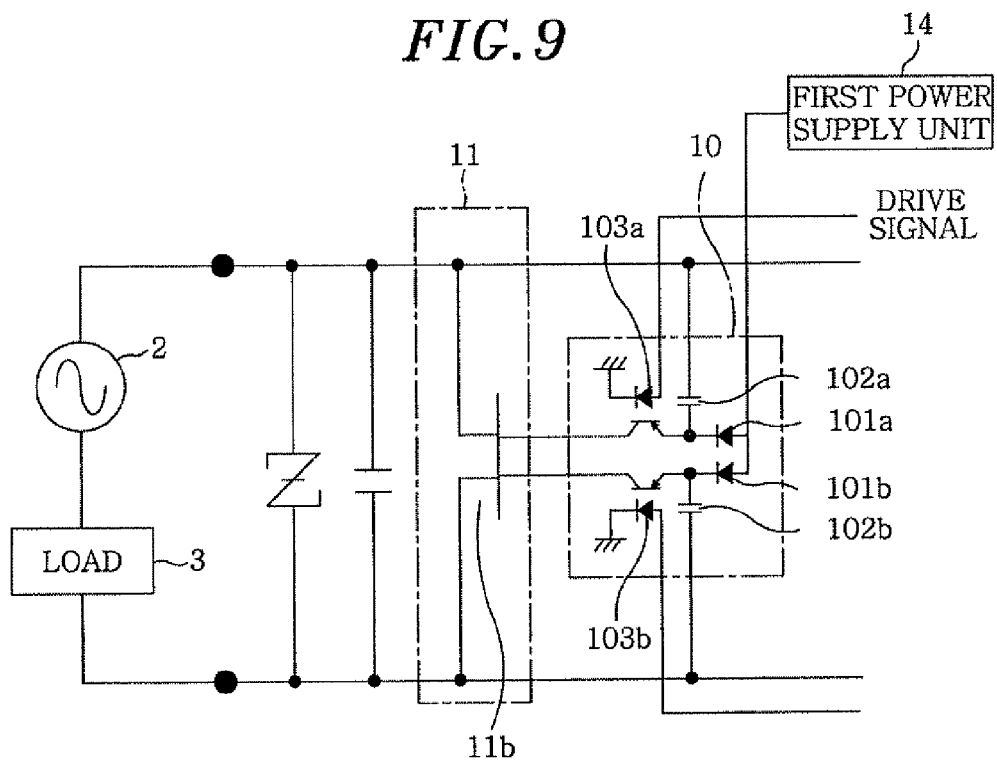
FIG. 9 is a circuit diagram showing a specific configuration example of the drive circuit.

FIG. 9 illustrates a specific configuration example of the drive circuit 10, wherein an optically coupled semiconductor switch element such as a photocoupler and a photorelay is used as the drive switch elements 103a and 103b. When a drive signal is inputted from the control unit 13, an optical signal is outputted from a light emitting part of the optically coupled semiconductor switch element. When the optical signal is inputted to a light receiving part, the light receiving part is put in a conducting state and the current (drive signal) from the first power supply unit 14 flows therein. Since the light emitting part is electrically isolated from the light receiving part, a drive signal is not inputted to the gate electrode of the main switch element 11b unless light is outputted from the light emitting part. Accordingly, it is possible to easily and surely turn on/off each of the drive switch elements 103a and 103b connected to the gate electrodes of the main switch element 11b while maintaining electrical isolation on the basis of the drive signal transmitted from the control unit 13.

Figure 10:
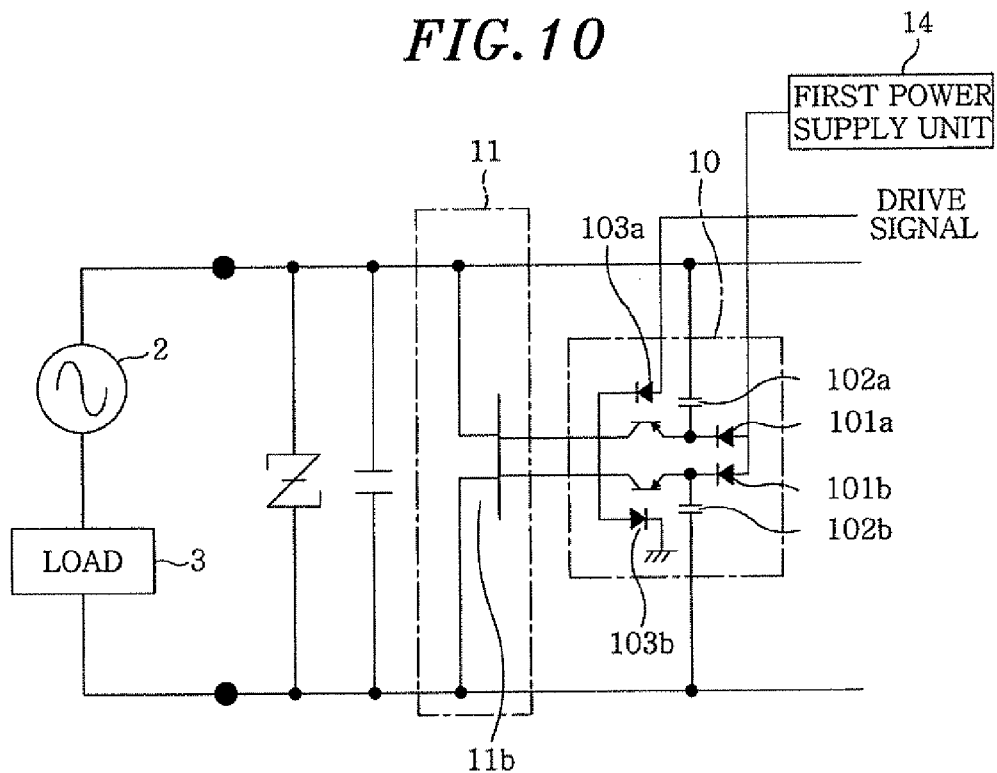
FIG. 10 is a circuit diagram showing a modification example of the drive circuit shown in FIG. 9.

FIG. 10 illustrates a modification example of the drive circuit 10 shown in FIG. 9. In this modification example, the light emitting parts of the drive switch elements 103a and 103b using the optically coupled semiconductor switch elements such as photocouplers and photorelays are connected in series. Accordingly, the current flowing into the drive circuit 10 can be reduced by about ½, thereby reducing the power consumption in the drive circuit 10.

Figure 11:
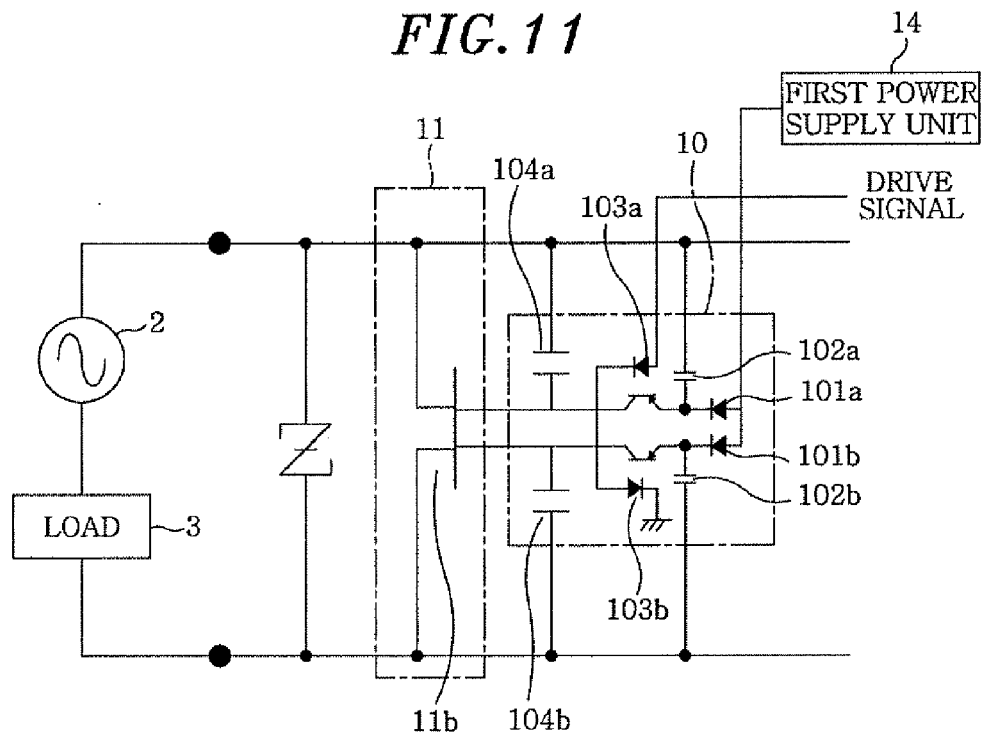
FIG. 11 is a circuit diagram showing another modification example of the drive circuit shown in FIG. 9.

FIG. 11 illustrates another modification example of the drive circuit 10 shown in FIG. 9. In this modification example, the light emitting parts of the drive switch elements 103a and 103b using the optically coupled semiconductor switch elements such as photocouplers and photorelays are connected in series. Further, capacitors 104a and 104b are connected between the power lines each of which is used as a reference of the gate electrode and connection points between the gate electrodes of the main switch element 11b of the main switching unit 11 and the drive switch elements 103a and 103b. Further, the capacitors 104a and 104b may be added to the configuration example of the drive circuit 10 shown in FIG. 9.

Figure 43:
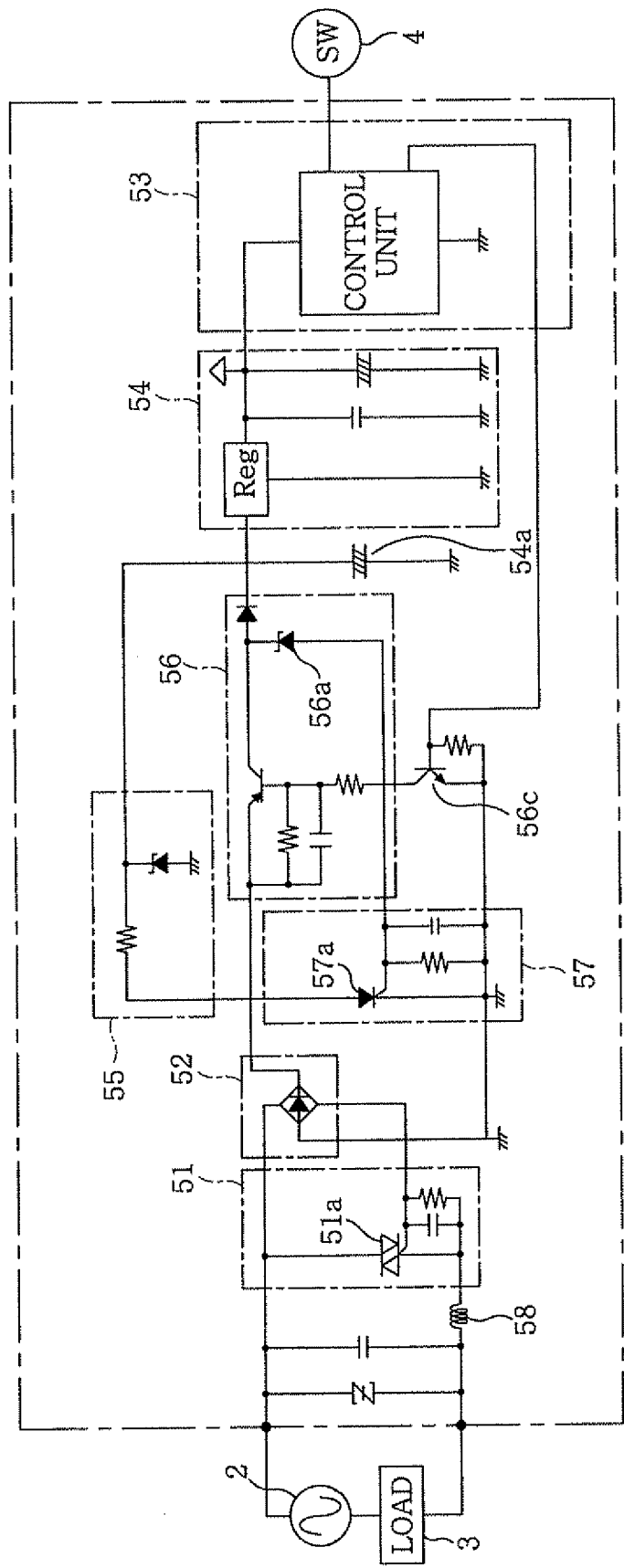
FIG. 43 is a circuit diagram showing a configuration of a load control device of a first conventional example.
Figure 44:
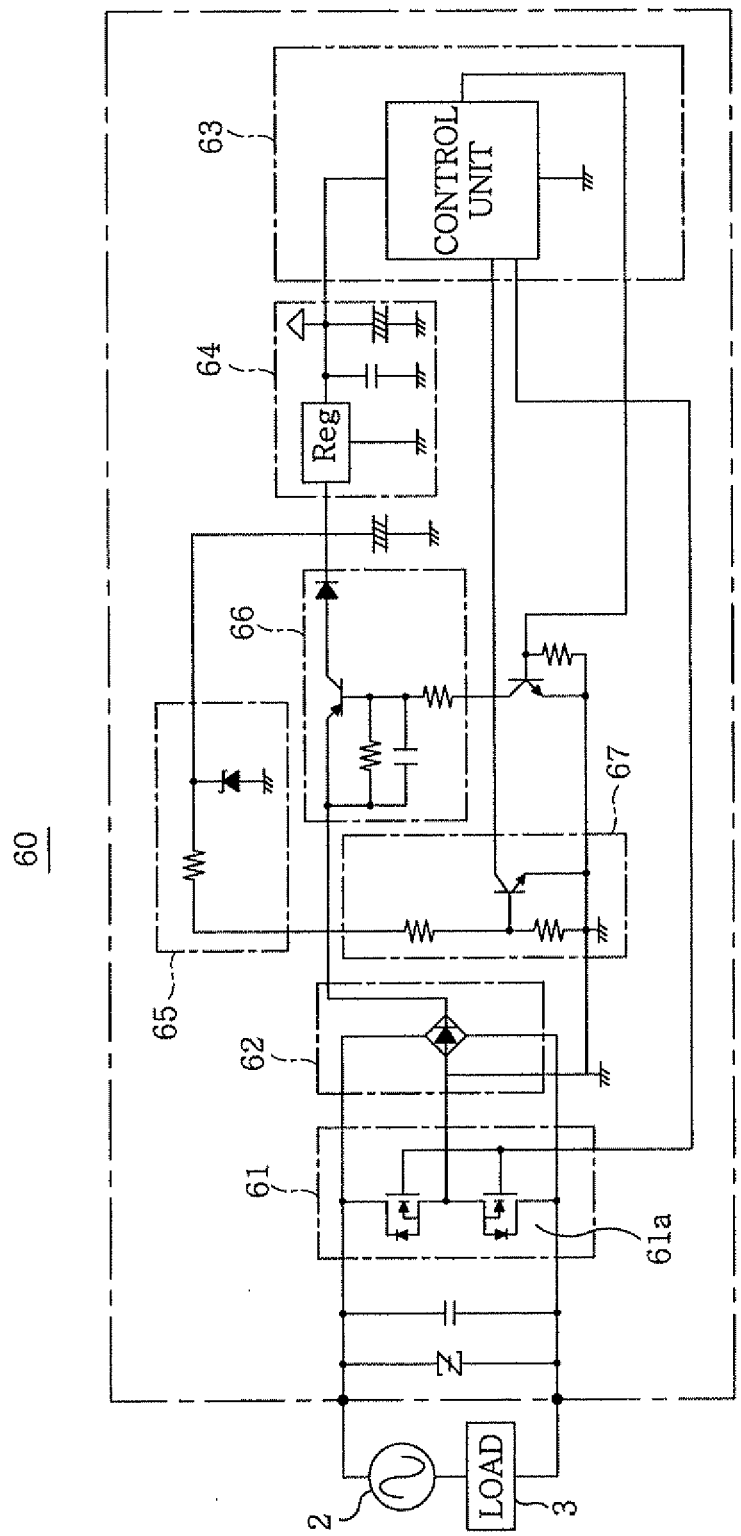
FIG. 44 is a circuit diagram showing a configuration of a load control device of a second conventional example.

By adding the capacitors 104a and 104b as shown in the modification example, when the drive switch elements 103a and 103b are turned on/off, the capacitors 104a and 104b make it possible to mitigate a sudden change in voltage applied to the gate electrodes of the main switch element 11b and to prevent the main switch element 11b from being rapidly turned on and off. Consequently, it is possible to reduce the noise generated when the main switch element 11b of the main switching unit 11 is turned on/off, thereby reducing the size of the noise filter or omitting the noise filter. That is, compared to the conventional configuration illustrated in FIG. 43, a coil or capacitor serving as the noise filter may be omitted.

With regard to the coil serving as the noise filter, the coil becomes large-sized as the rated current of the load control device increases. Accordingly, if the coil can be omitted, it is possible to achieve miniaturization of the load control device. With regard to the capacitor serving as the noise filter, it has less restriction on the size of the load control device compared to the coil. However, the presence of the capacitor leads to a reduction in impedance of the load control device in an OFF state of the load control device, and it is undesirable for an OFF state of the load control device. Further, an alternating current flows through the capacitor even in an OFF state of the load control device. Accordingly, a malfunction of the load may occur in an OFF state. Thus, in the two-wire load control device, it is preferable to omit the capacitor serving as the noise filter from the load control device.

Figure 12:
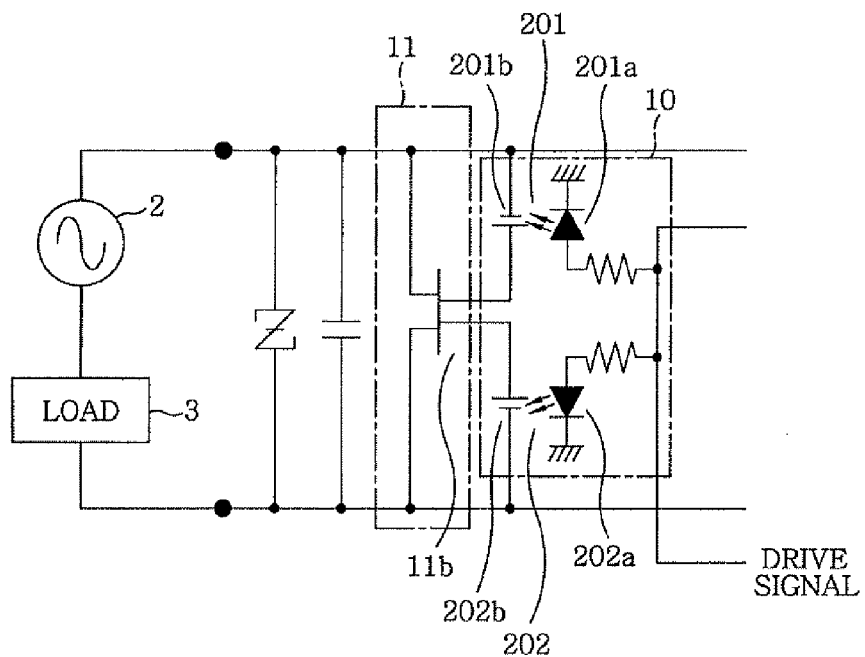
FIG. 12 is a circuit diagram showing another specific configuration example of the drive circuit shown in FIG. 3.

FIG. 12 is a circuit diagram showing another specific configuration example of the drive circuit 10. The drive circuit 10 includes two optically coupled semiconductor switch elements 201 and 202 such as photocouplers corresponding to the dual gates of the main switch element 11b, and the like. A drive signal is inputted from the control unit 13 to each of light emitting parts 201a and 202a of the optically coupled semiconductor switch elements 201 and 202. Upon receiving the drive signal, each of the light emitting parts 201a and 202a of the optically coupled semiconductor switch elements 201 and 202 converts the power into optical energy and outputs the optical energy. When light from the light emitting parts 201a and 202a is incident on light receiving parts 201b and 202b of the optically coupled semiconductor switch elements 201 and 202, photoelectric conversion is performed in each of the light receiving parts 201b and 202b, to convert the optical energy into electric energy (i.e., generate power). Each of the light receiving parts 201b and 202b is connected such that the power is generated therefrom to apply a positive potential to the gate of the main switch element 11b of the main switching unit 11 by using as a reference each of the connection points respectively connected to the AC power source (commercial AC power source) and the load (see FIG. 5A).

The light emitting parts 201a and 202a of the optically coupled semiconductor switch elements 201 and 202 emit light based on the drive signal outputted from the control unit 13. Accordingly, it is possible to easily input the drive signal to the gate electrodes of the main switch element 11b of the main switching unit 11 having a different reference potential, and put the main switch element 11b of the main switching unit 11 in a conducting state (closed state). Further, since each of the light emitting parts 201a and 202a of the optically coupled semiconductor switch elements 201 and 202 is electrically isolated from each of the light receiving parts 201b and 202b thereof, a drive signal is not inputted to the gate electrode of the main switch element 11b unless light is outputted from the light emitting parts 201a and 202a. That is, the gate electrode of the main switch element 11b is supplied with a power that is electrically isolated from the control unit 13 (or the first power supply unit 14 of the load control device 1B) and is different from the drive signal outputted from the control unit 13. Further, it is possible to easily and surely turn on/off each of the optically coupled semiconductor switch elements 201 and 202 connected to the gate electrode of the main switch element 11b while maintaining electrical isolation on the basis of the drive signal transmitted from the control unit 13.

Figure 13:
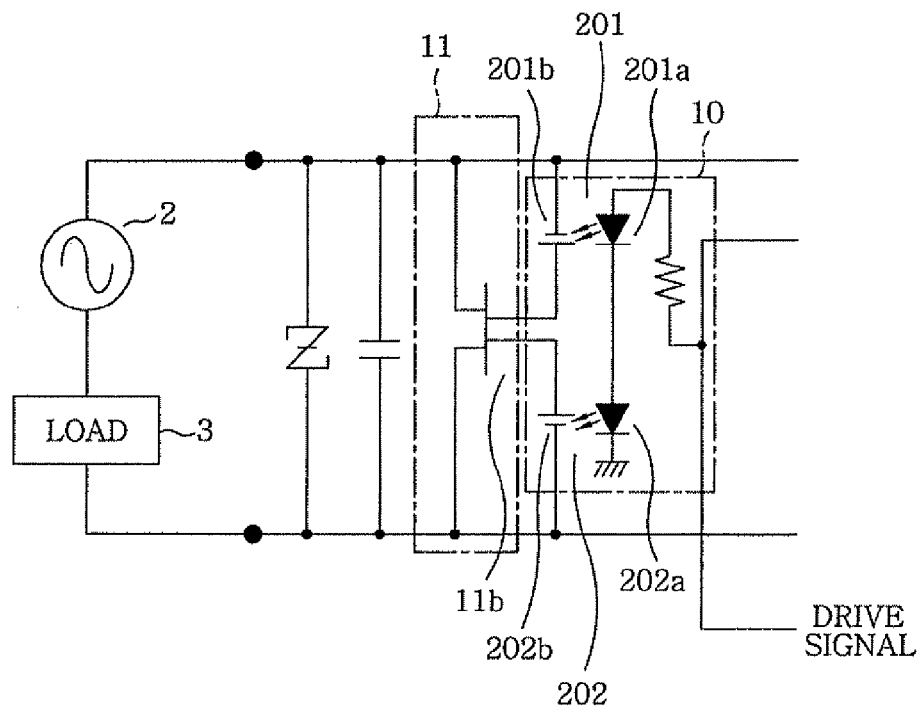
FIG. 13 is a circuit diagram showing a modification example of the drive circuit shown in FIG. 12.

FIG. 13 illustrates a modification example of the drive circuit 10 shown in FIG. 12. In this modification example, the light emitting parts 201a and 202a of the optically coupled semiconductor switch elements 201 and 202 such as photocouplers are connected in series. Accordingly, the current flowing into the drive circuit 10 can be reduced by about ½, thereby reducing the power consumption of the drive circuit 10.

Figure 14:
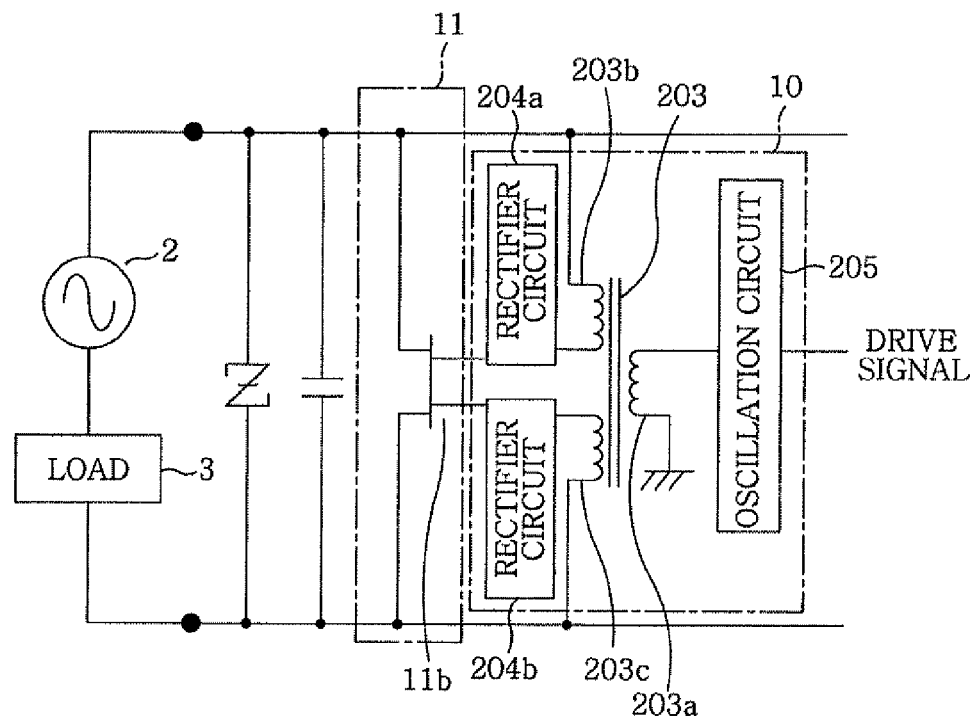
FIG. 14 is a circuit diagram showing another specific configuration of the drive circuit shown in FIG. 3.

FIG. 14 is a circuit diagram showing another specific configuration of the drive circuit 10. In this configuration example, the drive circuit 10 includes a transformer (electromagnetic coupling element) 203 such as a high-frequency isolation transformer to transmit power by electromagnetic coupling, rectifier circuits 204a and 204b, an oscillation circuit 205 and the like. A primary coil 203a of the transformer 203 is connected to the oscillation circuit 205, and the oscillation circuit 205 is connected to the control unit 13. When a drive signal transmitted from the control unit 13 is inputted to the oscillation circuit 205, the oscillation circuit 205 performs oscillation to generate an alternating current power only while the drive signal is applied. When the alternating current generated by the oscillation circuit 205 flows in the primary coil 203a of the transformer 203, an electromotive force is generated in secondary coils 203b and 203c by electromagnetic induction. Since the electromotive force generated in the secondary coils 203b and 203c of the transformer 203 is an alternating current, it is rectified by the rectifier circuits 204a and 204b to be inputted to the gate electrodes of the main switch element 11b of the main switching unit 11. Further, the rectifier circuits 204a and 204b are connected to apply a positive potential to the gate electrodes of the main switch element 11b by using as a reference the connection points respectively connected to the commercial AC power source and the load. Further, since the primary coil 203a and the secondary coils 203b and 203c of the transformer 203 are electrically isolated from each other, a drive signal is not inputted to the gate electrodes of the main switch element 11b unless the current flows in the primary coil 203a of the transformer 203. That is, the gate electrodes of the main switch element 11b are supplied with a power that is electrically isolated from the control unit 13 and is different from the drive signal outputted from the control unit 13.

As described above, since an alternating current power is generated by the oscillation circuit 205 by using the drive signal outputted from the control unit 13 as a trigger, it is possible to generate a desired power in the secondary coils 203b and 203c of the transformer 203 by appropriately setting the oscillation frequency and amplitude of the oscillation circuit 205, the numbers of turns of the primary coil 203a and the secondary coils 203b and 203c of the transformer 203, and the like. Accordingly, even in a current type main switch element in which the gate of the main switch element 11b of the main switching unit 11 requires a current value equal to or greater than a predetermined value, it can be stably driven. Further, the driving power of the oscillation circuit 205 is supplied from any power supply unit of the load control device. Although not shown in the drawing, the oscillation circuit 205 may be omitted such that the control unit 13 directly outputs a pulse signal having a predetermined frequency and predetermined amplitude.

(Third Embodiment)

Figure 15:
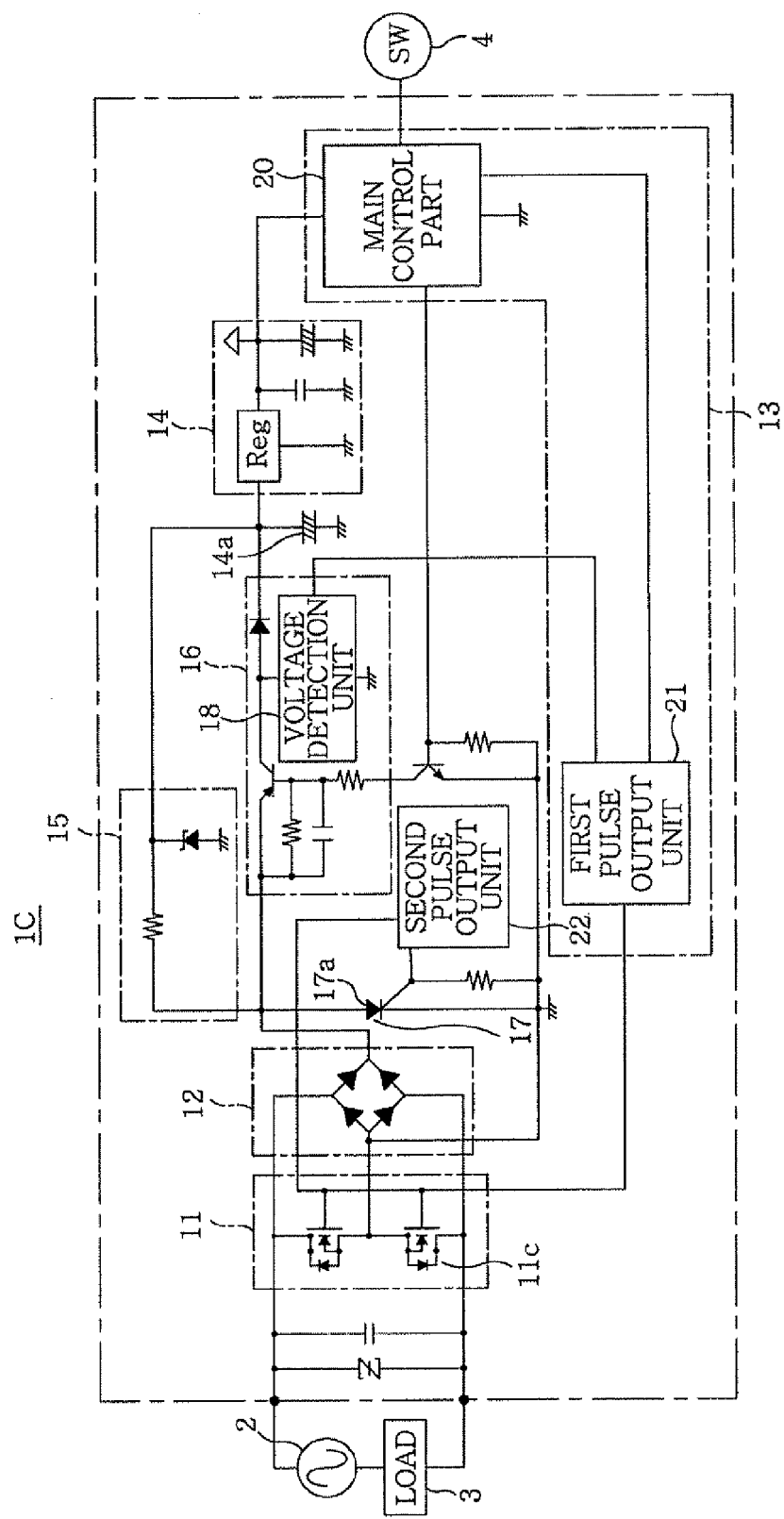
FIG. 15 is a circuit diagram showing a configuration of a load control device in accordance with a third embodiment of the present invention.
Figure 16:
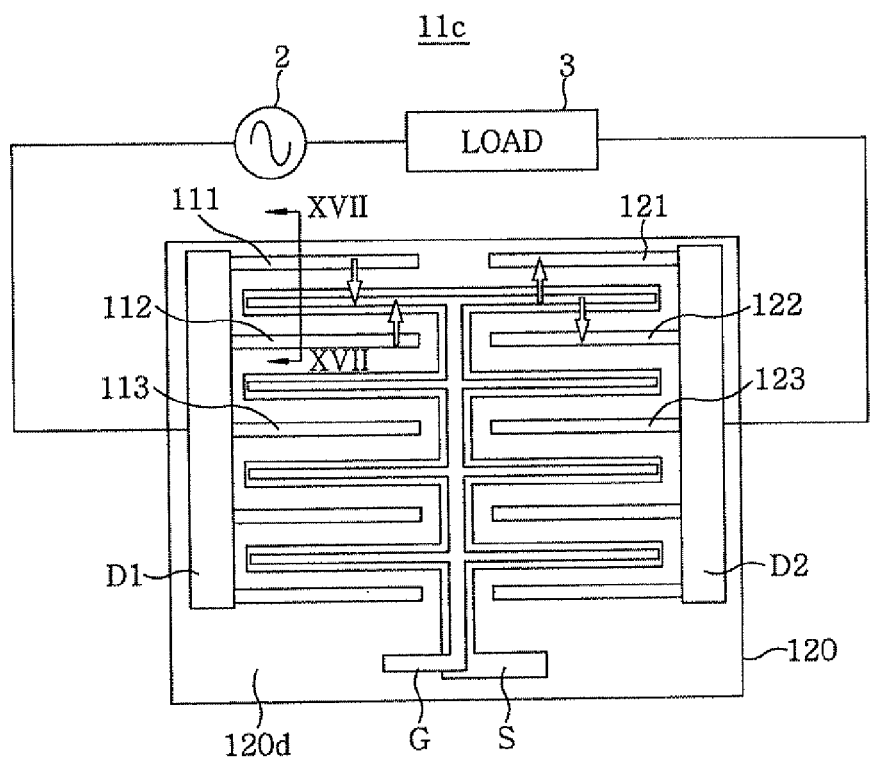
FIG. 16 is a plan view of a main switch element of the third embodiment having a lateral single gate transistor structure in which a withstand voltage maintaining region is provided at one location.
Figure 17:
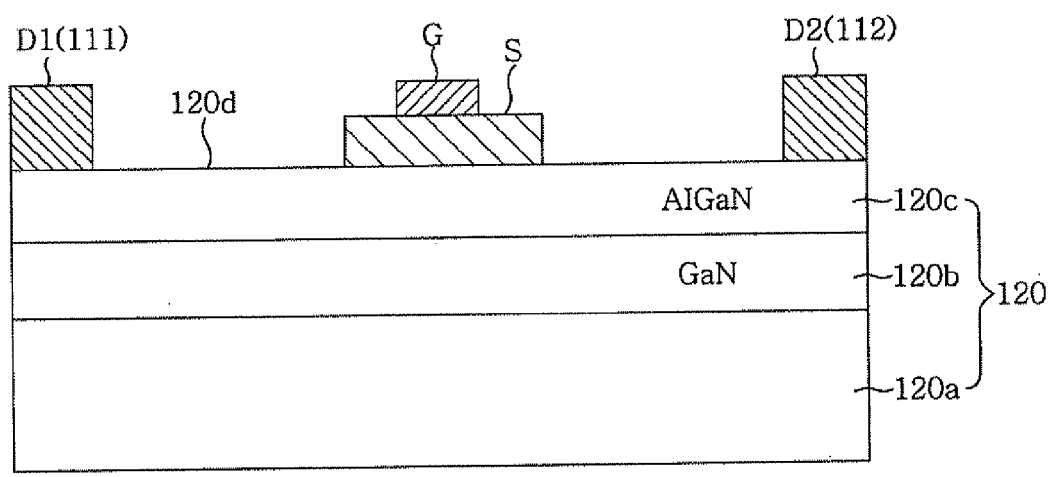
FIG. 17 is a longitudinal cross-sectional view of the main switch element having a single gate transistor structure.

Next, a load control device in accordance with a third embodiment of the present invention will be described with reference to FIGS. 15 to 17. A main switch element used in a load control device 1C in accordance with the third embodiment has a lateral single gate transistor structure in which a withstand voltage maintaining region is provided at two locations, which is different from the conventional triac or the dual gate transistor structure. FIG. 15 is a circuit diagram showing a configuration of the load control device 1C in accordance with the third embodiment of the present invention. FIG. 16 is a plan view of the main switch element having a lateral single gate transistor structure. FIG. 17 is a longitudinal cross-sectional view taken along line XVII-XVII of FIG. 16.

Compared to the second embodiment using the main switch element 11b having a dual gate transistor structure shown in FIG. 3, in the third embodiment using a main switch element 11c having a single gate transistor structure shown in FIG. 15, a first drive signal or a first pulse signal outputted from the main control part 20 or the first pulse output unit 21 is directly inputted to each of two elements having a single gate transistor structure. Accordingly, the drive circuit 10 is unnecessary. The other configuration of the load control device 1C is the substantially same as that of the load control device 1B of FIG. 3 in accordance with the second embodiment.

As shown in FIG. 17, a substrate 120 of the main switch element 11c includes a conductive layer 120a and a Gad layer 120b and an AlGaN layer 120c stacked on the conductive layer 120a. The main switch element 11c uses, as a channel layer, a two-dimensional electron gas layer generated at a hetero interface between AlGaN and GaN. As shown in FIG. 16, formed on a surface 120d of the substrate 120 are a first drain electrode D1 and a second drain electrode D2 respectively connected in series to the commercial AC power source 2 and the load 3, and a midpoint potential portion S having a midpoint potential with respect to the potentials of the first drain electrode D1 and the second drain electrode D2. Further, a control electrode (gate) G is formed on the midpoint potential portion S. For example, a Schottky electrode is used as the control electrode G.

The first drain electrode D1 has a comb shape including a plurality of electrodes 111, 112, 113 . . . arranged in parallel to each other, and the second drain electrode D2 has a comb shape including a plurality of electrodes 121, 122, 123 . . . arranged in parallel to each other. The electrodes 111, 112, 113 . . . arranged in a comb shape are disposed to face the electrodes 121, 122, 123 . . . arranged in a comb shape. The midpoint potential portion S and the control electrode G are respectively arranged between the electrodes 111, 112, 113 . . . and 121, 122, 123 . . . arranged in a comb shape. The midpoint potential portion S and the control electrode G are similar in a planar shape of a space formed between the electrodes (approximately fish spine shape).

Next, a lateral transistor structure of the switch element 11c will be described. As shown in FIG. 16, the electrode 111 of the first drain electrode D1 and the electrode 121 of the second drain electrode D2 are arranged such that their central lines in the width direction are located on the same line. A corresponding portion of the midpoint potential portion S and a corresponding portion of the control electrode G are provided in parallel to the electrode 111 of the first drain electrode D1 and the electrode 121 of the second drain electrode D2 respectively. In the width direction, the distances between the electrode 111 of the first drain electrode D1, the electrode 121 of the second drain electrode D2, the corresponding portion of the midpoint potential portion S and the corresponding portion of the control electrode G are set as distances capable of maintaining a predetermined withstand voltage. The same is applied to a direction perpendicular to the width direction, i.e., a length direction of the electrode 111 of the first drain electrode D1 and the electrode 121 of the second drain electrode D2. Further, such relationship is also applied to the other electrodes 112 and 122, 113 and 123. That is, the midpoint potential portion S and the control electrode G are arranged at positions capable of maintaining a predetermined withstand voltage with respect to the first drain electrode D1 and the second drain electrode D2.

As described above, the midpoint potential portion S having a midpoint potential with respect to the potential of the first drain electrode D1 and the potential of the second drain electrode D2 and the control electrode G connected to the midpoint potential portion S to control the midpoint potential portion S are arranged at positions capable of maintaining a predetermined withstand voltage with respect to the first drain electrode D1 and the second drain electrode D2. Accordingly, for example, in a case where the first drain electrode D1 is on the high potential side and the second drain electrode D2 is on the low potential side, when the main switch element 11c is turned off, i.e., when a signal of 0 V is applied to the control electrode G, the current is surely interrupted between at least the first drain electrode D1, the control electrode G and the midpoint potential portion S (the current is inhibited immediately below the control electrode (gate) G). Meanwhile, when the main switch element 11c is turned on, i.e., when a signal having a voltage equal to or greater than a predetermined threshold is applied to the control electrode G, as represented by arrows in FIG. 16, the current flows in a path of the first drain electrode D1 (electrodes 111, 112, 113 . . . ), the midpoint potential portion S, and the second drain electrode D2 (electrodes 121, 122, 123 . . . ). The same can be applied to the reverse case.

As described above, by forming the midpoint potential portion S at a position capable of maintaining a predetermined withstand voltage with respect to the first drain electrode D1 and the second drain electrode D2, although a threshold voltage of a signal applied to the control electrode G is reduced to the lowest level, the switch element 11c can be surely turned on/off, and it is possible to achieve a low temperature resistance. Further, by configuring the main switching unit 11 using the switch element 11c, the ground (GND) of the control signal is set to have the same potential as the midpoint potential portion S. Accordingly, the commercial AC power source having a high voltage can be directly controlled by the control unit 13 which is driven by a control signal of several voltages. Further, since it is not affected by the voltage drop due to the diode of the rectifying unit 12, although a threshold voltage for converting the conducting state (closed state)/non-conducting state (open state) of the main switching unit 11 is low, it is possible to surely maintain the non-conducting state (open state). Further, in the lateral transistor element using, as a channel layer, a two-dimensional electron gas layer generated at a hetero, there is a trade-off relationship between the high potential of the threshold voltage for putting the element in a non-conducting state and the on resistance in a conducting state. Accordingly, the on resistance can be maintained at a low level by reducing the threshold voltage, thereby achieving the small size and high capacity of the load control device 1C.

(Fourth Embodiment)

Figure 18:
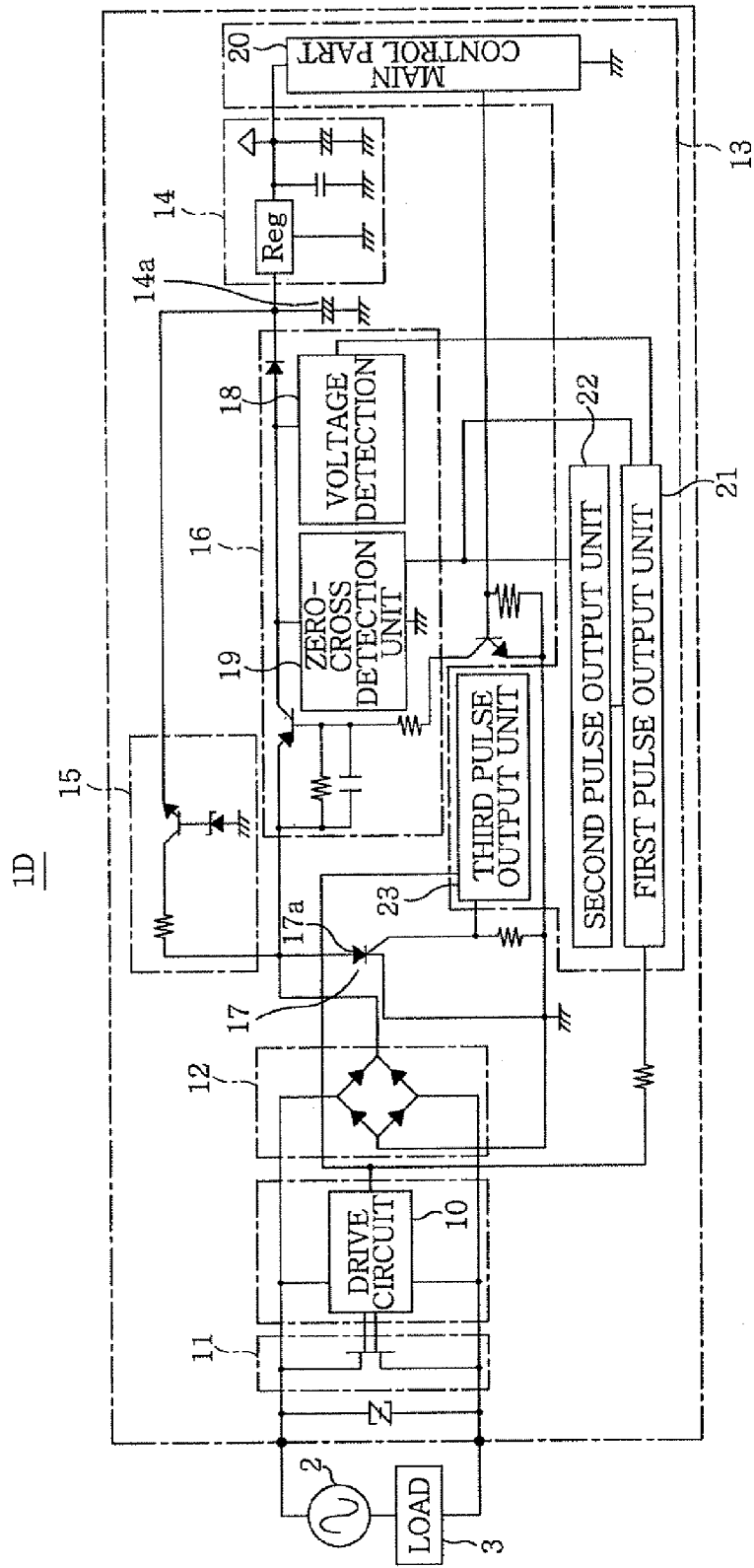
FIG. 18 is a circuit diagram showing a configuration of a load control device in accordance with a fourth embodiment of the present invention.
Figure 19:
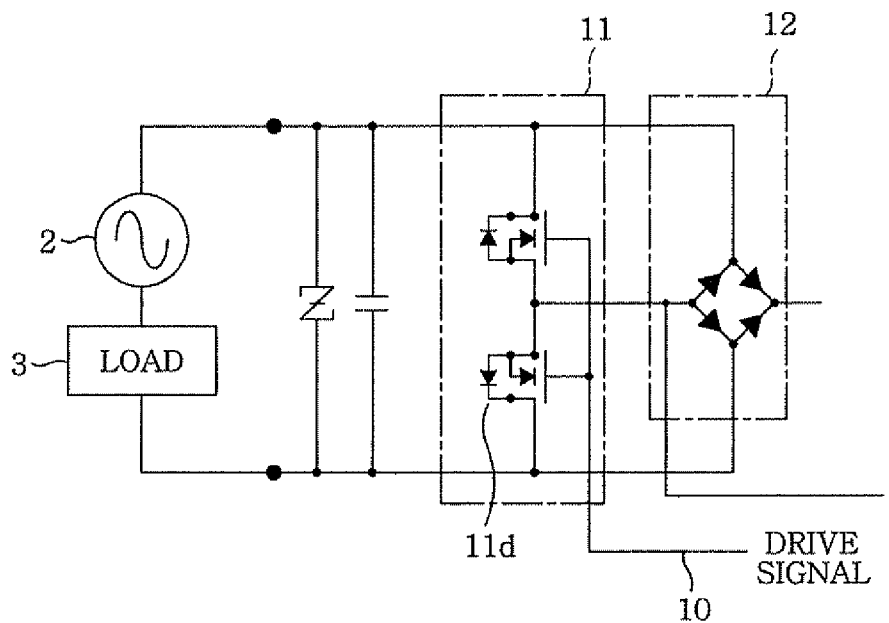
FIG. 19 is a circuit diagram showing a configuration example of a main switching unit applied to the load control device in accordance with the fourth embodiment.
Figure 20:
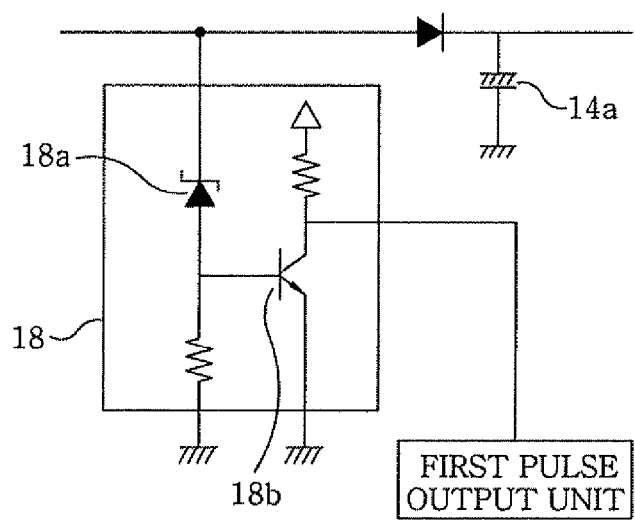
FIG. 20 is a circuit diagram showing a configuration example of a voltage detection unit applied to the load control device in accordance with the fourth embodiment.
Figure 21:
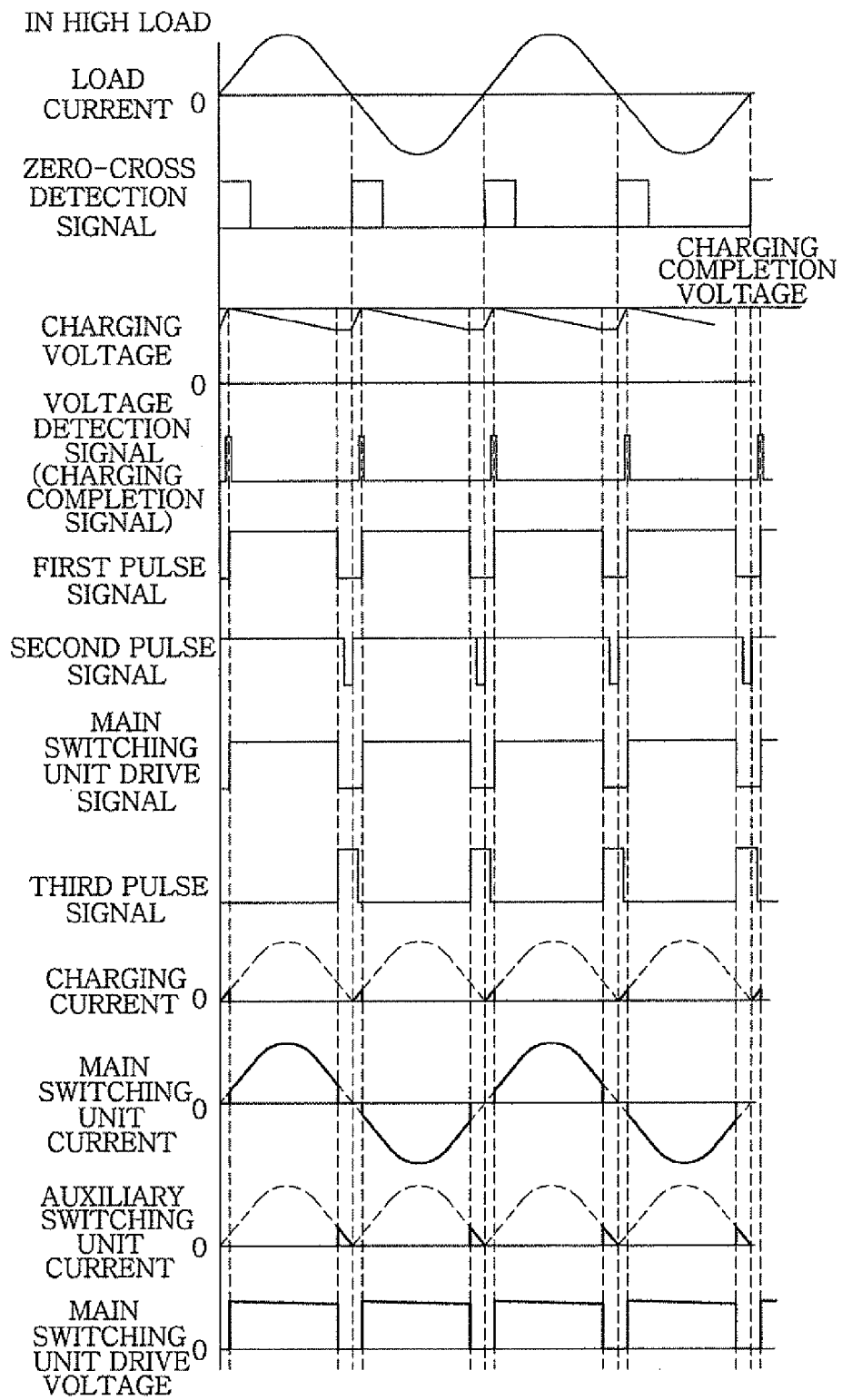
FIG. 21 is a time chart showing, in a high load, waveforms of signals in respective parts of the load control device in accordance with the fourth embodiment.
Figure 23:
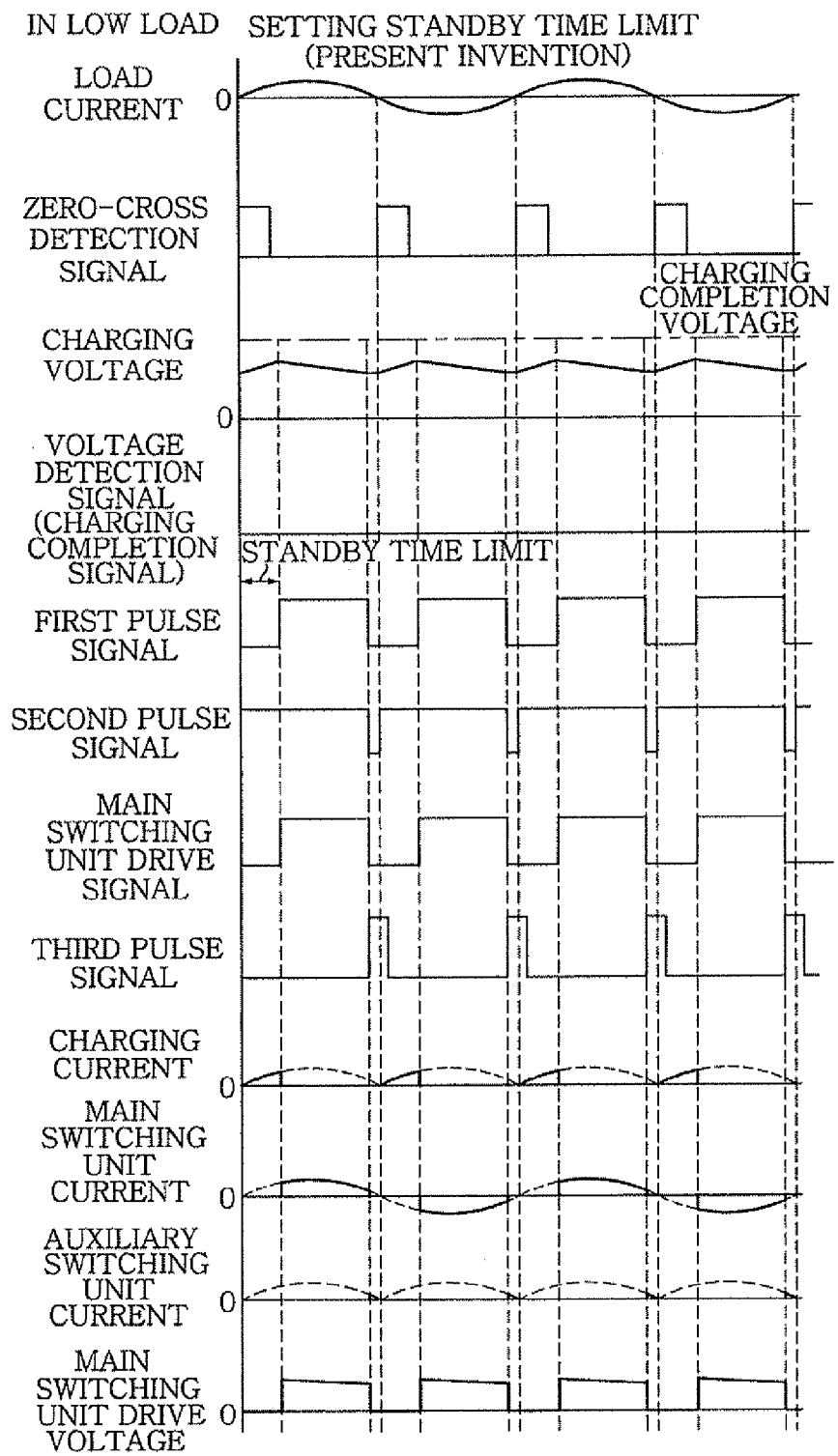
FIG. 23 is a time chart showing, in a low load, waveforms of signals in respective parts of the load control device in accordance with the fourth embodiment, in case of controlling the main switching unit by setting a standby time limit in a first pulse signal.

A load control device in accordance with a fourth embodiment of the present invention will be described. FIG. 18 is a circuit diagram showing a configuration of a load control device 10 in accordance with the fourth embodiment of the present invention. FIG. 19 is a circuit diagram showing a configuration example of the main switching unit 11 applied to the load control device 1D. FIG. 20 is a circuit diagram showing a configuration example of the voltage detection unit 18 applied to the load control device 1D. FIGS. 21 and 23 are time charts showing waveforms of signals in respective parts of the load control device 1D.

The load control device 1D of the fourth embodiment shown in FIG. 18 connected in series between the AC power source 2 and the load 3 includes a main switching unit 11 to control the supply of power to a drive circuit 10 and the load 3, a rectifying unit 12, and a control unit 13 controlling the entire load control device 10. The load control device 1D further includes a first power supply unit 14 which supplies a stable power to the control unit 13, a second power supply unit 15 which supplies power to the first power supply unit 14 when no power is supplied to the load 3, and a third power supply unit 16 which supplies power to the first power supply unit 14 when power is supplied to the load 3. Also, the load control device 1D includes an auxiliary switching unit 17 which allows a micro-current in the load current to flow therethrough, and the like. The drive circuit 10 drives the main switching unit 11 in response to a pulse signal outputted from the control unit 13. Further, the third power supply unit 16 includes a voltage detection unit 18 which detects a voltage inputted to the third power supply unit 16, and a zero-cross detection unit 19 which detects a zero-cross point of the load current. The main switching unit 11 has a main switch element 11d (see FIG. 19) having a single gate transistor structure, and the auxiliary switching unit 17 has an auxiliary switch element 17a having a thyristor structure. Further, the control unit 13 includes a main control part 20 including a CPU and the like, a first pulse output unit 21, a second pulse output unit 22 and a third pulse output unit 23.

After receiving a charging completion signal of a buffer capacitor 14a from the voltage detection unit 18, the first pulse output unit 21 outputs a first pulse to put the main switching unit 11 in a conducting state only for a first predetermined period. That is, the first pulse rises when receiving the charging completion signal from the voltage detection unit 18, and drops after the first predetermined period. Further, in a low load, the first pulse output unit 21 makes the first pulse drop when receiving a second pulse inputted from the second pulse output unit 22 even before the first predetermined period has elapsed.

The second pulse output unit 22 outputs the second pulse such that the close state of the main switching unit 11 is limited to last for a second predetermined period after the zero-cross detection unit 19 has detected a zero-cross point of the power supply current. That is, the second pulse rises when receiving a zero-cross detection signal from the zero-cross detection unit 19, and drops after the second predetermined period. The third pulse output unit 23 outputs a third pulse signal from a predetermined period to put the auxiliary switching unit 17 in a conducting state only for a third predetermined period after detecting a non-conducting state (open state) of the main switching unit 11. That is, the third pulse rises after detecting the non-conducting state (open state) of the main switching unit 11, and drops after the third predetermined period.

Even in an OFF state of the load control device 1D in which no power is supplied to the load 3, a current flows in the second power supply unit 15 from the power source 2 through the rectifying unit 12. Accordingly, although a micro-current flows in the load 3, the current is suppressed to a low level to avoid a malfunction in the load 3. Accordingly, the impedance of the second power supply unit 15 is maintained at a high level.

When power is supplied to the load 3, the impedance of the third power supply unit 16 is reduced such that a current is made to flow in the inner circuit of the load control device 1D and the buffer capacitor 14a is charged. As described above, the voltage detection unit (charging monitoring unit) 18 is provided in the third power supply unit 16 to detect a voltage inputted to the third power supply unit 16, i.e., a charging voltage of the buffer capacitor 14a.

As illustrated in FIG. 20, the voltage detection unit 18 includes a Zener diode 18a, a transistor 18b and the like. When the voltage inputted to the third power supply unit 16 exceeds the Zener voltage of the Zener diode 18a, the transistor 18b is put in a conducting state such that a detection signal indicating this status is inputted to the control unit 13 (first pulse output unit 21). When receiving the detection signal from the voltage detection unit 18, the control unit 13 puts the main switching unit 11 in a conducting state (closed state) for a first predetermined period. In FIGS. 18 and 20, the first pulse output unit 21 is configured by hardware with a dedicated IC and the like and is provided as a part of the control unit 13 to directly output the first pulse signal in response to the detection signal from the voltage detection unit 18. However, it is not limited thereto, and it may be configured such that the output of the voltage detection unit 18 is inputted to the main control part 20 including a CPU and the like, and the first pulse signal is outputted by software. It is preferable that the first predetermined period for putting the main switching unit 11 in a conducting state is set to be a time period slightly shorter than half cycle of the commercial frequency power source.

Next, when an operation of putting the main switching unit 11 in a non-conducting state (open state) is started after the first predetermined period has elapsed, the control unit 13 puts the auxiliary switching unit 17 in a conducting state (closed state) only for a third predetermined period (e.g., several hundred μ seconds). This operation may be performed such that the auxiliary switching unit 17 is put in a non-conducting state slightly later than the main switching unit 11. Alternatively, a pulse signal having a period longer by only the third predetermined period than that of the first pulse signal outputted from the main control part 20 to the main switching unit 11 may be outputted to the auxiliary switching unit 17. Alternatively, a delay circuit may be configured by using a diode or capacitor.

By these operations, after the charging of the buffer capacitor 14a is completed, power is supplied from the main switching unit 11 to the load 3 for most of half cycle of the commercial AC current. Then, after the conducting current is reduced, power is supplied from the auxiliary switching unit 17 to the load 3. Further, since the auxiliary switching unit 17 has the auxiliary switch element 17a having a thyristor structure, the auxiliary switching unit 17 is put in a non-conducting state (open state) when the current value becomes zero (zero-cross point). When the auxiliary switching unit 17 is put in a non-conducting state (open state), since the current flows through the third power supply unit 16 again, the above operations are repeated every half cycle of the commercial AC power source.

In a case where a low load such as a miniature bulb is connected to the load 3, the charging rate of the buffer capacitor 14a is reduced and the charging is not completed during half cycle of the power supply current. Accordingly, a switching operation of the main switching unit 11 performed every half cycle may not be stabilized. Accordingly, in the present invention, a standby time limit is set to output a charging completion signal from the voltage detection unit 18 when the first pulse output unit 21 makes the first pulse rise. That is, the first pulse output unit 21 makes the first pulse rise after a predetermined standby time limit has elapsed after receiving a zero-cross detection signal from the zero-cross detection unit 19.

Figure 22:
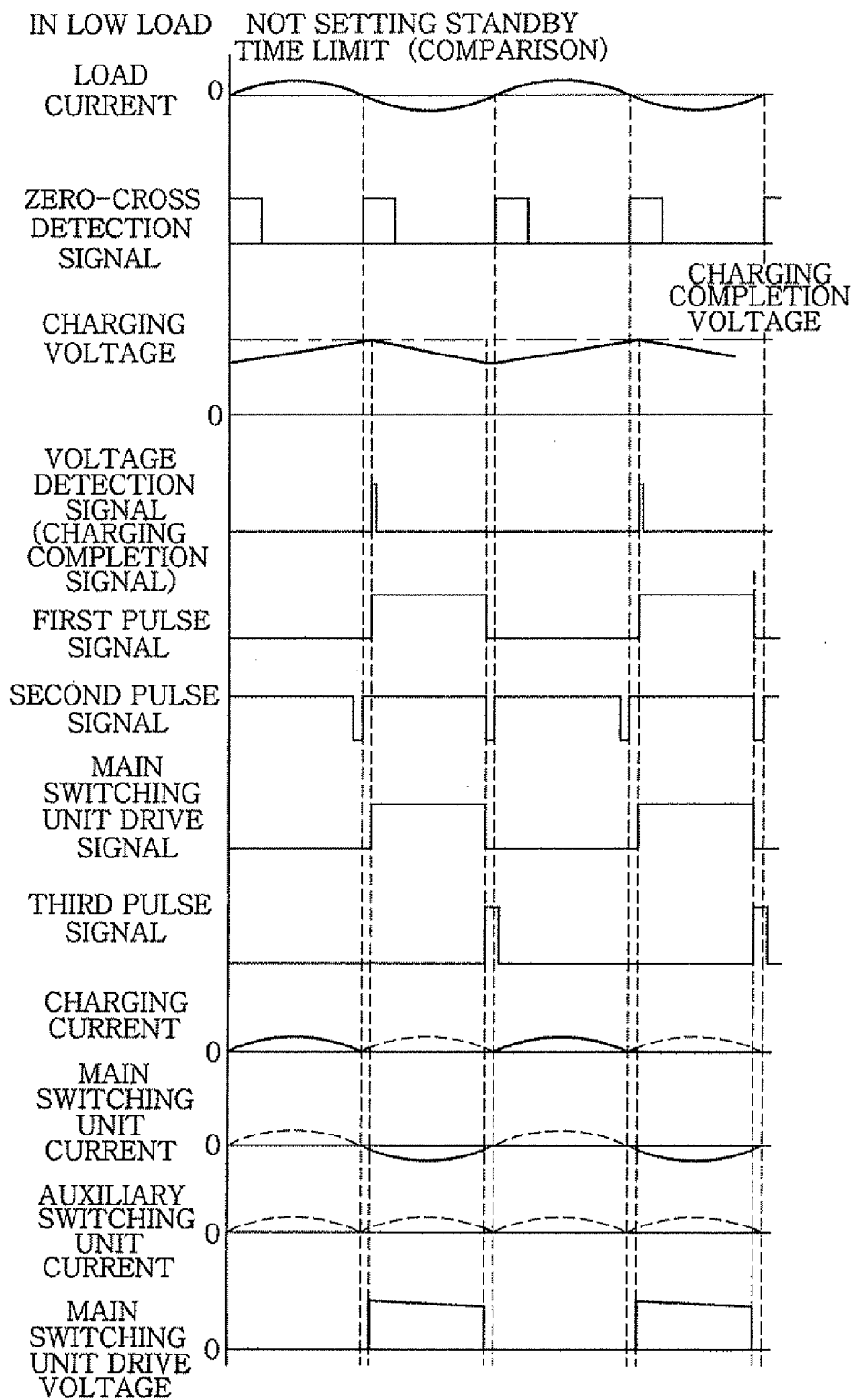
FIG. 22 is a time chart showing, in a low load, waveforms of signals in respective parts of the load control device in accordance with the fourth embodiment, in case of controlling the main switching unit without setting a standby time limit in a first pulse signal.

FIG. 21 illustrates signal waveforms in respective parts of the load control device 10 in a high load. FIGS. 22 and 23 illustrate signal waveforms in respective parts of the load control device 10 in a low load. Further, FIG. 22 illustrates a case (comparison example) where the main switching unit 11 is controlled while a standby time limit is not set for the first pulse signal. FIG. 23 illustrates a case (present embodiment) where the main switching unit 11 is controlled while a standby time limit is set for the first pulse signal.

In a high load, i.e., when the connected load 3 has a high capacity, as shown in FIG. 21, the buffer capacitor 14a is charged for a short period. After the charging is completed, power is supplied from the main switching unit 11 to the load 3 for most of half cycle of the commercial AC power source. In this case, since the first predetermined period is set to put the main switching unit 11 in a non-conducting state before a time point (zero-cross point) when the current value becomes zero, the main switching unit 11 is not put in a conducting state beyond the zero-cross point.

However, in a low load, i.e., when the connected load 3 has a low capacity, since the load current is small, a lot of time is required for charging. Accordingly, as shown in FIG. 22, the time from when the zero-cross detection unit 19 detects the zero-cross until the voltage detection unit 18 detects completion of the charging becomes long, and the rise of the first pulse is delayed. Although the charging of the buffer capacitor 14a is completed in a short period of time after half cycle has elapsed after the zero-cross detection unit 19 detects the zero-cross in FIG. 22, the time longer than one cycle may be required for completion of charging the buffer capacitor 14a. As described above, when the rise of the first pulse is delayed, the start of conduction of the main switching unit 11 is delayed. Accordingly, the switching operation performed every half cycle is not stabilized, and the lighting fluctuation occurs in a miniature bulb connected as a load.

Accordingly, in the present invention, the standby time limit is set to output a charging completion signal from the voltage detection unit 18 when the first pulse output unit 21 makes the first pulse rise. Specifically, the first pulse output unit 21 makes the first pulse rise after a predetermined standby time limit has elapsed after receiving a zero-cross detection signal from the zero-cross detection unit 19 as shown in FIG. 23. Further, the first pulse output unit 21 receives the drop of the second pulse outputted from the second pulse output unit 22 even before the first predetermined period has elapsed, and makes the first pulse drop. The first pulse signal outputted from the first pulse output unit 21 is, as a main switching unit drive signal, inputted to the drive circuit 10 to drive the main switching unit 11.

Then, the third pulse output unit 23 having received the first pulse signal outputs a third pulse signal for putting the auxiliary switching unit 17 in a conducting state only for a third predetermined period to the auxiliary switching unit 17 when the main switching unit 11 is put in a non-conducting state, and supplies power from the auxiliary switching unit 17 to the load 3.

Further, in case of applying the voltage detection unit 18 having the configuration shown in FIG. 20, a voltage detection signal is not detected at the voltage detection unit 18 during a time period until ½ cycle after ¼ of the power source cycle at which the current from the alternating current power source is at a maximum level. Accordingly, in order to suppress the delay of the start of conduction of the main switching unit and stabilize the operation, it is preferable to set the standby time limit to be equal to or smaller than ¼ of the power source cycle.

In the load control device 1D in accordance with the fourth embodiment of the present invention, when the voltage detection unit 18 detects that the voltage inputted to the third power supply unit 16 reaches a predetermined threshold, the control unit 13 puts the main switching unit 11 in a conducting state (closed state) for a first predetermined period, and therefore, power is supplied from the main switching unit 11 to the load for most of the half cycle of the alternating current power source. Further, since there is a limitation on the standby time for the start of conduction of the main switching unit 11, for example, if it is overly delayed for the voltage inputted to the third power supply unit 16 in a low load to reach a predetermined threshold, the main switching unit 11 is put in a conducting state after the standby time limit. Accordingly, it is possible to stably perform the switching operation of the main switching unit 11 every half cycle, and prevent the lighting fluctuation from occurring in a low load such as miniature bulb lighting. Further, since the main switch element 11d having a transistor structure used in the main switching unit 11 is in an active state in a low load, the main switch element 11d has a resistance. However, in the low load, since the current flowing in the main switch element 11d becomes small, there is no excessive heating.

Further, when the main switching unit 11 is in a non-conducting state after the first predetermined period, the auxiliary switching unit 17 is put in a conducting state only for a third predetermined period such that power is supplied to the load 3 from the auxiliary switching unit 17. Since these operations are performed with respect to the load current, although the main switching unit 11 includes the main switch element 11d having a transistor structure, it is possible to achieve a two-wire load control device which is applicable to any one of a fluorescent lamp, incandescent lamp and the like without being limited to those having a power factor of 1. Further, it is possible to suppress the noise generated in the operation of the load control device to a low level, thereby achieving a load control device having a small size and wide applicable load range.

(Fifth Embodiment)

Figure 24:
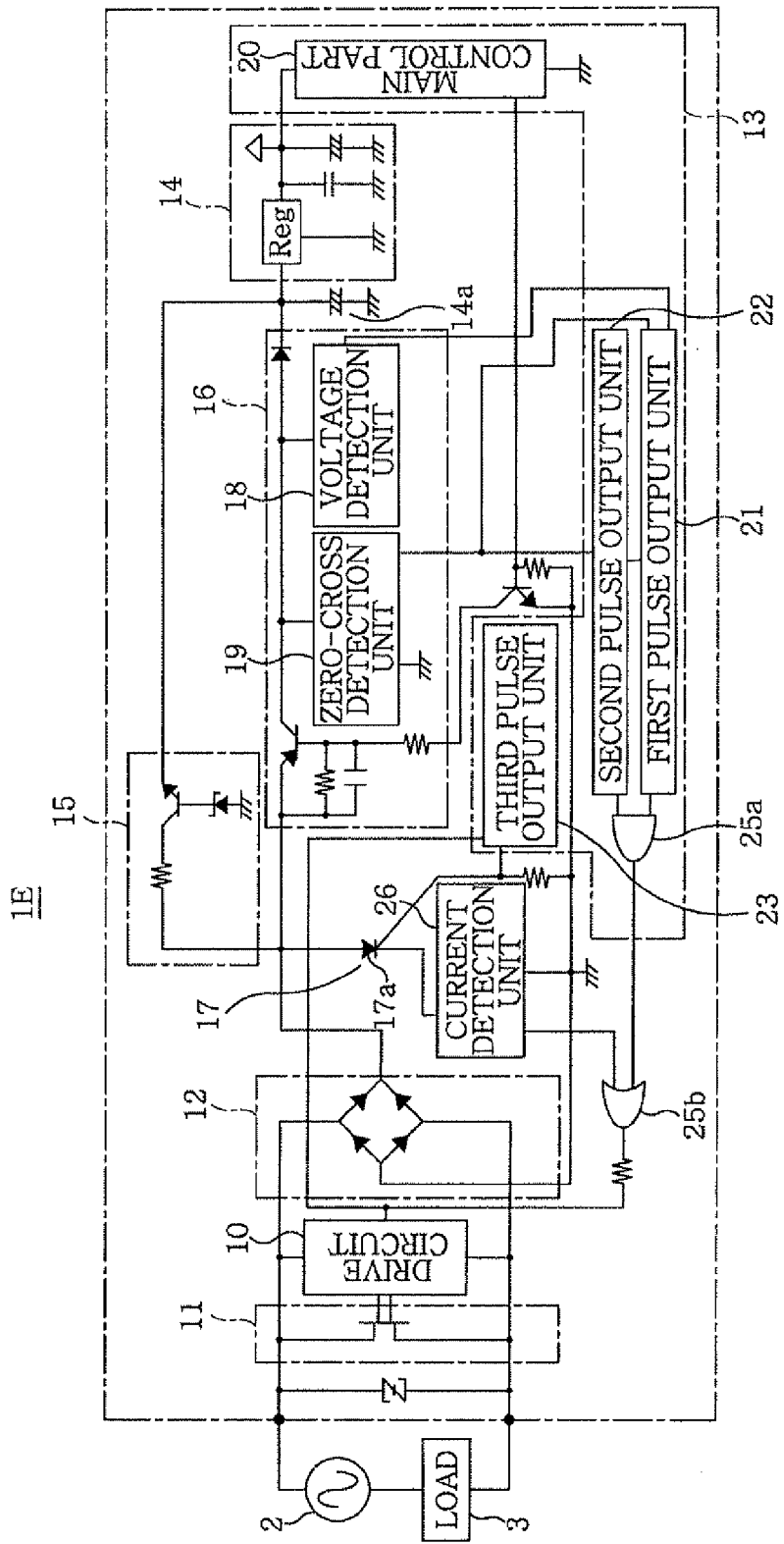
FIG. 24 is a circuit diagram showing a configuration of a load control device in accordance with a fifth embodiment of the present invention.

A load control device in accordance with a fifth embodiment of the present invention will be described. FIG. 24 is a circuit diagram showing a configuration of a load control device 1E in accordance with the fifth embodiment of the present invention. The load control device 1E is different from the load control device 1D in accordance with the fourth embodiment in that the load control device 1E further includes a current detection unit 26, and an OR circuit 25b, and the other configuration of the load control device 1E is substantially the same as that of the load control device 1D. An AND circuit 25a is operated by a first pulse signal outputted from a first pulse output unit 21 and a second pulse signal outputted from a second pulse output unit 22. The current detection unit 26 detects the current flowing into an auxiliary switching unit 17. The OR circuit 25b is operated based on a signal outputted from the current detection unit 26 and a signal outputted from the AND circuit 25a.

The first pulse outputted from the first pulse output unit 21 and the second pulse outputted from the second pulse output unit 22 are inputted to the AND circuit 25a. The AND circuit 25a calculates a logical product of the first pulse and the second pulse and outputs the logical product to the OR circuit 25b.

The auxiliary switching unit 17 is originally intended to detect the zero-cross point of the current, not primarily intended to provide electrical conduction, and is expected to include a small-sized switch element. However, when the frequency is deviated in the commercial AC power source, or when the load control device is to be operated at both frequencies of 50 Hz and 60 Hz, the time until the zero-cross point of the current after the main switching unit is put in a non-conducting state becomes long. Accordingly, the electrical conduction in the auxiliary switching unit 17 is started before the load current becomes sufficiently small. Further, in a case where an overload is connected as the load, although the electrical conduction time of the auxiliary switching unit 17 remains same, the electrical conduction loss increases. Accordingly, the switch element forming the auxiliary switching unit 17 may be broken. Accordingly, in the fifth embodiment, the current flowing in the auxiliary switching unit 17 is detected by the current detection unit 26, and when the current exceeding an allowable value flows in the auxiliary switching unit 17, a main switching unit 11 is put in a conducting state (closed state) again only for a short period (fourth predetermined period). Then, when the main switching unit 11 is put in a non-conducting state (open state), the auxiliary switching unit 17 is put in a conducting state again.

Specifically, when the current detection unit 26 detects that a current exceeding the allowable value flows in the auxiliary switching unit 17, it outputs a signal indicating such status to the OR circuit 25b. When the OR circuit 25b receives a signal outputted from the AND circuit 25a or a signal outputted from the current detection unit 26, the OR circuit 25b puts the main switching unit 11 in a conducting state only for a short period to protect the auxiliary switching unit 17. As described above, by repeatedly converting the main switching unit 11 and the auxiliary switching unit 17, it is possible to prevent any breakage in the switch element of the auxiliary switching unit 17 and also to improve responsiveness with respect to the type of the commercial AC power source or responsiveness with respect to the overload.

In the load control device 1E of the fifth embodiment, when the current detection unit 26 detects that the current exceeding the allowable value flows in the auxiliary switching unit 17, the main switching unit is put in a conducting state (closed state) and then put in a non-conducting state. Accordingly, it is possible to prevent the switch element of the auxiliary switching unit 17 from being broken, and to form the auxiliary switching unit 17 using a small switch element. Thus, it is possible to achieve miniaturization of the load control device, thereby improving responsiveness with respect to the type of the commercial AC power source or responsiveness with respect to the overload.

(Sixth Embodiment)

Figure 25:
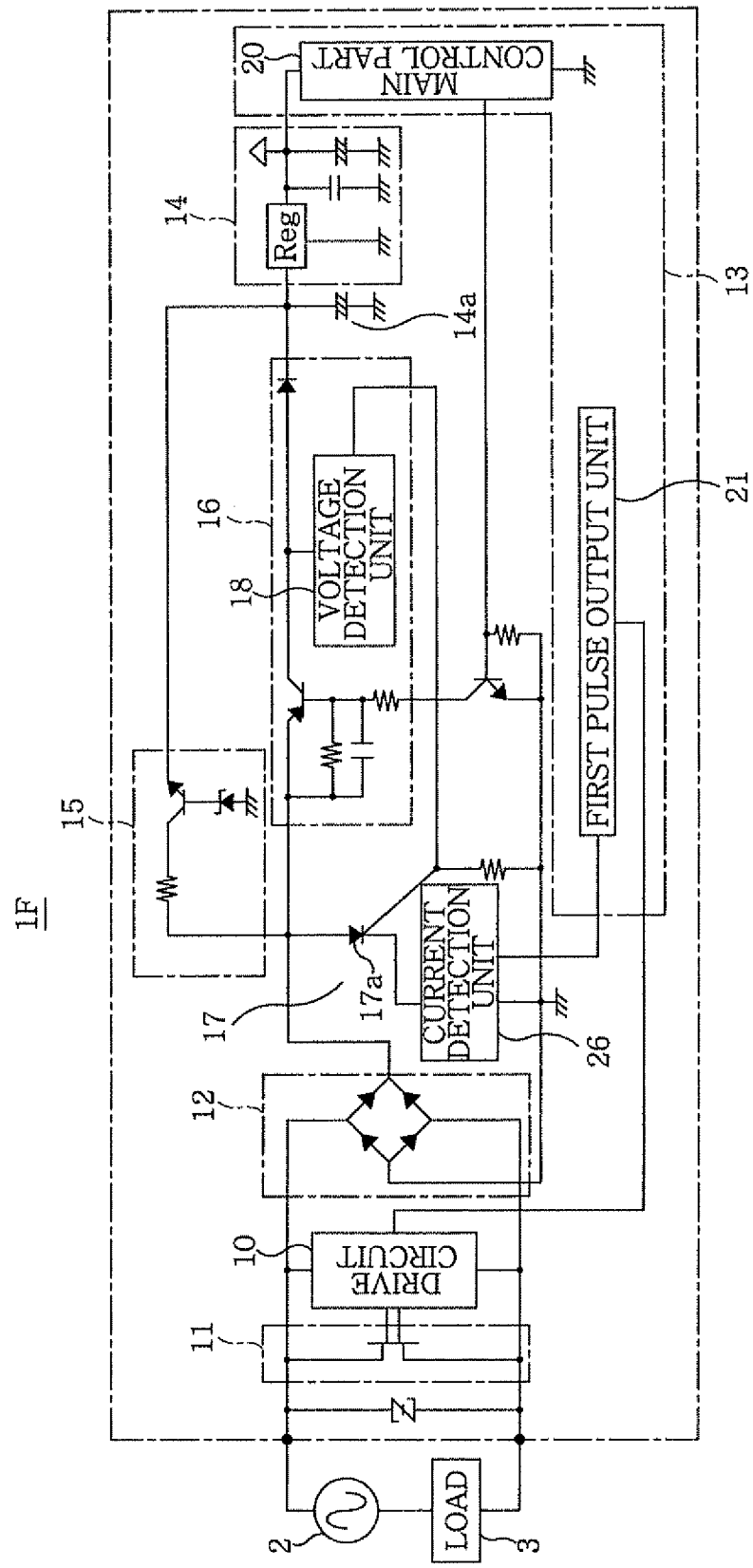
FIG. 25 is a circuit diagram showing a configuration of a load control device in accordance with a sixth embodiment of the present invention.
Figure 26:
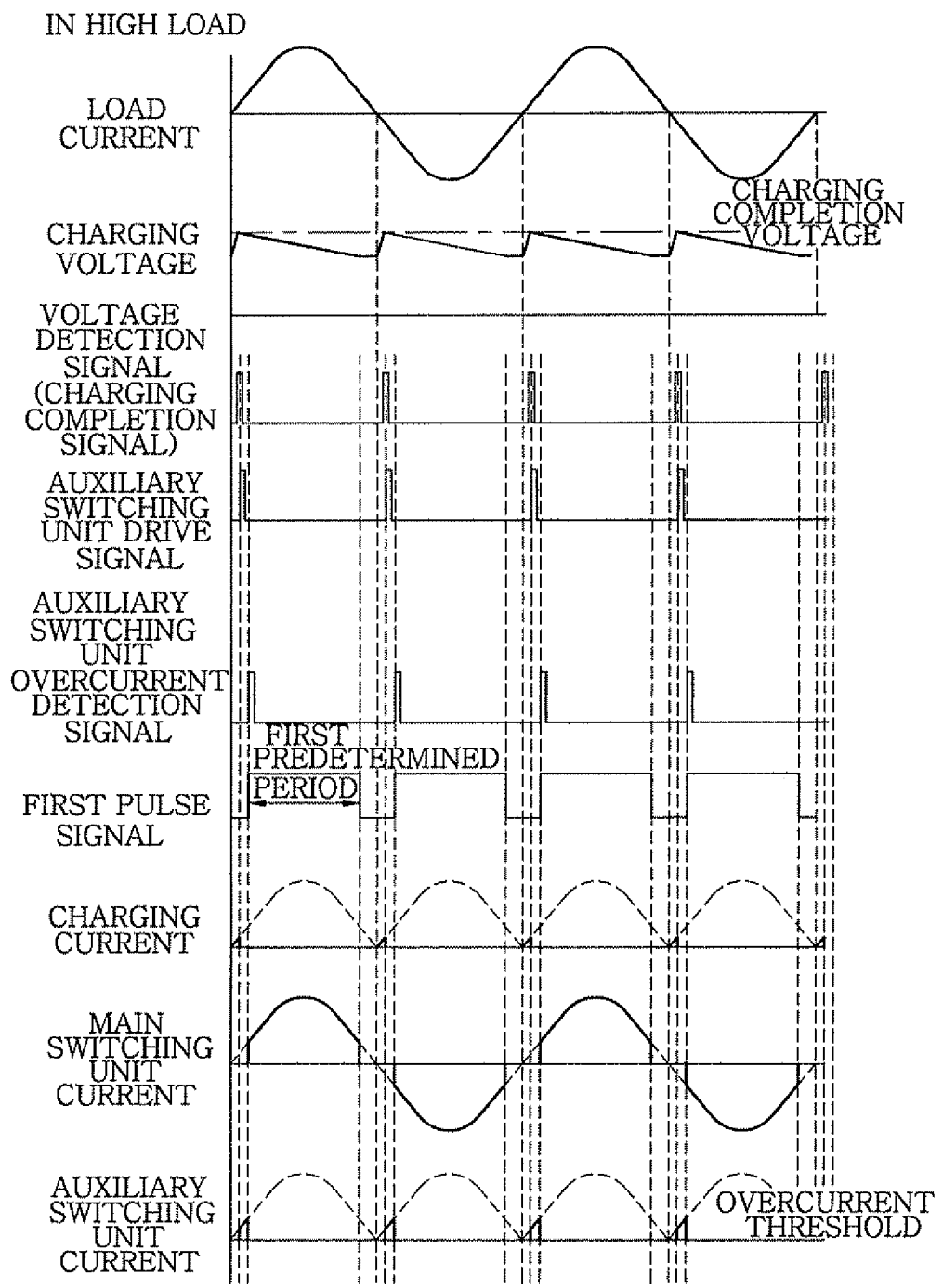
FIG. 26 is a time chart showing, in a high load, waveforms of signals in respective parts of the load control device in accordance with the sixth embodiment.
Figure 27:
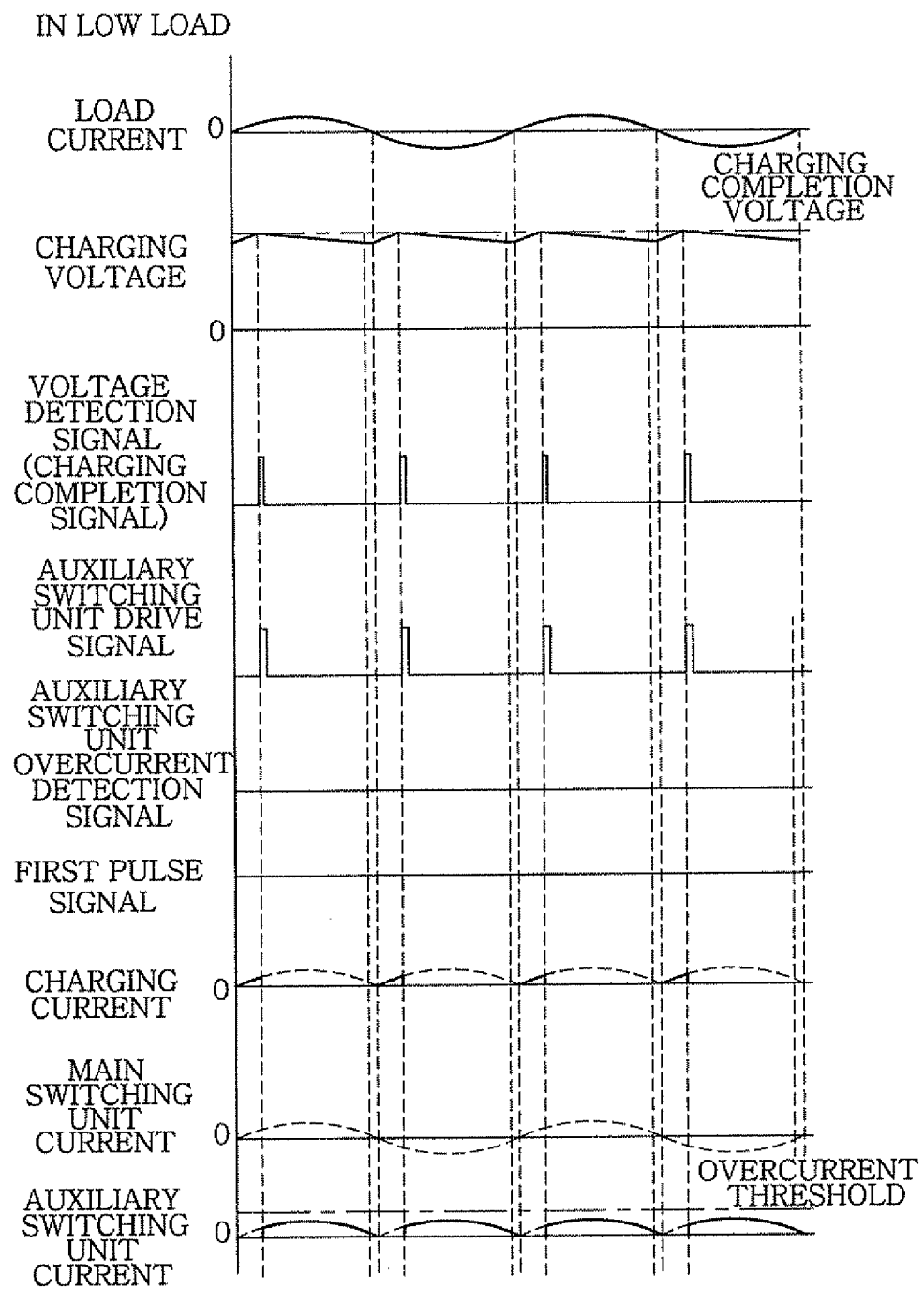
FIG. 27 is a time chart showing, in a low load, waveforms of signals in respective parts of the load control device in accordance with the sixth embodiment.

A load control device in accordance with a sixth embodiment of the present invention will be described. FIG. 25 is a circuit diagram showing a configuration of a load control device 1F in accordance with the sixth embodiment of the present invention. Further, FIGS. 26 and 27 are time charts showing waveforms of signals in respective parts of the load control device 1F.

The load control device 1F of the sixth embodiment shown in FIG. 25 connected in series between the AC power source 2 and the load 3 includes a main switching unit 11 to control the supply of power to a drive circuit 10 and the load 3, a rectifying unit 12, and a control unit 13 controlling the entire load control device 1F. The load control device 1F further includes a first power supply unit 14 which supplies a stable power to the control unit 13, a second power supply unit 15 which supplies power to the first power supply unit 14 when no power is supplied to the load 3, and a third power supply unit 16 which supplies power to the first power supply unit 14 when power is supplied to the load 3. Also, the load control device 1F includes an auxiliary switching unit 17 which allows a micro-current in the load current to flow therethrough, and the like. The drive circuit 10 drives the main switching unit 11 in response to a pulse signal outputted from the control unit 13. Further, the third power supply unit 16 includes a voltage detection unit 18 which detects a voltage inputted to the third power supply unit 16. The main switching unit 11 has a main switch element 11d (see FIG. 19) having a single gate transistor structure, and the auxiliary switching unit 17 has an auxiliary switch element 17a having a thyristor structure. The voltage detection unit 18 includes a Zener diode, transistor and the like. When a voltage inputted to the third power supply unit 16 exceeds a Zener voltage of the Zener diode, the transistor is put in a conducting state such that a detection signal indicating such status is inputted to the auxiliary switching unit 17. Further, the control unit 13 includes a main control part 20 including a CPU and the like, and a first pulse output unit 21. In FIG. 25, the first pulse output unit 21 is configured by hardware with a dedicated IC and the like. However, it is not limited thereto, and it may be configured such that each pulse signal is outputted by software from the main control part 20. [0050] (Invention 3)

Even in an OFF state of the load control device 1F in which no power is supplied to the load 3, a current flows in the second power supply unit 15 from the power source 2 through the rectifying unit 12. Accordingly, although a micro-current flows in the load 3, the current is suppressed to a low level to avoid a malfunction in the load 3. Accordingly, the impedance of the second power supply unit 15 is maintained at a high level.

When power is supplied to the load 3, the impedance of the third power supply unit 16 is reduced and a current is made to flow in the inner circuit of the load control device 1F such that a buffer capacitor 14a is charged. As described above, the voltage detection unit (charging monitoring unit) 18 is provided in the third power supply unit 16 to detect a voltage inputted to the third power supply unit 16, i.e., a charging voltage of the buffer capacitor 14a.

As illustrated in FIG. 26, in a case where a high capacity load is connected as the load 3, since the current flowing in the third power supply unit 16 becomes larger, the buffer capacitor 14a is charged for a short period. Further, if the voltage detection unit 18 detects that a voltage inputted to the third power supply unit 16 (i.e., terminal voltage of the buffer capacitor 14a) reaches a predetermined threshold, a voltage detection signal is inputted to the auxiliary switch element 17a of the auxiliary switching unit 17 to put the auxiliary switching unit 17 in a conducting state. The current flowing in the auxiliary switching unit 17 is detected by a current detection unit 26. If the current detection unit 26 detects that the current flowing in the auxiliary switching unit 17 reaches a predetermined overcurrent threshold, the current detection unit 26 outputs an overcurrent detection signal to the first pulse output unit 21.

The auxiliary switching unit 17 is originally intended to detect the zero-cross point of the current to thereby surely cause the load current to become zero every half cycle of the alternating current, but not primarily intended to provide electrical conduction, and may be expected to include a small-sized switch element. Accordingly, if the current flowing in the auxiliary switching unit 17 becomes excessive, the switch element forming the auxiliary switching unit 17 may be broken. Accordingly, in the present invention, the current flowing in the auxiliary switching unit 17 is detected by the current detection unit 26, and when the high capacity load 3 is connected and the current exceeding an allowable value flows in the auxiliary switching unit 17, the conduction is converted from the auxiliary switching unit 17 to the main switching unit 11 to supply power to the load 3, thereby protecting the auxiliary switching unit 17 from the overcurrent.

That is, the first pulse output unit 21 having received the overcurrent detection signal immediately outputs the first pulse signal for putting the main switching unit 11 in a conducting state to the gate terminal of the main switch element 11d of the main switching unit 11. After receiving the overcurrent detection signal, the first pulse signal is outputted in a first predetermined period to drive the main switching unit 11. As described above, the main switching unit 11 is put in a conducting state and the auxiliary switching unit 17 is put in a non-conducting state to thereby protect the auxiliary switching unit 17 from the overcurrent. Further, power is supplied from the main switching unit 11 to the load 3 in the first predetermined period, which is most of the half cycle of the commercial AC power source. In this case, since the first predetermined period is set to put the main switching unit 11 in a non-conducting state before a time point (zero-cross point) when the current value becomes zero, the main switching unit 11 is not put in a conducting state beyond the zero-cross point.

Meanwhile, in a case where a low capacity load is connected as the load 3 as shown in FIG. 27, since the current flowing in the auxiliary switching unit 17 does not reach a predetermined overcurrent threshold, the main switching unit 11 with large power consumption is not put in a conducting state and the electrical conduction is continuously performed by the auxiliary switching unit 17. Further, the auxiliary switching unit 17 is put in a non-conducting state at the next zero-cross point, and the current flows into the third power supply unit 16 again. Accordingly, the above operation is repeated every half cycle of the commercial AC power source.

Figure 28:
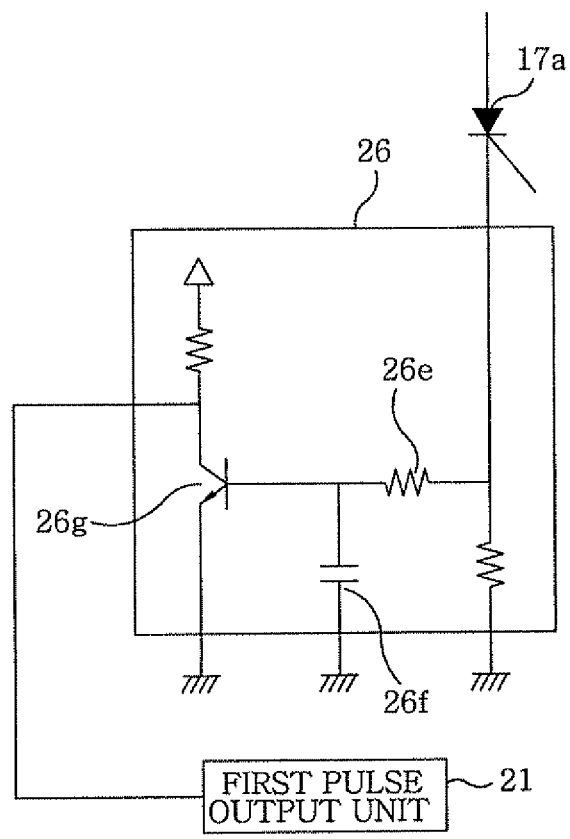
FIG. 28 illustrates a configuration example of the current detection unit applied to the load control device in accordance with the sixth embodiment.

FIG. 28 illustrates a configuration example of the current detection unit 26 applied to the load control device 1F in accordance with the sixth embodiment. In a case where, e.g., a low capacity inverter is connected as the load 3, the current passing through the current detection unit 26 is small, but a peak value is large. In this case, if the current detection unit 26 is configured to simply detect the current value, conversion from the auxiliary switching unit 17 to the main switching unit 11 is frequently carried out, and therefore, the power consumption may not be effectively reduced. Accordingly, in this embodiment, as shown in FIG. 28, the current detection unit 26 is configured to include a resistor 26e, an RC integrating circuit having a capacitor 26f, a transistor 26g and the like. The waveform of the current passing through the auxiliary switching unit 17 is attenuated to detect the energy of the passing current.

In the load control device 1F in accordance with the sixth embodiment of the present invention, in a high load, if the voltage inputted to the third power supply unit 16 reaches a predetermined threshold, first, the control unit 13 puts the auxiliary switching unit 17 in a conducting state (closed state). Then, if the current flowing in the auxiliary switching unit 17 reaches a predetermined overcurrent threshold, the control unit 13 puts the main switching unit 11 in a conducting state. Accordingly, power can be supplied from the main switching unit 11 to the load for most of the half cycle of the alternating current power source. Meanwhile, in a low load, since the current flowing in the auxiliary switching unit 17 does not reach a predetermined overcurrent threshold, the main switching unit 11 with large power consumption is not put in a conducting state and the electrical conduction is performed by the auxiliary switching unit 17. Thus, in case of applying, e.g., an illumination apparatus as the load 3, it is possible to reduce the power consumed in the load control device when a miniature bulb is turned on.

Further, in case of applying the circuit shown in FIG. 28 as the current detection unit 26, the energy of the current passing through the current detection unit 26 can be detected by the RC integrating circuit. Accordingly, even in a case where, e.g., a low capacity inverter is connected as the load 3, wherein the current passing through the auxiliary switching unit 17 is small, but a peak value is large, it is possible to suppress frequent conduction conversion to the main switching unit 11, thereby further reducing the power consumption.

(Seventh Embodiment)

Figure 29:
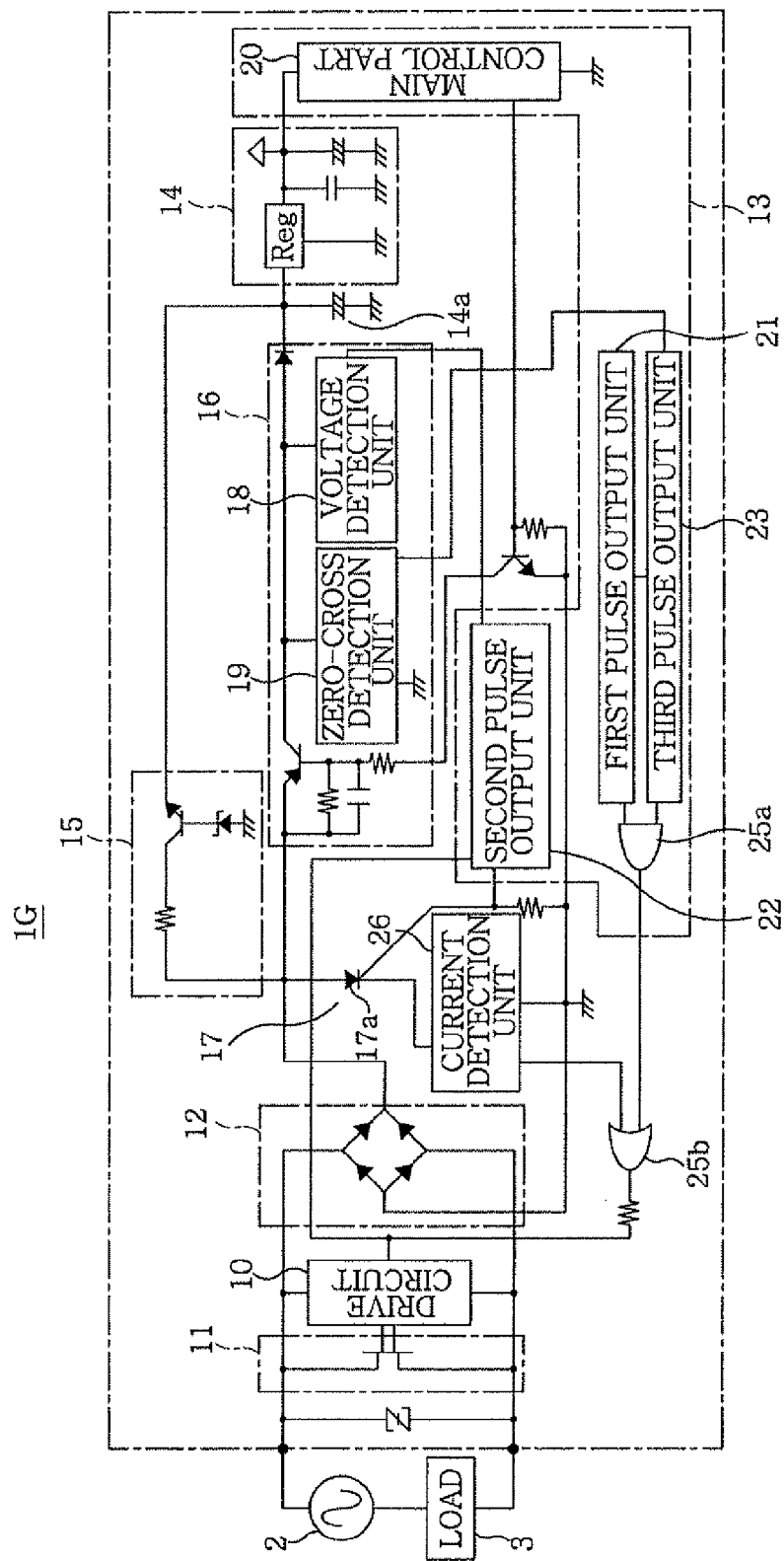
FIG. 29 is a circuit diagram showing a configuration of a load control device in accordance with a seventh embodiment of the present invention.
Figure 30:
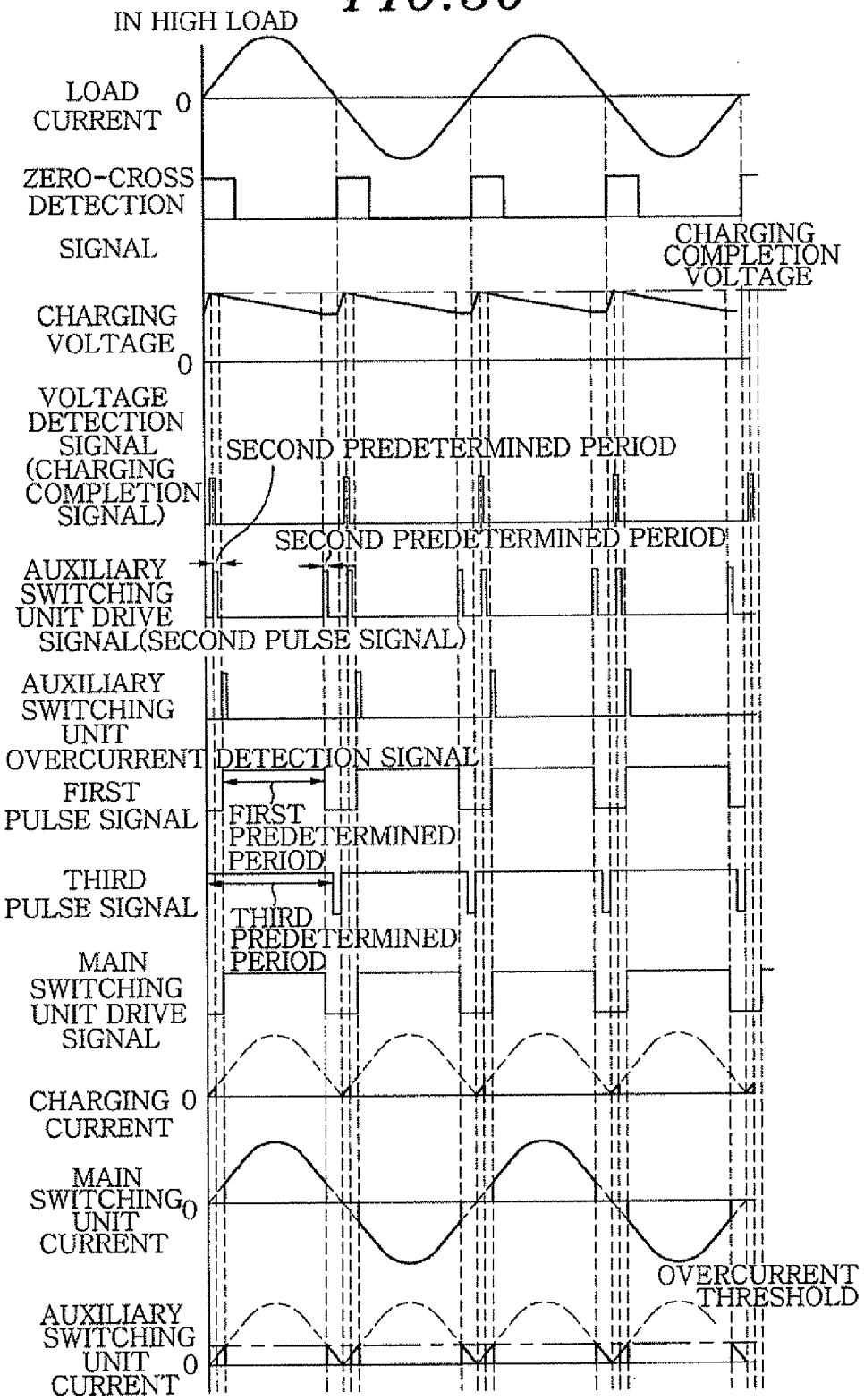
FIG. 30 is a time chart showing, in a high load, waveforms of signals in respective parts of the load control device in accordance with the seventh embodiment.
Figure 31:
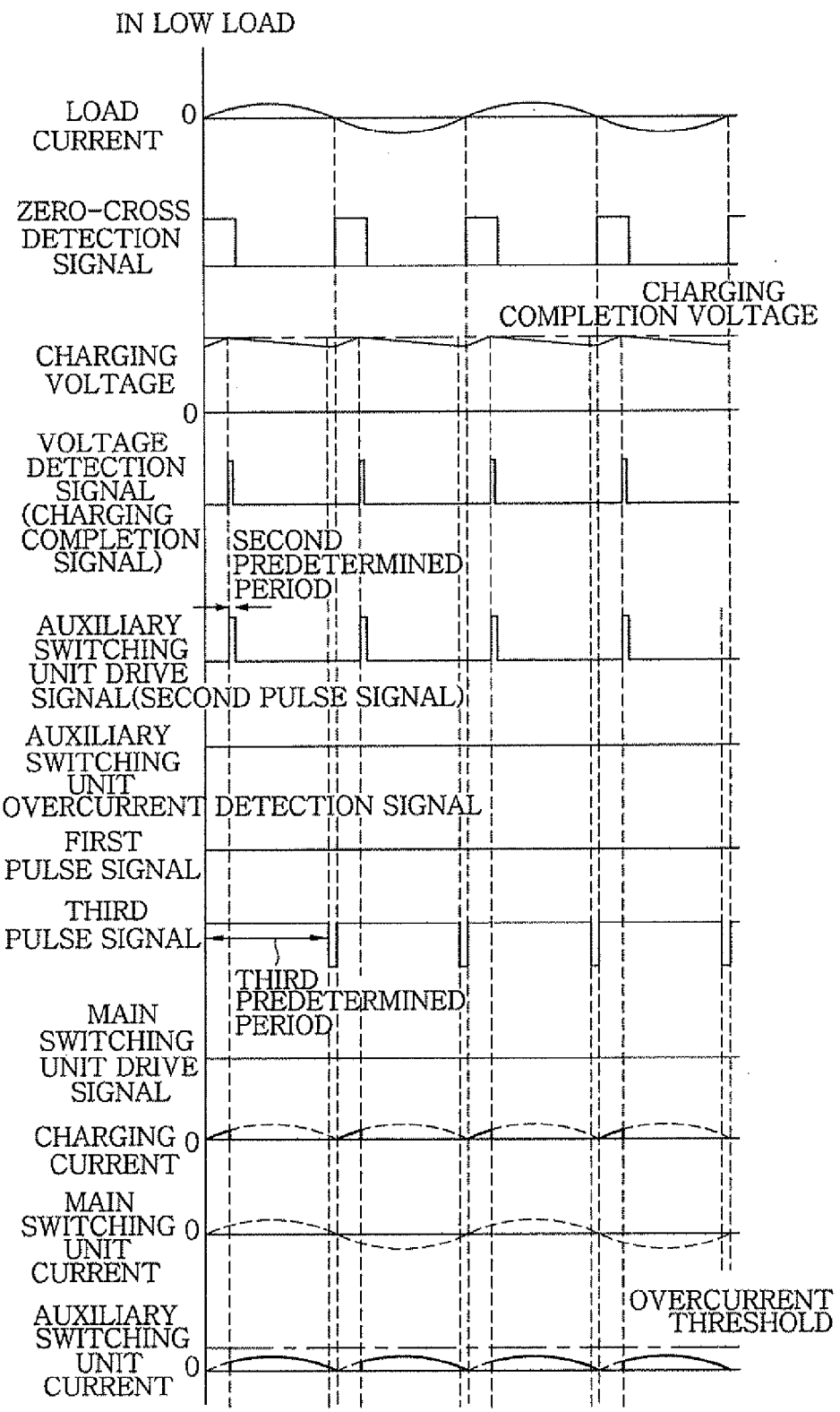
FIG. 31 is a time chart showing, in a low load, waveforms of signals in respective parts of the load control device in accordance with the seventh embodiment.

A load control device in accordance with a seventh embodiment of the present invention will be described. FIG. 29 is a circuit diagram showing a configuration of a load control device 1G in accordance with the seventh embodiment of the present invention. Further, FIGS. 30 and 31 are time charts showing waveforms of signals in respective parts of the load control device 1G. The load control device 1G is different from the load control device 1F in accordance with the sixth embodiment in that the load control device 1G further includes a zero-cross detection unit 19, a second pulse output unit 22, a third pulse output unit 23, an AND circuit 25a, a current detection unit 26 and an OR circuit 25b, and the other configuration of the load control device 1G is substantially the same as that of the load control device 1F. FIG. 29 illustrates a configuration in which the second pulse output unit 22 and the third pulse output unit 23 are configured by hardware with a dedicated IC and the like. However, it is not limited thereto, and they may be configured such that each pulse signal is outputted by software from a main control part 20 including a CPU and the like.

The zero-cross detection unit 19 detects a zero-cross of a load current, and outputs a zero-cross detection signal to the third pulse output unit 23. The second pulse output unit 22 receives a voltage detection signal outputted from a voltage detection unit 18, and outputs, as an auxiliary switching unit drive signal, a second pulse signal for a second predetermined period to an auxiliary switch element 17a of an auxiliary switching unit 17. The third pulse output unit 23 receives the zero-cross detection signal outputted from the zero-cross detection unit 19, and outputs a third pulse signal for a third predetermined period to a first pulse output unit 21 and the AND circuit 25a. The first pulse output unit 21 receives an overcurrent detection signal in the auxiliary switching unit 17 from the current detection unit 26, and then outputs a first pulse to put a main switching unit 11 in a conducting state only for a first predetermined period, in the same way as the first pulse output unit 21 of the sixth embodiment. Further, if the charging completion of a buffer capacitor 14a is delayed, when receiving the third pulse outputted from the third pulse output unit 23 even before the first predetermined period has elapsed, the first pulse output unit 21 makes the first pulse drop.

The AND circuit 25a calculates a logical product of the first pulse signal outputted from the first pulse output unit 21 and the third pulse signal outputted from the third pulse output unit 23 and outputs a logical product to the OR circuit 25b. The OR circuit 25b calculates a logical sum of the overcurrent detection signal outputted from the current detection unit 26 and the signal outputted from the AND circuit 25a, and outputs, as a main switching unit drive signal, the logical sum to a drive circuit 10 and the second pulse output unit 22.

As illustrated in FIG. 30, in a case where a high capacity load is connected as the load 3, a buffer capacitor 14a is charged for a short period in the same way as in the load control device 1F of the sixth embodiment. Further, if the voltage detection unit 18 detects that a voltage inputted to a third power supply unit 16 reaches a charging completion voltage, a voltage detection signal is outputted to the second pulse output unit 22. The second pulse output unit 22 having received the voltage detection signal outputs, as an auxiliary switching unit drive signal, the second pulse signal to the auxiliary switch element 17a of the auxiliary switching unit 17 to put the auxiliary switching unit 17 in a conducting state. Then, if the current detection unit 26 detects that the current flowing in the auxiliary switching unit 17 reaches a predetermined overcurrent threshold, the current detection unit 26 outputs an overcurrent detection signal to the first pulse output unit 21.

The first pulse output unit 21 having received the overcurrent detection signal outputs the first pulse signal for putting the main switching unit 11 in a conducting state to the AND circuit 25a. The first pulse signal outputted from the first pulse output unit 21 and the third pulse signal outputted from the third pulse output unit 23 are inputted to the AND circuit 25a. The AND circuit 25a calculates a logical product thereof, and outputs, as a main switching unit drive signal, a logical product to the OR circuit 25*b*. The main switching unit drive signal outputted from the AND circuit 25*a* passes through the OR circuit 25*b* and the drive circuit 10 and is inputted to the gate terminal of a main switch element 11*d* of the main switching unit 11. Accordingly, the main switching unit 11 is put in a conducting state while the first predetermined period overlaps with the third predetermined period.

Further, the main switching unit drive signal outputted from the AND circuit 25*a* passes through the OR circuit 25*b* and is inputted to the second pulse output unit 22. The second pulse output unit 22 receives the drop of the main switching unit drive signal indicating that the main switching unit 11 is in a non-conducting state, and outputs, as an auxiliary switching unit drive signal, the second pulse to the auxiliary switch element 17*a* of the auxiliary switching unit 17, thereby putting the auxiliary switching unit 17 in a conducting state again. That is, when an operation of putting the main switching unit 11 in a non-conducting state (open state) is started after the first predetermined period has elapsed, a control unit 13 puts the auxiliary switching unit 17 in a conducting state only for a second predetermined period (e.g., several hundred μ seconds). This operation may be performed such that the auxiliary switching unit 17 is put in a non-conducting state slightly later than the main switching unit 11. Further, since the auxiliary switch element 17*a* has a thyristor structure, the auxiliary switching unit 17 is put in a non-conducting state at the next zero-cross point. When the auxiliary switching unit 17 is put in a non-conducting state (open state), a current flows into the third power supply unit 16 again. Accordingly, the above operation is repeated every half cycle of the commercial AC power source.

Meanwhile, as illustrated in FIG. 31, in a case where a low capacity load is connected as the load 3, since the current flowing in the auxiliary switching unit 17 does not reach a predetermined overcurrent threshold, the main switching unit 11 with large power consumption is not put in a conducting state and the electrical conduction is continuously performed by the auxiliary switching unit 17. Further, the auxiliary switching unit 17 is put in a non-conducting state at the next zero-cross point, and the current flows into the third power supply unit 16 again. Accordingly, the above operation is repeated every half cycle of the commercial AC power source.

Further, in a case where a very low capacity load is connected as the load 3, the charging rate of the buffer capacitor 14*a* is reduced and the voltage detection signal may not be outputted from the voltage detection unit 18 during half cycle of the commercial AC power source. Accordingly, in this embodiment, there is a limitation on a standby time during which the second pulse output unit 22 awaits the voltage detection signal outputted from the voltage detection unit 18. It may be configured such that the second pulse is outputted from the second pulse output unit 22 after the standby time limit is elapsed, regardless of the presence of a voltage detection signal. With such configuration, if it is overly delayed for the voltage inputted to the third power supply unit 16 to reach a predetermined threshold, the auxiliary switching unit 17 is put in a conducting state after the standby time limit. Accordingly, it is possible to stably perform the switching operation of the auxiliary switching unit 17 every half cycle, and prevent the lighting fluctuation occurring in a miniature bulb or the like.

As described above in the sixth embodiment, the auxiliary switching unit 17 is originally intended to detect the zero-cross point of the current, but not primarily intended to provide electrical conduction, and may include a small-sized switch element. However, when the frequency is deviated in the commercial AC power source, or when the load control device is to be operated at both frequencies of 50 Hz and 60 Hz, the time until the zero-cross point of the current after the main switching unit is put in a non-conducting state becomes long. Accordingly, the electrical conduction of the auxiliary switching unit is started before the load current becomes sufficiently small. Further, in a case where an overload is connected as the load 3, although the electrical conduction time of the auxiliary switching unit 17 remains to be same, the electrical conduction loss increases. Accordingly, the switch element forming the auxiliary switching unit 17 may be broken.

Accordingly, in the seventh embodiment, in FIG. 30, even when the operation of the main switching unit 11 is converted into the operation of the auxiliary switching unit 17, the current flowing in the auxiliary switching unit 17 is detected by the current detection unit 26, and when a current exceeding an allowable value is found to flow in the auxiliary switching unit 17, the main switching unit 11 is put in a conducting state (closed state) again only for a short period (fourth predetermined period). Then, when the main switching unit 11 is put in a non-conducting state (open state), the auxiliary switching unit 17 is put in a conducting state again.

Specifically, the current detection unit 26 which detects that the current exceeding the allowable value flows in the auxiliary switching unit 17 outputs the overcurrent detection signal to the OR circuit 25*b*. When the OR circuit 25*b* receives a signal outputted from the AND circuit 25*a* or a signal outputted from the current detection unit 26, the OR circuit 25*b* puts the main switching unit 11 in a conducting state only for a short period to protect the auxiliary switching unit 17. As described above, by repeatedly converting the main switching unit 11 and the auxiliary switching unit 17, it is possible to prevent breakage in the switch element of the auxiliary switching unit 17.

In the load control device 1G in accordance with the seventh embodiment of the present invention, after the third predetermined period, that is shorter than the half cycle, from the detection of the zero-cross point of the load current, the main switching unit 11 is put in a non-conducting state. Accordingly, for example, in a low load, although a timing of starting the conduction of the main switching unit 11 is delayed due to the late charging completion of the buffer capacitor 14*a*, the main switching unit 11 can be surely put in a non-conducting state before the load current becomes zero. Accordingly, the main switching unit 11 is not put in a conducting state beyond the zero-cross point, and the operation of the load control device performed every half cycle is stabilized. Further, when the main switching unit 11 is put in a non-conducting state, the auxiliary switching unit 17 is put in a conducting state only for a predetermined period. Accordingly, in a high load, after power is supplied to the load 3 from the main switching unit 11 for most of the half cycle of the commercial AC power source, the electrical conduction current is reduced, and then, power is supplied to the load from the auxiliary switching unit 17. Since these operations are performed with respect to the load current, although the main switching unit 11 includes a switch element having a transistor structure, it is possible to achieve a two-wire load control device which is applicable to any one of a fluorescent lamp, incandescent lamp and the like without being limited to those having a power factor of 1. Further, it is possible to suppress the noise generated in the operation of the load control device to a low level, thereby achieving a load control device having a small size and wide applicable load range.

Further, when the current detection unit 26 detects that a current exceeding the allowable value flows in the auxiliary switching unit 17, the main switching unit 11 is put in a conducting state (closed state) and then put in a non-conducting state. Accordingly, it is possible to prevent the switch element of the auxiliary switching unit 17 from being broken, and to form the auxiliary switching unit 17 using a small switch element. Thus, it is possible to achieve miniaturization of the load control device, thereby improving responsiveness with respect to the type of the commercial AC power source or responsiveness with respect to the overload.

(Eighth Embodiment)

Figure 32:
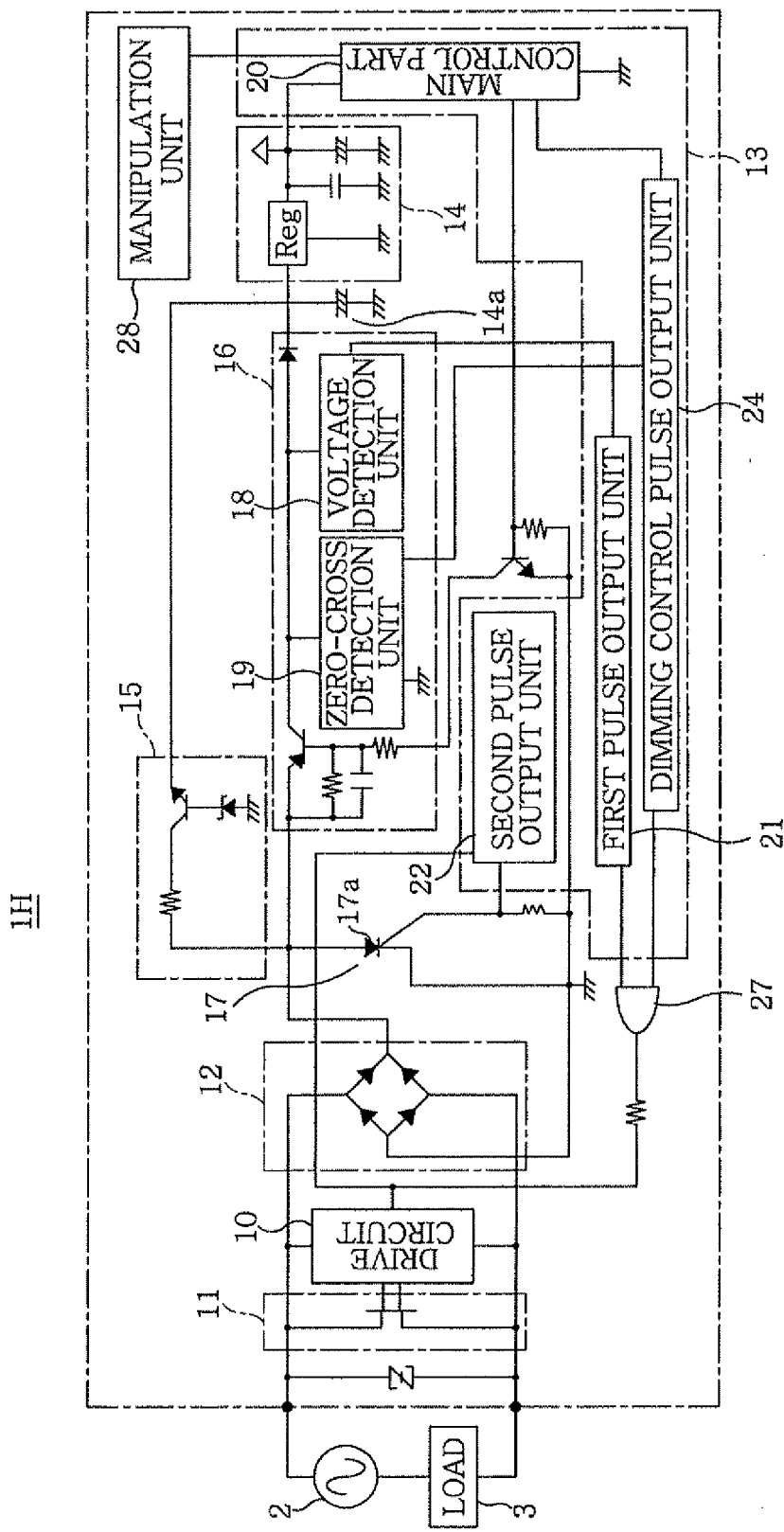
FIG. 32 is a circuit diagram showing a configuration of a load control device in accordance with an eighth embodiment of the present invention.
Figure 33:
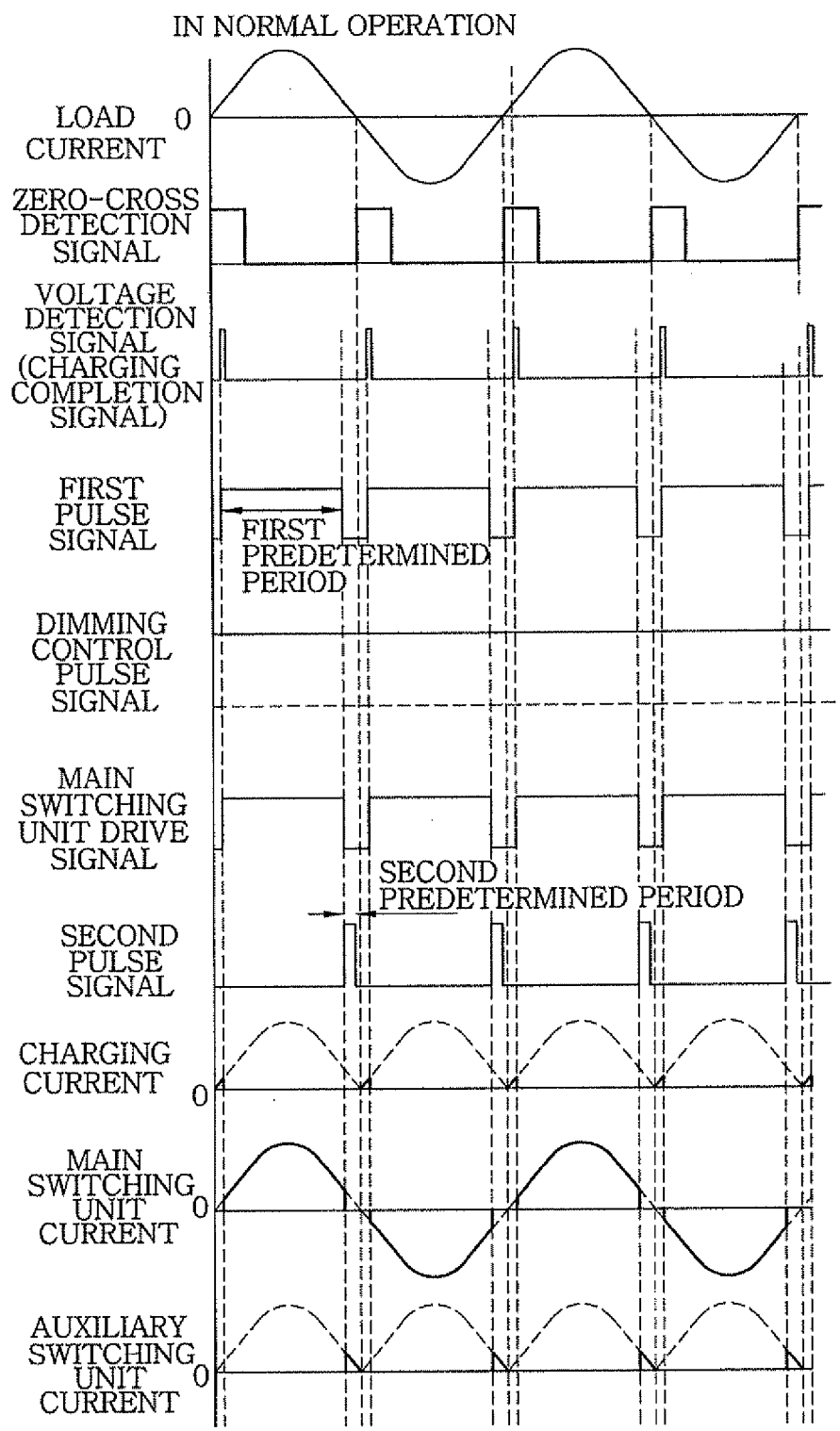
FIG. 33 is a time chart showing, in a normal operation, waveforms of signals in respective parts of the load control device in accordance with the eighth embodiment.
Figure 34:
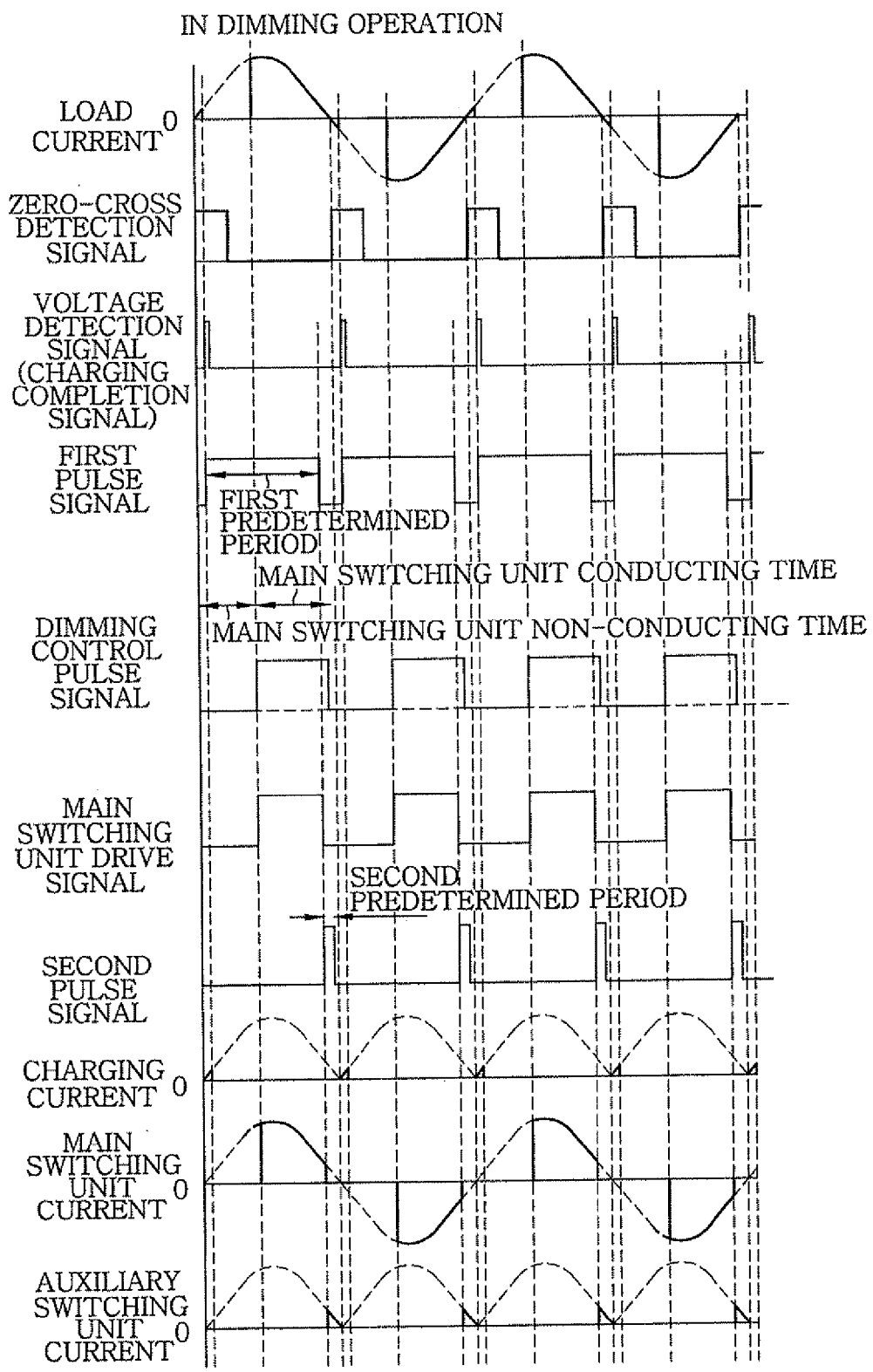
FIG. 34 is a time chart showing, in a dimming operation, waveforms of signals in respective parts of the load control device in accordance with the eighth embodiment.

A load control device in accordance with an eighth embodiment of the present invention will be described. FIG. 32 is a circuit diagram showing a configuration of a load control device 1H in accordance with the eighth embodiment of the present invention. Further, FIGS. 33 and 34 are time charts showing waveforms of signals in respective parts of the load control device 1H.

The load control device 1H of the eighth embodiment shown in FIG. 32 connected in series between the AC power source 2 and the load 3 includes a main switching unit 11 to control the supply of a power to a drive circuit 10 and the load 3, a rectifying unit 12, and a control unit 13 controlling the entire load control device 1H. The load control device 1H further Includes a first power supply unit 14 which supplies a stable power to the control unit 13, a second power supply unit 15 which supplies power to the first power supply unit 14 when no power is supplied to the load 3, and a third power supply unit 16 which supplies power to the first power supply unit 14 when power is supplied to the load 3. Also, the load control device 1H includes an auxiliary switching unit 17 which allows a micro-current in the load current to flow therethrough, an AND circuit 27, a manipulation unit 28 manipulated by a user, and the like. The drive circuit 10 drives the main switching unit 11 in response to a pulse signal outputted from the control unit 13. Further, the third power supply unit 16 includes a voltage detection unit 18 which detects a voltage inputted to the third power supply unit 16, and a zero-cross detection unit 19 which detects a zero-cross point of the load current. The main switching unit 11 has a main switch element 11d (see FIG. 19) having a single gate transistor structure, and the auxiliary switching unit 17 has an auxiliary switch element 17a having a thyristor structure. Further, the control unit 13 includes a main control part 20 including a CPU and the like, a first pulse output unit 21, a second pulse output unit 22, and a dimming control pulse output unit 24.

The main control part 20 sets a main switching unit conducting time which is counted in order to put the main switching unit 11 in a conducting state in the half cycle of an alternating current power source in response to a manipulation inputted to the manipulation unit 28. The main control part 20 controls the drive circuit 10 by counting the main switching unit conducting time through the dimming control pulse output unit 24, thereby intermittently controlling the current flowing in the load 3. After receiving the charging completion signal of a buffer capacitor 14a from the voltage detection unit 18, the first pulse output unit 21 outputs a first pulse to put the main switching unit 11 in a conducting state only for a first predetermined period. That is, the first pulse rises when receiving the charging completion signal from the voltage detection unit 18, and drops after the first predetermined period.

After detecting that the main switching unit 11 is put in a non-conducting state (open state), the second pulse output unit 22 outputs a second pulse signal for a predetermined period to put the auxiliary switching unit 17 in a conducting state only for a second predetermined period. That is, the second pulse rises when detecting that the main switching unit 11 is put in a non-conducting state (open state), and drops after the second predetermined period. The dimming control pulse output unit 24 counts the main switching unit conducting time set by the main control part 20 and outputs a dimming control pulse to the AND circuit 27.

The manipulation unit 28 is manipulated by the user to adjust the current flowing in the load 3. The manipulation unit 28 is provided with a volume switch to allow the user to adjust the current flowing in the load 3 and the like. In a case where, e.g., an illumination apparatus is connected as the load 3, the user may perform dimming by manipulating the manipulation unit 28. Further, similarly, in a case where a driving motor of a ventilation fan is connected as the load 3, the user may adjust an air volume by manipulating the manipulation unit 28.

Even in an OFF state of the load control device 1H in which no power is supplied to the load 3, a current flows in the second power supply unit 15 from the power source 2 through the rectifying unit 12. Accordingly, although a micro-current flows in the load 3, the current is suppressed to a low level to avoid a malfunction in the load 3. Accordingly, the impedance of the second power supply unit 15 is maintained at a high level.

When power is supplied to the load 3, the impedance of the third power supply unit 16 is reduced and the current is made to flow in the inner circuit of the load control device 1H, thereby charging the buffer capacitor 14a. As described above, the voltage detection unit (charging monitoring unit) 18 is provided in the third power supply unit 16 to detect a voltage inputted to the third power supply unit 16, i.e., a charging voltage of the buffer capacitor 14a. When the charging of the buffer capacitor 14a is completed, the third power supply unit 16 is turned off. Then, in synchronization with the operation of the main switching unit 11, the third power supply unit 16 is turned on again while lowering the impedance.

The voltage detection unit 18 includes, e.g., a Zener diode, a transistor and the like. When the voltage inputted to the third power supply unit 16 exceeds a Zener voltage of the Zener diode, the transistor is put in a conducting state such that a detection signal indicating this status is inputted to the control unit 13 (first pulse output unit 21). In a normal operation, when receiving the detection signal from the voltage detection unit 18, the control unit 13 puts the main switching unit 11 in a conducting state (closed state) for a first predetermined period. In FIG. 32, the first pulse output unit 21 is configured by hardware with a dedicated IC and the like and is provided as a part of the control unit 13 to directly output the first pulse signal in response to the detection signal from the voltage detection unit 18. However, it is not limited thereto, and it may be configured such that the output of the voltage detection unit 18 is inputted to the main control part 20 including a CPU and the like, and the first pulse signal is outputted by software. It is preferable that the first predetermined period for putting the main switching unit 11 in conducting state is set to be a time period slightly shorter than half cycle of the commercial AC frequency power source.

Next, when an operation of putting the main switching unit 11 in a non-conducting state (open state) is started after the first predetermined period has elapsed, the control unit 13 puts the auxiliary switching unit 17 in a conducting state (closed state) only for a second predetermined period (e.g., several hundred μ seconds). This operation may be performed such that the auxiliary switching unit 17 is put in a non-conducting state slightly later than the main switching unit 11. Alternatively, a pulse signal having a period longer by only the second predetermined period than that of the first pulse signal outputted from the main control part 20 to the main switching unit 11 may be outputted to the auxiliary switching unit 17. Alternatively, a delay circuit may be configured by using a diode or capacitor.

By these operations, after the charging of the buffer capacitor 14a is completed, power is supplied from the main switching unit 11 to the load 3 for most of half cycle of the commercial AC current. Then, after the conducting current is reduced, power is supplied from the auxiliary switching unit 17 to the load 3. Further, since the auxiliary switching unit 17 has the auxiliary switch element 17a having a thyristor structure, the auxiliary switching unit 17 is put in a non-conducting state (open state) when the current value becomes zero (zero-cross point). When the auxiliary switching unit 17 is put in a non-conducting state (open state), since the current flows into the third power supply unit 16 again, the above operations are repeated every half cycle of the commercial AC power source.

FIG. 33 illustrates waveforms of signals in respective parts of the load control device 1H in a normal operation. FIG. 34 illustrates waveforms of signals in respective parts of the load control device 1H in a dimming operation. In the normal operation, i.e., when dimming of the illumination apparatus serving as the load 3 is not performed, as illustrated in FIG. 33, a high signal is always outputted from the dimming control pulse output unit 24. Accordingly, after the charging of the buffer capacitor 14a is completed, power is supplied from the main switching unit 11 to the load 3 for most of half cycle of the commercial AC power source. In this case, since the first predetermined period is set to put the main switching unit 11 in a non-conducting state before a time point (zero-cross point) when the current value becomes zero, the main switching unit 11 is not put in a conducting state beyond the zero-cross point.

Then, the second pulse output unit 22 having received the first pulse signal outputs the second pulse signal for putting the auxiliary switching unit 17 in a conducting state only for a second predetermined period to the auxiliary switching unit 17 when the main switching unit 11 is put in a non-conducting state, such that power is supplied from the auxiliary switching unit 17 to the load 3.

Meanwhile, in the dimming operation, i.e., when the manipulation unit 28 is manipulated by the user to perform dimming of the illumination apparatus serving as the load 3, as shown in FIG. 34, a dimming control pulse signal is outputted from the dimming control pulse output unit 24. The dimming control pulse signal has a low signal outputted in the main switching unit non-conducting time and a high signal outputted in the main switching unit conducting time. The main switching unit non-conducting time is counted after the zero-cross detection unit 19 detects the zero-cross point. The main switching unit conducting time is continuously counted after counting the main switching unit non-conducting time.

The dimming control pulse signal outputted from the dimming control pulse output unit 24 is inputted to the AND circuit 27. The AND circuit 27 calculates a logical product of the first pulse outputted from the first pulse output unit 21 and the dimming control pulse signal outputted from the dimming control pulse output unit 24 to generate a main switching unit drive signal, and outputs the main switching unit drive signal to the main switching unit 11 through the drive circuit 10. Accordingly, the main switching unit 11 is put in a conducting state only while the first predetermined period, which is counted from when the voltage detection unit 18 detects that the voltage inputted to the third power supply unit 16 reaches a predetermined threshold, overlaps with the main switching unit conducting time, which is counted from when the zero-cross detection unit 19 detects the zero-cross. The current flowing in the load 3 is intermittently controlled to perform dimming of the load 3. Further, since the subsequent operations of the second pulse output unit 22 and the auxiliary switching unit 17 are the same as those in the normal operation, a description thereof will be omitted.

In the load control device 1H in accordance with the eighth embodiment of the present invention, in the normal operation, when the voltage detection unit 18 detects that the voltage inputted to the third power supply unit 16 reaches a predetermined threshold, since the control unit 13 puts the main switching unit 11 in a conducting state (closed state) for a first predetermined period, power is supplied from the main switching unit 11 to the load for most of the half cycle of the alternating current power source. Further, in the dimming operation, since the conduction of the main switching unit 11 is intermittently controlled by the manipulation inputted to the manipulation unit 28, it is possible to reduce the power consumption by performing a desired operation on the load by using the two-wire load control device. For example, in a case where the load 3 is an illumination apparatus, the user may manipulate the manipulation unit 28 such that dimming is performed at a desired brightness level. Further, after the zero-cross detection unit 19 detects the zero-cross point, the main switching unit non-conducting time is counted, and then the main switching unit conducting time is counted. Accordingly, by appropriately setting the main switching unit non-conducting time, it may be configured such that the time until the voltage inputted to the third power supply unit 16 reaches a predetermined threshold does not overlap with the main switching unit conducting time. Accordingly, the intermittent conduction control of the load may be performed accurately in response to the operation of the user.

Further, since the main switch element 11d of the main switching unit 11 has a transistor structure, it is possible to achieve miniaturization of the load control device generating less noise and less heat.

Further, when the main switching unit 11 is put in a non-conducting state after the first predetermined period, the auxiliary switching unit 17 is put in a conducting state only for the third predetermined period to supply power from the auxiliary switching unit 17 to the load 3. Accordingly, although a transistor is used as the main switch element 11d of the main switching unit 11, it is possible to achieve a phase control not requiring an interruption of the current. Further, the noise generated in the operation of the load control device can be suppressed at a low level, and the switching loss becomes small, thereby achieving a small-sized apparatus.

(Ninth Embodiment)

Figure 35:
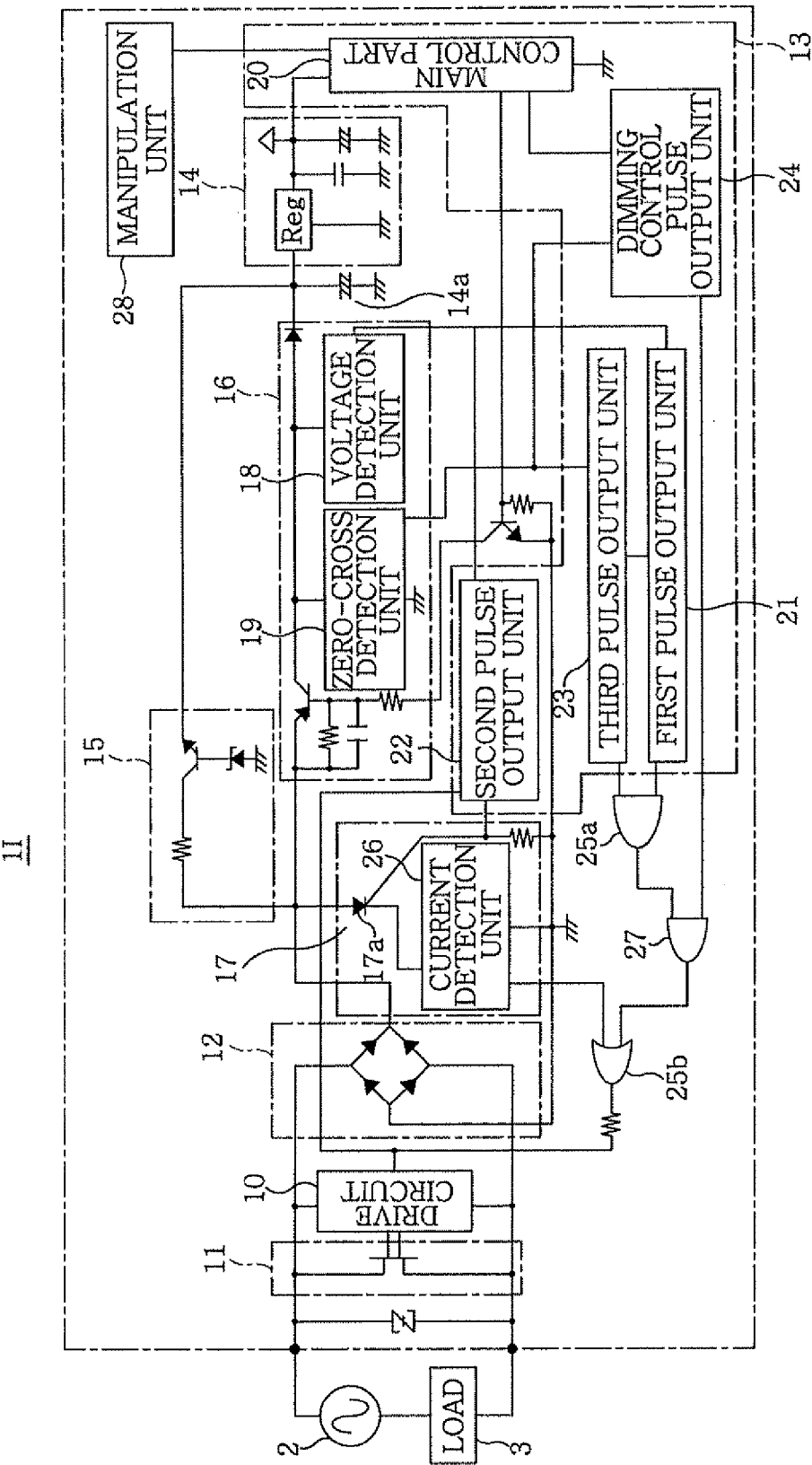
FIG. 35 is a circuit diagram showing a configuration of a load control device in accordance with a ninth embodiment of the present invention.
Figure 36:
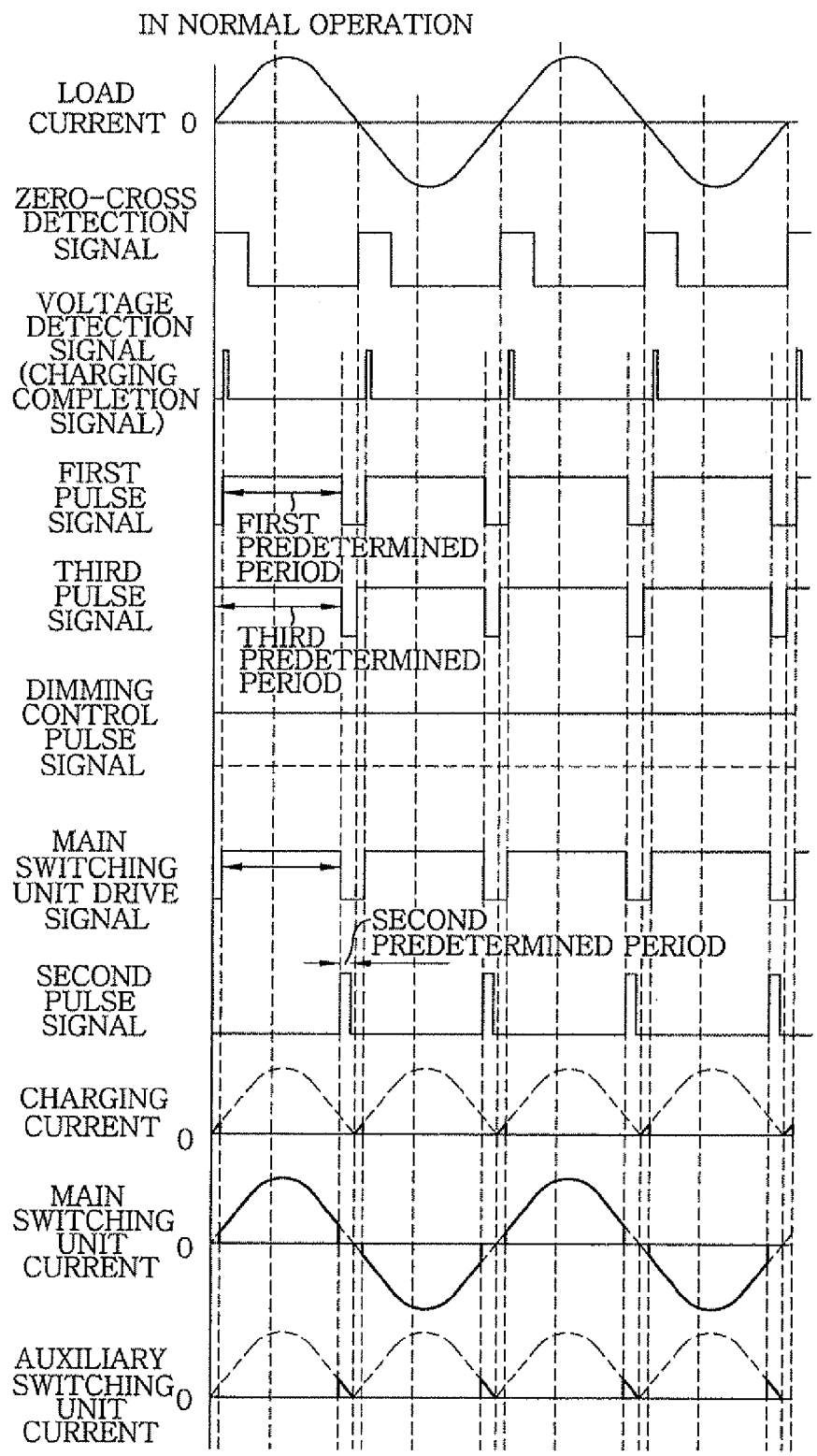
FIG. 36 is a time chart showing, in a normal operation, waveforms of signals in respective parts of the load control device in accordance with the ninth embodiment.
Figure 37:
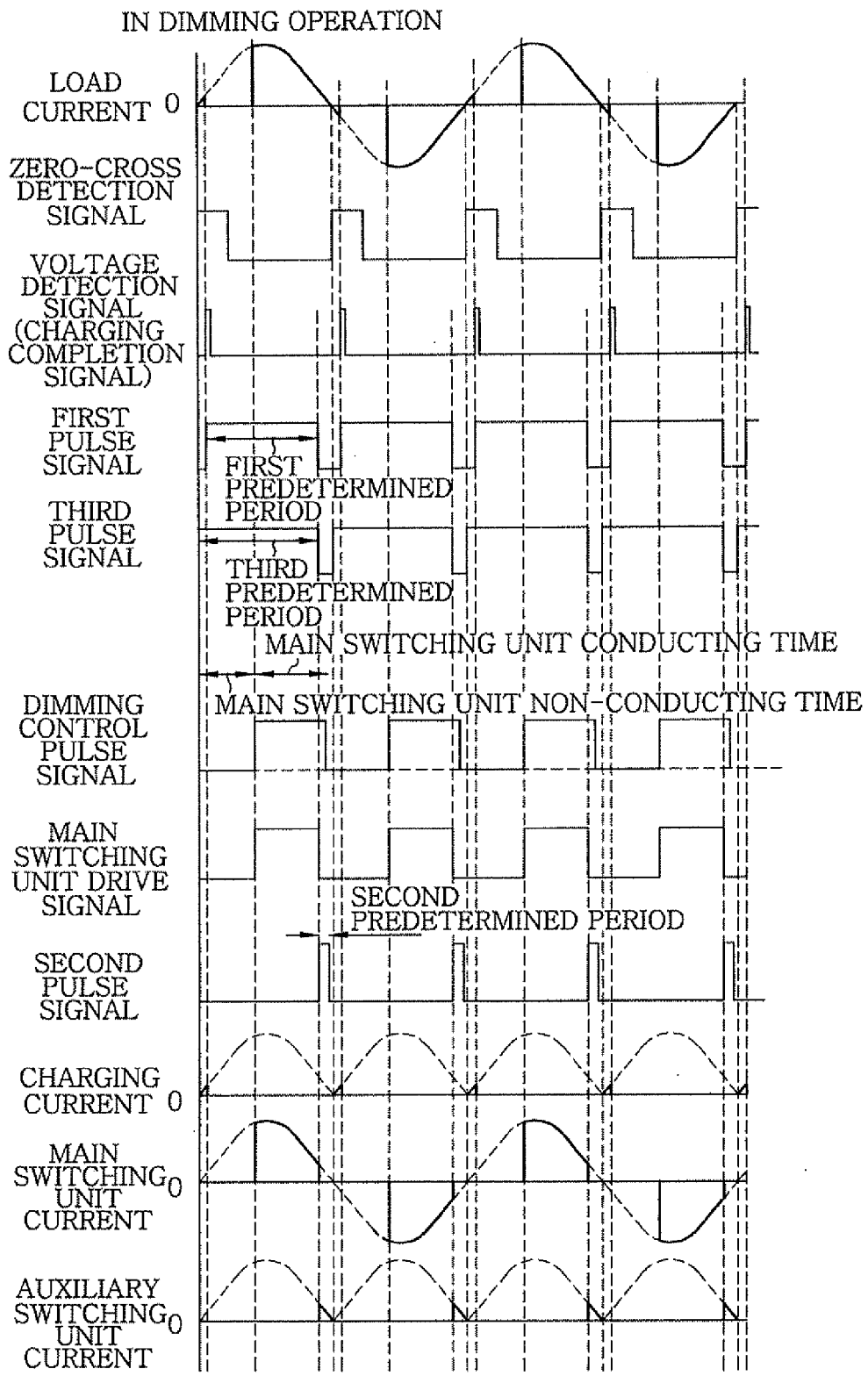
FIG. 37 is a time chart showing, in a dimming operation, waveforms of signals in respective parts of the load control device in accordance with the ninth embodiment.

A load control device in accordance with a ninth embodiment of the present invention will be described. FIG. 35 is a circuit diagram showing a configuration of a load control device 1I in accordance with the ninth embodiment of the present invention. Further, FIGS. 36 and 37 are time charts showing waveforms of signals in respective parts of the load control device 1I. The load control device 1I is different from the load control device 1H in accordance with the eighth embodiment in that the load control device 1I further includes a third pulse output unit 23, an AND circuit 25a, a current detection unit 26 and an OR circuit 25b, and the other configuration of the load control device 1I is substantially the same as that of the load control device 1F.

In a case where a low capacity load such as a miniature bulb is connected as the load 3, since the load current is small, a lot of time is required for charging a buffer capacitor 14a. Accordingly, the time from when a zero-cross detection unit 19 detects the zero-cross until a voltage detection unit 18 detects completion of the charging becomes long, and the rise of the first pulse is delayed. The first predetermined period is set considering the above-described case where the high capacity load is connected. Accordingly, if the rise of the first pulse is overly delayed, the first pulse drops after the load current exceeds the zero-cross point. Thus, in a case where a main switching unit 11 is controlled by using only the first pulse and the dimming control pulse, in a low load, the main switching unit 11 is put in a conducting state beyond the zero-cross point, and the charging operation every half cycle is not stabilized.

Accordingly, in this embodiment, as shown in FIGS. 36 and 37, the open state of the main switching unit 11 is limited to a third predetermined period by using a third pulse outputted from the third pulse output unit 23. The third pulse output unit 23 outputs the third pulse such that the open state of the main switching unit 11 is limited to a third predetermined period after the zero-cross detection unit 19 has detected a zero-cross point of the power supply current. That is, the third pulse rises when receiving a zero-cross detection signal from the zero-cross detection unit 19, and drops after the third predetermined period that is shorter than the half cycle of the load current. The AND circuit 25a calculates a logical product of the first pulse signal outputted from a first pulse output unit 21 and the third pulse signal outputted from the third pulse output unit 23 and outputs a logical product to a AND circuit 27. The OR circuit 25b calculates a logical sum of the signal outputted from the current detection unit 26 and the signal outputted from the AND circuit 27 to generate a main switching unit drive signal, and outputs the main switching unit drive signal to the main switching unit 11 through a drive circuit 10.

By these operations, the main switching unit 11 is put in a closed state only while the first predetermined period during which the first pulse rises, the third predetermined period during which the third pulse rises, and the main switching unit conducting time during which the dimming control pulse rises overlap with each other. As described above, since the third pulse rises at a timing when the zero-cross detection unit 19 detects the zero-cross point, and drops in the third predetermined period, being shorter than the half cycle of the load current, although the timing of detecting the charging completion of the buffer capacitor 14a, i.e., the timing of starting the first predetermined period is deviated later, the main switching unit 11 is not in a closed state beyond the zero-cross point of the power supply frequency. Accordingly, it is possible to surely perform charging every half cycle, thereby stabilizing the operation.

Further, an auxiliary switching unit 17 is originally intended to detect the zero-cross point of the current, not primarily intended to provide electrical conduction, and may include a small-sized switch element. However, when the frequency is deviated in the commercial AC power source, or when the load control device is to be operated at both frequencies of 50 Hz and 60 Hz, the time until the zero-cross point of the current after the main switching unit is put in a non-conducting state becomes long. Accordingly, the electrical conduction of the auxiliary switching unit is started before the load current becomes sufficiently small. Further, in a case where an overload is connected as the load, although the electrical conduction time of the auxiliary switching unit remains to be same, the electrical conduction loss increases. Accordingly, the switch element forming the auxiliary switching unit 17 may be broken. Accordingly, in the ninth embodiment, the current flowing in the auxiliary switching unit 17 is detected by the current detection unit 26, and when the current exceeding an allowable value is found to flow in the auxiliary switching unit 17, the main switching unit 11 is put in a conducting state (closed state) again only for a short period (fourth predetermined period). Then, when the main switching unit is put in a non-conducting state (open state), the auxiliary switching unit 17 is put in a conducting state again.

Specifically, the current detection unit 26 which detects that the current exceeding the allowable value flows in the auxiliary switching unit 17 outputs a signal indicating such status to the OR circuit 25b. When the OR circuit 25b receives a signal outputted from the AND circuit 25a or a signal outputted from the current detection unit 26, the OR circuit 25b puts the main switching unit 11 in a conducting state only for a short period to protect the auxiliary switching unit 17. As described above, by repeatedly converting the main switching unit 11 and the auxiliary switching unit 17, it is possible to prevent breakage of an auxiliary switch element 17a of the auxiliary switching unit 17 and also to improve responsiveness with respect to the type of the commercial AC power source or responsiveness with respect to the overload.

In the load control device 1I of the ninth embodiment, after the third predetermined period has elapsed even in the first predetermined period, a control unit 13 puts the main switching unit 11 in a non-conducting state. Accordingly, for example, in a low load, although a timing of starting the first predetermined period is delayed, the main switching unit 11 is put in a non-conducting state before the load current becomes zero. Accordingly, since the main switching unit 11 is not put in a conducting state beyond the zero-cross point of the load current, charging can be surely performed during the half cycle of the AC power source, and the operation performed every half cycle can be stabilized. Further, when the current detection unit 26 detects that the current exceeding the allowable value flows in the auxiliary switching unit 17, the main switching unit is put in a conducting state (closed state) and then put in a non-conducting state. Accordingly, it is possible to prevent the switch element of the auxiliary switching unit 17 from being broken, and to form the auxiliary switching unit 17 by using a small switch element. Thus, it is possible to achieve miniaturization of the load control device, thereby improving responsiveness with respect to the type of the commercial AC power source or responsiveness with respect to the overload.

Figure 38:
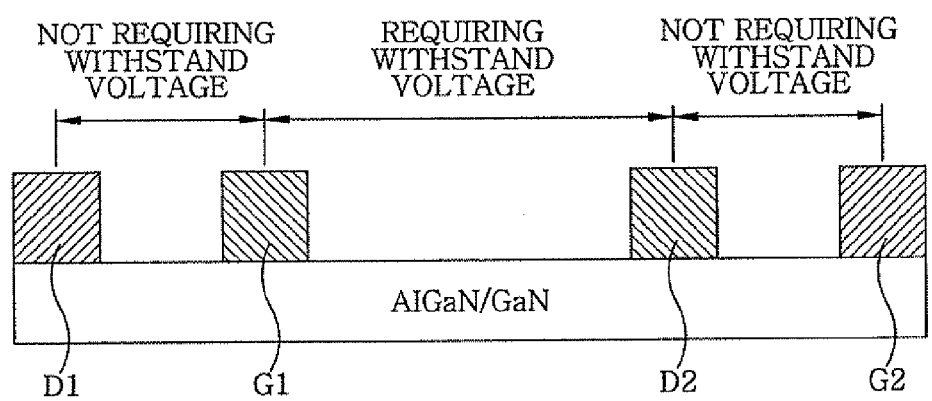
FIG. 38 illustrates a longitudinal cross-sectional configuration of a main switch element having a lateral dual gate transistor structure.

Further, in the load control devices 1D to 1I in accordance with the fourth to ninth embodiments of the present invention, the configurations of the main switch element and the drive circuit thereof are not limited to the above-described embodiments, and the modification examples of the above-described embodiments may be applied. For example, as the main switch element having a dual gate transistor structure shown in FIG. 5A and the drive circuit thereof, the drive circuit 10 shown in FIG. 12 or the modification example of the drive circuit 10 of FIG. 12, which is shown in FIG. 13, may be applied to the above embodiments. FIG. 38 illustrates a longitudinal cross-sectional configuration of the main switch element having a lateral dual gate transistor structure, which is a bidirectional element that can reduce its loss by providing a withstand voltage maintaining region at one location. In this configuration, it is possible to reduce the amount of heat generated by the main switch element when power is supplied to the load 3, thereby achieving both miniaturization and high capacity of the load control device.

Further, instead of the drive circuit 10 shown in FIG. 12, the drive circuit 10 shown in FIG. 14 may be applied to the drive circuit of the above embodiments.

Further, instead of the drive circuit 10 shown in FIG. 12, the drive circuit 10 shown in FIG. 8 and the detailed configuration example or the modification example of the drive circuit of FIG. 8, which is shown in FIG. 9, 10, or 11, may be applied to the above embodiments.

(Tenth to Twelfth Embodiments)

Next, load control devices in accordance with the tenth to twelfth embodiments of the present invention will be described. The load control device using a drive circuit 10 shown in FIGS. 8 to 11 has a circuit configuration in which no current is allowed to flow by a diode of a rectifying unit 12 when a drive signal is applied to a main switch element 11d of a main switching unit 11. Accordingly, an operation may be performed only for a voltage type element in which a gate (gate terminal) of a main switch element 11d does not require a current value equal to or greater than a predetermined value. However, in the tenth to twelfth embodiments, a stable operation may be performed even for a current type element in which the main switch element 11d of the main switching unit 11 requires a current value equal to or greater than a predetermined value.

Figure 39:
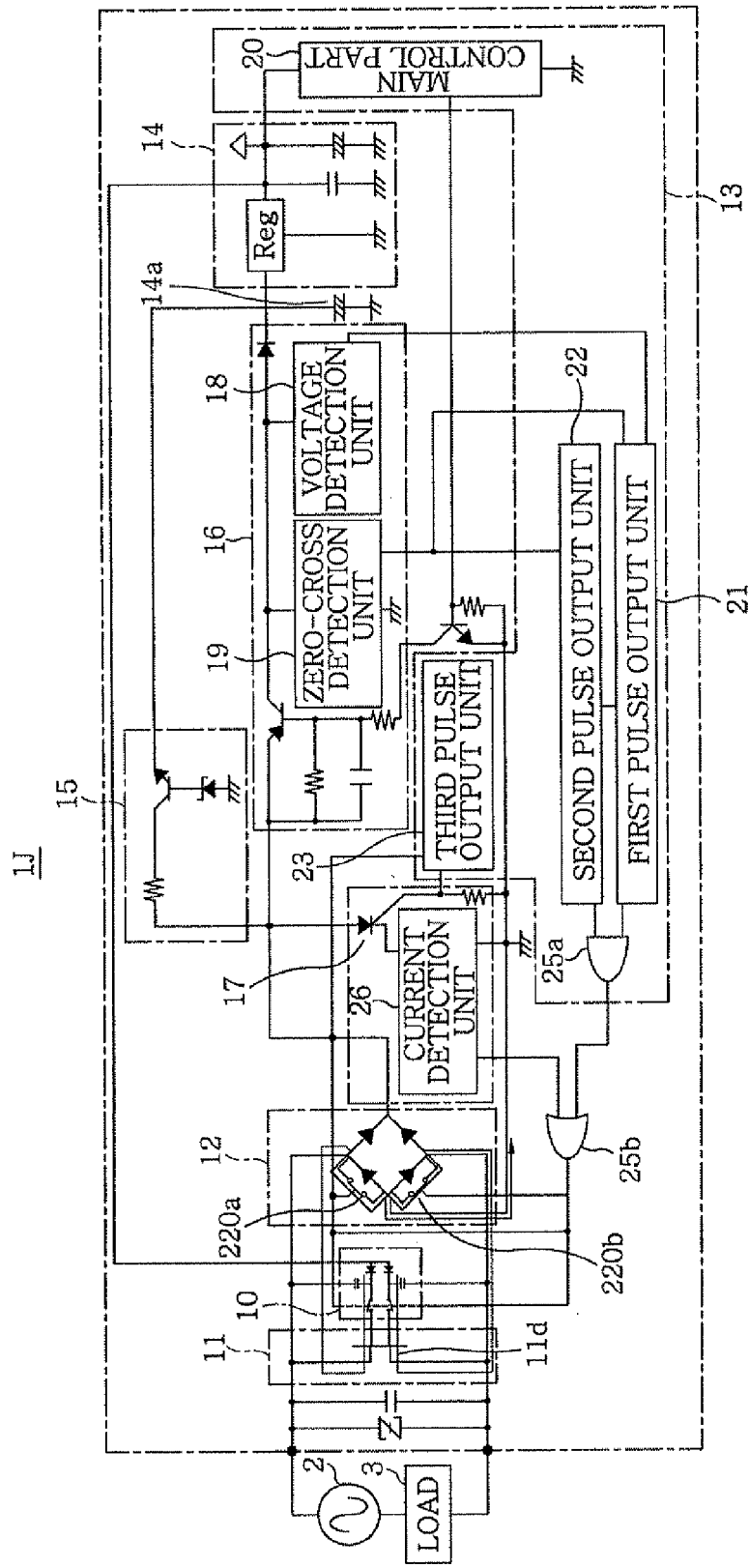
FIG. 39 is a circuit diagram showing a configuration of a load control device in accordance with a tenth embodiment of the present invention.
Figure 40:
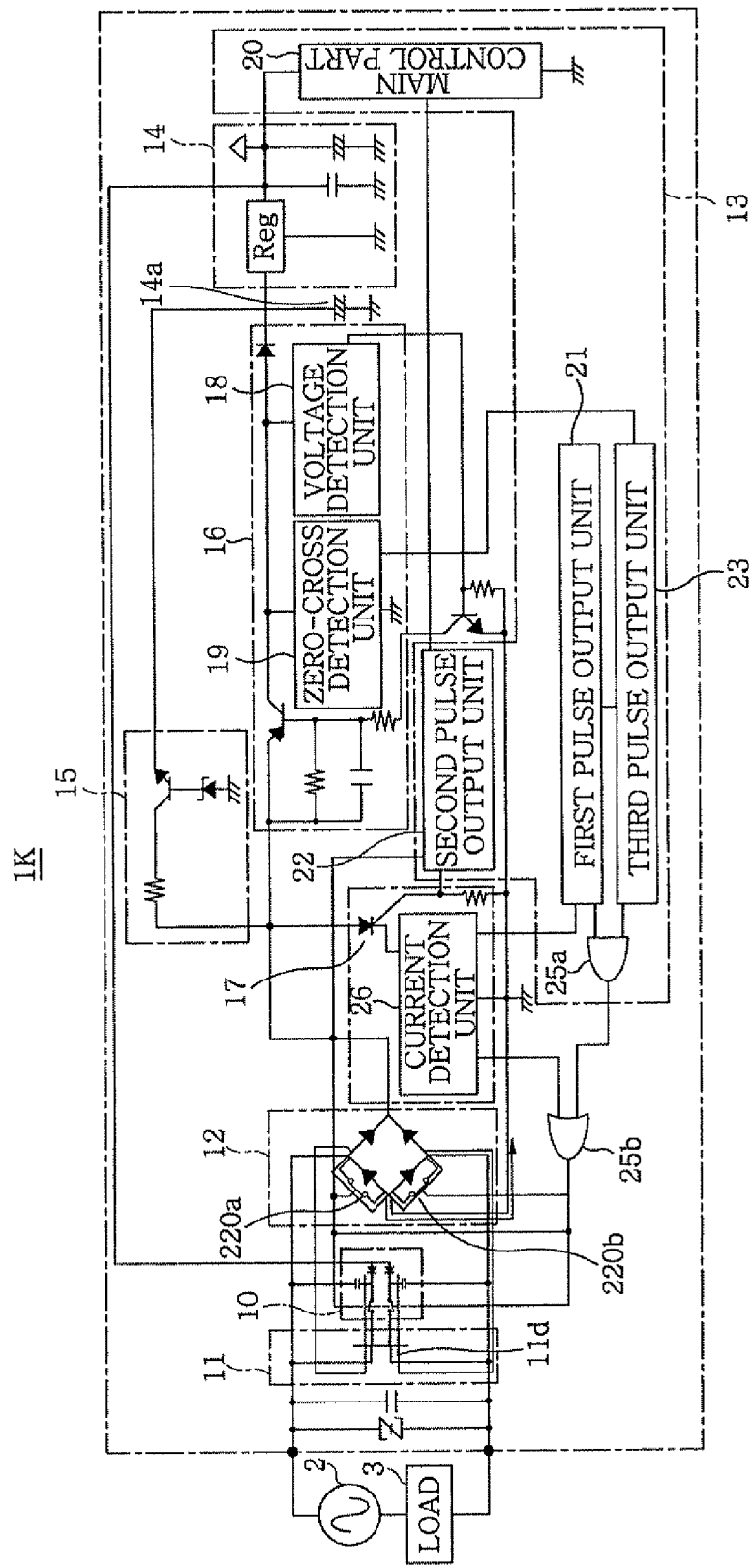
FIG. 40 is a circuit diagram showing a configuration of a load control device in accordance with an eleventh embodiment of the present invention.
Figure 41:
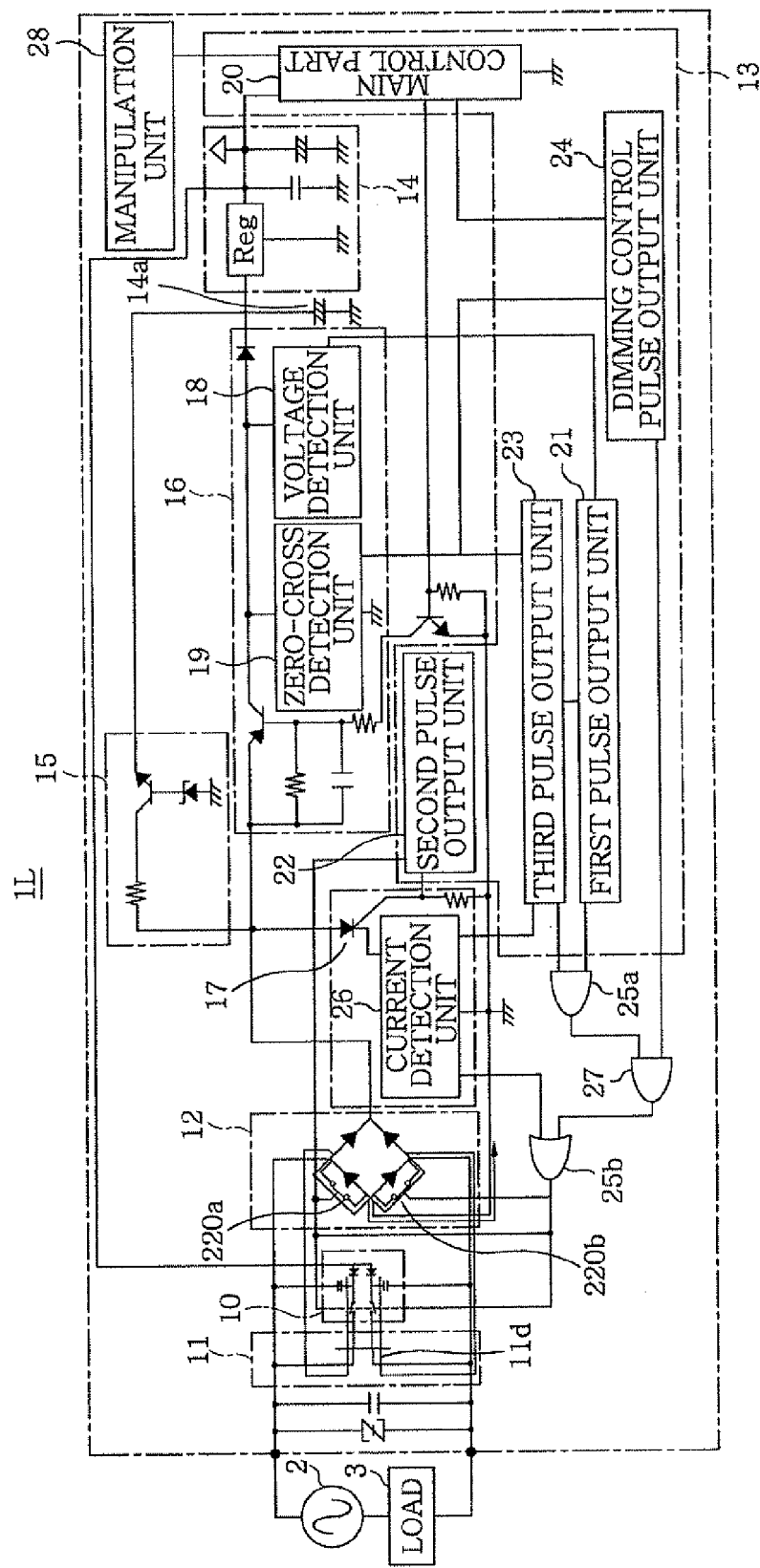
FIG. 41 is a circuit diagram showing a configuration of a load control device in accordance with a twelfth embodiment of the present invention.

As illustrated in FIGS. 39, 40 and 41, in load control devices 1J, 1K and 1L in accordance with the tenth to twelfth embodiments, synchronous switching elements 220a and 220b are connected between the AC line of the rectifying unit 12 and the minus side output of the rectifying unit 12 serving as a basis of the circuit, and synchronous switching elements 220a and 220b are turned on in synchronization with an operation of putting the main switching unit 11 in a closed state. When the synchronous switching elements 220a and 220b are closed in synchronization with an operation of putting the main switching unit 11 in a closed state, a path is formed to flow the current through the gate of the main switch element 11d of the main switching unit 11 from a first power supply unit 14 in the load control devices 1J, 1K and 1L. Accordingly, a stable operation may be performed even if the gate of the main switch element 11d is a dual gate element requiring a current. Further, the other configurations or basic operations of the load control devices 1J, 1K and 1L are substantially the same as those of the load control devices 1D to 1I using the drive circuit 10 shown in FIGS. 8 to 11. Further, the configuration of the drive circuit 10 is not particularly limited, and may adopt the basic configuration of the load control device or each modification example.

(Thirteenth to Fifteenth Embodiments)

Figure 42:
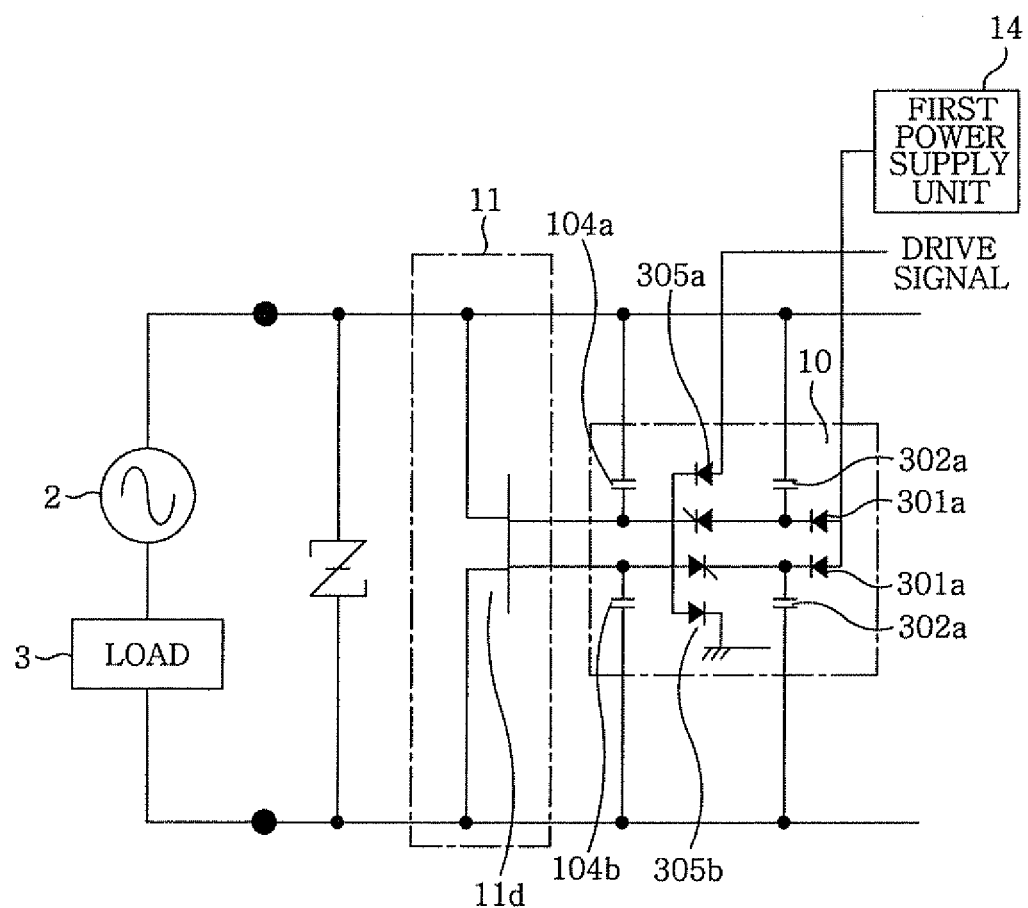
FIG. 42 is a circuit diagram showing a configuration of a drive circuit applied to load control devices in accordance with thirteenth to fifteenth embodiments of the present invention.

Next, load control devices in accordance with the thirteenth to fifteenth embodiments of the present invention will be described. The load control devices in accordance with the thirteenth to fifteenth embodiments are different from the load control devices in accordance with the tenth to twelfth embodiments in that a drive circuit 10 shown in FIG. 42 is used instead of the drive circuits 10 shown in FIGS. 39, 40 and 41.

In the load control devices in accordance with the thirteenth to fifteenth embodiments, the drive circuit 10 of a main switching unit 11 includes high withstand voltage diodes 301a and 301b connected to a first power supply unit of the load control device, capacitors 302a and 302b having one ends connected to respective power lines and the other ends connected to the diodes 301a and 301b, and self-arc extinction type drive switch elements 305a and 305b such as photothyristors and phototriacs connected between gate terminals of a main switch element 11d of the main switching unit 11 and connection points between the diodes 301a and 301b and the capacitors 302a and 302b.

In the thirteenth and fifteenth embodiments, when the charging completion detection is performed by a voltage detection unit 18 provided in a third power supply unit 16, the main switching unit 11 is put in a closed state. In the fourteenth embodiment, when the overcurrent detection is performed by a current detection unit 26 connected to an auxiliary switching unit 17, the main switching unit 11 is put in a closed state. In this case, a signal is inputted to put the drive switch elements 305a and 305b connected to the gate electrodes of the main switch element 11d of the main switching unit 11. However, since each of the drive switch elements 305a and 305b has a thyristor or triac structure, each of the drive switch elements 305a and 305b may be driven only by a trigger signal. Accordingly, the driving power of each of the drive switch elements 305a and 305b may be smaller than that in each of the above-described embodiments. Further, each of the drive switch elements 305a and 305b may be in a non-conducting state only by opening a corresponding one of the synchronous switching elements 220a and 220b provided in a rectifying unit 12, thereby reducing the driving power for opening/closing the main switching unit 11. In the two-wire load control device, since it is an important object to enable load control while stably ensuring a power supply, it is preferable in the stable operation of the load that the driving power of the load control device is small.

The present invention is not limited to the configurations of the above-described embodiments, and may be applied to a load control device using a MOSFET element or other switch element.

Further, the present invention is not limited to the configurations of the above-described embodiments, and may be configured to control the main switching unit 11 at least such that when power is supplied to the load, a main switching unit drive signal rises if the voltage detected by the voltage detection unit 18 does not reach a predetermined threshold within the standby time limit, and the main switching unit drive signal drops after a predetermined period shorter than the half cycle of the load current after a zero-cross detection unit 19 detects a zero-cross point of the load current.

Further, the present invention is not limited to the configurations of the above-described embodiments, and may be configured at least such that when power is supplied to the load, the auxiliary switching unit 17 is first in a conducting state if the voltage detection unit 18 detects that the voltage inputted to the third power supply unit 16 reaches a predetermined threshold; the main switching unit 11 is then in a conducting state if the current detection unit 26 detects that the current flowing in the auxiliary switching unit 17 reaches a predetermined threshold; and the auxiliary switching unit 17 is continuously in a conducting state if the current flowing in the auxiliary switching unit 17 does not reach a predetermined threshold.

Further, the present invention is not limited to the configurations of the above-described embodiments, and may be configured to control dimming at least such that the main switching unit conducting time counted to put the main switching unit 11 in a conducting state during the half cycle of the AC power source is set in response to the manipulation inputted to a manipulation unit 28, and the main switching unit 11 is put in a conducting state only while the first predetermined period, which is counted from when the voltage detection unit 18 detects that the voltage inputted to the third power supply unit 16 reaches a predetermined threshold, overlaps with the main switching unit conducting time. Further, the present invention can be variously modified, and for example, the output of the zero-cross detection unit 19 may be inputted to a main control part 20 including a CPU and the like to thereby output the second pulse in software.

While the invention has been shown and described with respect to the embodiments, it will be understood by those skilled in the art that various changes and modification may be made without departing from the scope of the invention as defined in the following claims.

What is claimed is:

1. A two-wire load control device configured to be connected in series between an alternating current (AC) power source and a load, comprising:
    a main switching unit, which has a main switch element to be connected in series to the AC power source and the load and controls a supply of power to the load;
    a manipulation switch, which is manipulated by a user and outputs a start-up signal for starting at least the load;
    a control unit, which is connected to the manipulation switch and controls opening/closing of the main switching unit based on a signal transmitted from the manipulation switch;
    a first power supply unit electrically powered from both terminals of the main switching unit through a rectifying unit, for supplying a stable voltage to the control unit;
    a second power supply unit electrically powered from said both terminals of the main switching unit through the rectifying unit, for electrically powering the first power supply unit when no power is supplied to the load; and
    a third power supply unit for electrically powering the first power supply unit when power is supplied to the load in a closed state of the main switching unit,
    wherein upon receiving the start-up signal from the manipulation switch, the control unit outputs an initial drive signal for putting the main switch element in a conducting state to the main switching unit before a power source for electrically powering the first power supply unit is switched from the second power supply unit to the third power supply unit.

2. The two-wire load control device of claim 1, wherein the main switch element is a triac, and the initial drive signal is a pulse signal having a predetermined pulse width, the pulse signal being inputted to a gate of the triac.

3. The two-wire load control device of claim 1, wherein the main switch element is an element having a transistor structure, and the initial drive signal is a pulse signal having a pulse width equal to or larger than ¼ cycle of the commercial AC power source and smaller than ½ cycle of the commercial AC power source, the pulse signal being inputted to a gate of the transistor structure.

4. The two-wire load control device of claim 3, further comprising an auxiliary switching unit, which includes an auxiliary switch element having a thyristor structure and controls the supply of power to the load when the main switching unit is in a non-conducting state.

5. The two-wire load control device of claim 4, further comprising:
    a buffer capacitor for electrically powering to the first power supply unit when both of the second power supply unit and the third power supply unit fail to electrically power the first power supply unit; and
    a voltage detection unit, which detects one of an input voltage of the third power supply unit and a terminal voltage of the buffer capacitor when the power is supplied to the load in the closed state of the main switching unit,
    wherein when the power is supplied to the load, the control unit outputs a first pulse signal for putting the main switching unit in a conducting state for a predetermined period to the main switching unit when the voltage detection unit detects that said one of the input voltage of the third power supply unit and the terminal voltage of the buffer capacitor reaches a predetermined threshold, and outputs a second pulse signal for putting the auxiliary switching unit in a conducting state when the main switching unit is put in a non-conducting state through absence of the first pulse signal.

6. A two-wire load control device configured to be connected in series between an AC power source and a load, comprising:
    a main switching unit, which includes a switch element having a transistor structure and controls a supply of power to the load;
    an auxiliary switching unit, which includes a switch element having a thyristor structure and controls the supply of power to the load when the main switching unit is in a non-conducting state;
    a control unit, which controls opening/closing of the main switching unit and the auxiliary switching unit;
    a first power supply unit electrically powered from both terminals of the main switching unit through a rectifying unit, for supplying a stable voltage to the control unit;
    a second power supply unit electrically powered from both terminals of the main switching unit through the rectifying unit, for electrically powering the first power supply unit when no power is supplied to the load;
    a third power supply unit for electrically powering the first power supply unit when power is supplied to the load in a closed state of one of the main switching unit and the auxiliary switching unit;
    a voltage detection unit, which detects a voltage inputted to the third power supply unit; and
    a zero-cross detection unit, which detects a zero-cross point of a load current,
    wherein when the power is supplied to the load, the control unit causes a rise of a main switching unit drive signal for putting the main switching unit in a conducting state when the voltage detection unit detects that the voltage inputted to the third power supply unit reaches a predetermined threshold within a predetermined standby time limit after the zero-cross detection unit detects the zero-cross point of the load current, and causes a fall of the main switching unit drive signal after a predetermined period, that is shorter than a half cycle of the load current, after the zero-cross detection unit detects the zero-cross point of the load current, and
    wherein when the power is supplied to the load, the control unit causes a rise of the main switching unit drive signal after the standby time limit is elapsed when the voltage detection unit fails to detect that the voltage inputted to the third power supply unit reaches a predetermined threshold within the standby time limit, and causes a fall of the main switching unit drive signal after a predetermined period, that is shorter than the half cycle of the load current, after the zero-cross detection unit detects the zero-cross point of the load current.

7. The two-wire load control device of claim 6, wherein the standby time limit is equal to or smaller than ¼ cycle of the commercial AC power source.

8. A two-wire load control device configured to be connected in series between an AC power source and a load, comprising:
    a main switching unit, which includes a switch element having a transistor structure and controls a supply of power to the load;
    an auxiliary switching unit, which includes a switch element having a thyristor structure, and controls the supply of power to the load when the main switching unit is in a non-conducting state;
    a control unit, which controls opening/closing of the main switching unit and the auxiliary switching unit;

a first power supply unit electrically powered from said both terminals of the main switching unit through a rectifying unit, for supplying a stable voltage to the control unit;

a second power supply unit electrically powered from said both terminals of the main switching unit through the rectifying unit, for electrically powering the first power supply unit when no power is supplied to the load;

a third power supply unit for electrically powering the first power supply unit when the power is supplied to the load in a closed state of one of the main switching unit and the auxiliary switching unit;

a voltage detection unit, which detects a voltage inputted to the third power supply unit; and a current detection unit, which detects a current flowing into the auxiliary switching unit, wherein when the power is supplied to the load, the auxiliary switching unit is put in a conducting state when the voltage detection unit detects that the voltage inputted to the third power supply unit reaches a predetermined threshold, and wherein the control unit puts the main switching unit in a conducting state and simultaneously puts the auxiliary switching unit in a non-conducting state when the current detection unit detects that the current flowing into the auxiliary switching unit reaches a predetermined threshold.

9. The two-wire load control device of claim 8, further comprising a zero-cross detection unit, which detects a zero-cross point of a load current, wherein after putting the main switching unit in a conducting state, the control unit puts the main switching unit in a non-conducting state after a predetermined period, that is shorter than a half cycle of the load current, after the zero-cross detection unit detects the zero-cross point of the load current.

10. The two-wire load control device of claim 9, wherein after putting the main switching unit in a non-conducting state, the control unit puts the auxiliary switching unit in a conducting state for a predetermined period.

11. The two-wire load control device of claim 10, wherein the control unit first puts the main switching unit in a conducting state when the current detection unit detects that the current flowing in the auxiliary switching unit reaches a predetermined threshold, and then puts the auxiliary switching unit in a conducting state when the main switching unit turns into a non-conducting state.

12. The two-wire load control device of claim 8, wherein the current detection unit includes an integrating circuit.

13. The two-wire load control device of claim 8, wherein when the power is supplied to the load, the control unit puts the auxiliary switching unit in a conducting state after the standby time limit is elapsed when the voltage detection unit fails to detect that the voltage inputted to the third power supply unit reaches a predetermined threshold within a predetermined standby time limit.

14. A two-wire load control device configured to be connected in series between an AC power source and a load, comprising:

a main switching unit, which includes a switch element having a transistor structure and controls a supply of power to the load;

an auxiliary switching unit, which includes a switch element having a thyristor structure and controls the supply of power to the load when the main switching unit is in a non-conducting state;

a control unit, which controls opening/closing of the main switching unit and the auxiliary switching unit;

a first power supply unit electrically powered from both terminals of the main switching unit through a rectifying unit, for supplying a stable voltage to the control unit;

a second power supply unit electrically powered from said both terminals of the main switching unit through the rectifying unit, for electrically powering the first power supply unit when no power is supplied to the load;

a third power supply unit for electrically powering the first power supply unit when the power is supplied to the load in a closed state of one of the main switching unit and the auxiliary switching unit;

a voltage detection unit, which detects a voltage inputted to the third power supply unit; and a manipulation unit, which is manipulated by a user to adjust a current flowing in the load, wherein the control unit sets a main switching unit conducting time, which is counted in order to put the main switching unit in a conducting state at every half cycle of the AC power source in response to a manipulation inputted to the manipulation unit, and wherein the control unit puts the main switching unit in a conducting state only while a predetermined period, which is counted from when the voltage detection unit detects that the voltage inputted to the third power supply unit reaches a predetermined threshold, overlaps with the main switching unit conducting time.

15. The two-wire load control device of claim 14, further comprising a zero-cross detection unit, which detects a zero-cross point of a load current, wherein after the zero-cross detection unit detects the zero-cross point, the control unit counts a main switching unit non-conducting time for putting the main switching unit in a non-conducting state in response to the manipulation inputted to the manipulation unit, and then counts the main switching unit conducting time.

16. The two-wire load control device of claim 6, wherein the control unit puts the auxiliary switching unit in a conducting state only for a predetermined period when a state of the main switching unit is a non-conducting state.

17. The two-wire load control device of claim 16, further comprising a current detection unit, which detects a current flowing into the auxiliary switching unit, wherein the control unit first puts the main switching unit in a conducting state when the current flowing in the auxiliary switching unit is equal to or larger than a predetermined threshold, and then puts the auxiliary switching unit in a conducting state when the main switching unit turns into a non-conducting state.

18. The two-wire load control device of claim 6, further comprising a drive circuit for driving the main switching unit, wherein the main switching unit includes a main switch element to be connected in series to the AC power source and the load, wherein the main switch element has a lateral dual gate transistor structure having two gates, to each of which a control voltage is applied, with respect to connection points respectively connected to the AC power source and the load, and wherein the lateral dual gate transistor structure has a withstand voltage maintaining region at one location.

19. The two-wire load control device of claim 18, wherein the drive circuit supplies, on the basis of a drive signal transmitted from the control unit, power electrically isolated from the control unit to each of the gates of the main switch element by using as a reference a potential of each of the connection points respectively connected to the AC power source and the load, and drives the main switch element.

20. The two-wire load control device of claim 19, wherein the drive circuit includes two optically coupled semiconductor switch elements corresponding to the dual gates of the main switch element and have light emitting parts and light receiving parts;
   wherein each of the light emitting parts is connected to the control unit and receives a drive signal inputted from the control unit, and each of the light receiving parts performs photoelectric conversion when light emitted from each of the light emitting parts is incident thereon; and
   wherein each of the light emitting parts is connected such that power is generated in each of the light receiving parts to apply a positive potential to each of the gates of the main switch element by using as a reference each of the connection points as the reference respectively connected to the AC power source and the load.

21. The two-wire load control device of claim 19, wherein the drive circuit includes a transformer having a primary coil connected to the control unit, and two secondary coils corresponding to the dual gates of the main switch element and connected to the gates of the main switch element through rectifier circuits, and
   wherein power, obtained by rectifying an electromotive force generated in each of the secondary coils when alternating current flows in the primary coil on the basis of the drive signal transmitted from the control unit, applies a positive potential to each of the gates of the main switch element by using as a reference each of the connection points respectively connected to the AC power source and the load.

22. The two-wire load control device of claim 18, wherein the drive circuit includes two diodes corresponding to the dual gates of the main switch element and connected to the first power supply unit, capacitors having one ends connected to respective power lines and the other ends connected to the diodes, and drive switch elements connected between the gates of the main switch element of the main switching unit and connection points between the diodes and the capacitors, and
   wherein the drive circuit supplies driving power to the main switching unit by putting the drive switch elements in a conducting state based on a signal transmitted from the control unit.

23. The two-wire load control device of claim 22, wherein the drive switch elements of the drive circuit are optically coupled semiconductor switch elements having light emitting parts each of which emits light by a drive signal transmitted from the control unit and light receiving parts each of which receives the light emitted from the respective light emitting parts to be in a conducting state, and
   wherein the driving power is supplied to the main switching unit using power of the first power supply unit by putting the light emitting parts in a conducting state.

24. The two-wire load control device of claim 20, wherein the light emitting parts of the two optically coupled semiconductor switch elements of the drive circuit are connected in series to each other.

25. The two-wire load control device of claim 22, wherein the drive circuit includes capacitors connected between power lines each of which is used as a reference of each of the gates and connection points between the gates of the main switch element and the drive switch elements.

26. The two-wire load control device of claim 18, further comprising synchronous switching elements connected between a point connected to an AC line of the rectifying unit and a minus output point of the rectifying unit, wherein an operation of closing the synchronous switching elements is performed in synchronization with an operation of closing the main switching unit.

27. The two-wire load control device of claim 26, wherein the drive switch elements have one of a thyristor and triac structure, and are driven based on a signal isolated from any of the power supply units of the load control device.

28. The two-wire load control device of claim 14, wherein the control unit puts the auxiliary switching unit in a conducting state only for a predetermined period when a state of the main switching unit is a non-conducting state.

29. The two-wire load control device of claim 28, further comprising a current detection unit, which detects a current flowing into the auxiliary switching unit,
   wherein the control unit first puts the main switching unit in a conducting state when the current flowing in the auxiliary switching unit is equal to or larger than a predetermined threshold, and then puts the auxiliary switching unit in a conducting state when the main switching unit turns into a non-conducting state.

30. The two-wire load control device of claim 8, further comprising a drive circuit for driving the main switching unit,
   wherein the main switching unit includes a main switch element to be connected in series to the AC power source and the load,
   wherein the main switch element has a lateral dual gate transistor structure having two gates, to each of which a control voltage is applied, with respect to connection points respectively connected to the AC power source and the load, and
   wherein the lateral dual gate transistor structure has a withstand voltage maintaining region at one location.

31. The two-wire load control device of claim 14, further comprising a drive circuit for driving the main switching unit,
   wherein the main switching unit includes a main switch element to be connected in series to the AC power source and the load,
   wherein the main switch element has a lateral dual gate transistor structure having two gates, to each of which a control voltage is applied, with respect to connection points respectively connected to the AC power source and the load, and
   wherein the lateral dual gate transistor structure has a withstand voltage maintaining region at one location.

32. The two-wire load control device of claim 30, wherein the drive circuit supplies, on the basis of a drive signal transmitted from the control unit, power electrically isolated from the control unit to each of the gates of the main switch element by using as a reference a potential of each of the connection points respectively connected to the AC power source and the load, and drives the main switch element.

33. The two-wire load control device of claim 31, wherein the drive circuit supplies, on the basis of a drive signal transmitted from the control unit, power electrically isolated from the control unit to each of the gates of the main switch element by using as a reference a potential of each of the connection points respectively connected to the AC power source and the load, and drives the main switch element.

34. The two-wire load control device of claim 32, wherein the drive circuit includes two optically coupled semiconductor switch elements corresponding to the dual gates of the main switch element and have light emitting parts and light receiving parts;
   wherein each of the light emitting parts is connected to the control unit and receives a drive signal inputted from the control unit, and each of the light receiving parts performs photoelectric conversion when light emitted from each of the light emitting parts is incident thereon; and wherein each of the light emitting parts is connected such that power is generated in each of the light receiving parts to apply a positive potential to each of the gates of the main switch element by using as a reference each of the connection points as the reference respectively connected to the AC power source and the load.

35. The two-wire load control device of claim 33, wherein the drive circuit includes two optically coupled semiconductor switch elements corresponding to the dual gates of the main switch element and have light emitting parts and light receiving parts;

wherein each of the light emitting parts is connected to the control unit and receives a drive signal inputted from the control unit, and each of the light receiving parts performs photoelectric conversion when light emitted from each of the light emitting parts is incident thereon; and wherein each of the light emitting parts is connected such that power is generated in each of the light receiving parts to apply a positive potential to each of the gates of the main switch element by using as a reference each of the connection points as the reference respectively connected to the AC power source and the load.

36. The two-wire load control device of claim 32, wherein the drive circuit includes a transformer having a primary coil connected to the control unit, and two secondary coils corresponding to the dual gates of the main switch element and connected to the gates of the main switch element through rectifier circuits, and wherein power, obtained by rectifying an electromotive force generated in each of the secondary coils when alternating current flows in the primary coil on the basis of the drive signal transmitted from the control unit, applies a positive potential to each of the gates of the main switch element by using as a reference each of the connection points respectively connected to the AC power source and the load.

37. The two-wire load control device of claim 33, wherein the drive circuit includes a transformer having a primary coil connected to the control unit, and two secondary coils corresponding to the dual gates of the main switch element and connected to the gates of the main switch element through rectifier circuits, and wherein power, obtained by rectifying an electromotive force generated in each of the secondary coils when alternating current flows in the primary coil on the basis of the drive signal transmitted from the control unit, applies a positive potential to each of the gates of the main switch element by using as a reference each of the connection points respectively connected to the AC power source and the load.

38. The two-wire load control device of claim 30, wherein the drive circuit includes two diodes corresponding to the dual gates of the main switch element and connected to the first power supply unit, capacitors having one ends connected to respective power lines and the other ends connected to the diodes, and drive switch elements connected between the gates of the main switch element of the main switching unit and connection points between the diodes and the capacitors, and wherein the drive circuit supplies driving power to the main switching unit by putting the drive switch elements in a conducting state based on a signal transmitted from the control unit.

39. The two-wire load control device of claim 31, wherein the drive circuit includes two diodes corresponding to the dual gates of the main switch element and connected to the first power supply unit, capacitors having one ends connected to respective power lines and the other ends connected to the diodes, and drive switch elements connected between the gates of the main switch element of the main switching unit and connection points between the diodes and the capacitors, and wherein the drive circuit supplies driving power to the main switching unit by putting the drive switch elements in a conducting state based on a signal transmitted from the control unit.

40. The two-wire load control device of claim 38, wherein the drive switch elements of the drive circuit are optically coupled semiconductor switch elements having light emitting parts each of which emits light by a drive signal transmitted from the control unit and light receiving parts each of which receives the light emitted from the respective light emitting parts to be in a conducting state, and wherein the driving power is supplied to the main switching unit using power of the first power supply unit by putting the light emitting parts in a conducting state.

41. The two-wire load control device of claim 39, wherein the drive switch elements of the drive circuit are optically coupled semiconductor switch elements having light emitting parts each of which emits light by a drive signal transmitted from the control unit and light receiving parts each of which receives the light emitted from the respective light emitting parts to be in a conducting state, and Wherein the driving power is supplied to the main switching unit using power of the first power supply unit by putting the light emitting parts in a conducting state.

42. The two-wire load control device of claim 34, wherein the light emitting parts of the two optically coupled semiconductor switch elements of the drive circuit are connected in series to each other.

43. The two-wire load control device of claim 35, wherein the light emitting parts of the two optically coupled semiconductor switch elements of the drive circuit are connected in series to each other.

44. The two-wire load control device of claim 38, wherein the drive circuit includes capacitors connected between power lines each of which is used as a reference of each of the gates and connection points between the gates of the main switch element and the drive switch elements.

45. The two-wire load control device of claim 39, wherein the drive circuit includes capacitors connected between power lines each of which is used as a reference of each of the gates and connection points between the gates of the main switch element and the drive switch elements.

46. The two-wire load control device of claim 30, further comprising synchronous switching elements connected between a point connected to an AC line of the rectifying unit and a minus output point of the rectifying unit, wherein an operation of closing the synchronous switching elements is performed in synchronization with an operation of closing the main switching unit.

47. The two-wire load control device of claim 31, further comprising synchronous switching elements connected between a point connected to an AC line of the rectifying unit and a minus output point of the rectifying unit, wherein an operation of closing the synchronous switching elements is performed in synchronization with an operation of closing the main switching unit.

48. The two-wire load control device of claim 46, wherein the drive switch elements have one of a thyristor and triac structure, and are driven based on a signal isolated from any of the power supply units of the load control device.

49. The two-wire load control device of claim 47, wherein the drive switch elements have one of a thyristor and triac structure, and are driven based on a signal isolated from any of the power supply units of the load control device.

* * * * *